(12) United States Patent
Han et al.

(10) Patent No.: US 12,244,307 B2
(45) Date of Patent: Mar. 4, 2025

(54) SEMICONDUCTOR CIRCUIT CAPABLE OF SWAPPING SIGNAL PATHS AND SEMICONDUCTOR APPARATUS USING THE SAME

(71) Applicant: SK hynix Inc., Icheon-si Gyeonggi-do (KR)

(72) Inventors: Hyun Wook Han, Icheon-si Gyeonggi-do (KR); Min Chang Kim, Icheon-si Gyeonggi-do (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 18/609,561

(22) Filed: Mar. 19, 2024

(65) Prior Publication Data

US 2024/0223188 A1    Jul. 4, 2024

Related U.S. Application Data

(63) Continuation of application No. 17/685,094, filed on Mar. 2, 2022, now Pat. No. 11,967,950.

(30) Foreign Application Priority Data

Jul. 30, 2021    (KR) ........................ 10-2021-0100695

(51) Int. Cl.
*H03K 19/00*    (2006.01)
*H03K 3/011*    (2006.01)

(52) U.S. Cl.
CPC ......... *H03K 19/0005* (2013.01); *H03K 3/011* (2013.01)

(58) Field of Classification Search
CPC .. H03K 19/0005; H03K 3/011; G11C 7/1006; G11C 7/1048; G11C 7/1051; G11C 2207/2254

See application file for complete search history.

(56) References Cited

U.S. PATENT DOCUMENTS

| | | | |
|---|---|---|---|
| 9,647,659 B1* | 5/2017 | Ahn | H03K 19/0005 |
| 10,969,998 B2* | 4/2021 | Lim | G06F 3/0604 |
| 2016/0164521 A1* | 6/2016 | Chung | H03K 19/017545 |
| | | | 326/93 |
| 2019/0272867 A1* | 9/2019 | Eom | G11C 11/4093 |
| 2022/0101893 A1* | 3/2022 | Park | G11C 7/20 |
| 2022/0139432 A1* | 5/2022 | Shin | H01L 25/105 |
| | | | 365/189.02 |
| 2022/0358987 A1* | 11/2022 | Lee | G11C 29/50008 |

FOREIGN PATENT DOCUMENTS

KR    1020160006867 A    1/2016

* cited by examiner

*Primary Examiner* — Seokjin Kim
(74) *Attorney, Agent, or Firm* — WILLIAM PARK & ASSOCIATES LTD.

(57) ABSTRACT

A semiconductor circuit includes a first pad, a second pad, swapping circuit, and an internal circuit. The internal circuit receives a first external signal and a second external signal, and generates a first internal signal and a second internal signal. Based on master information and swapping information, the swapping circuit couples the internal circuit to one of first and second pads to provide a path through which the first internal signal is output and a path through which the first external signal is received, and couples the internal circuit to the other of the first and second pads to provide a path through which the second internal signal is output and a path through which the second external signal is received.

16 Claims, 21 Drawing Sheets

SEMICONDUCTOR CIRCUIT CAPABLE OF SWAPPING SIGNAL PATHS AND SEMICONDUCTOR APPARATUS USING THE SAME

CROSS-REFERENCES TO RELATED APPLICATION

The present application is a continuation application of U.S. patent application Ser. No. 17/685,094, filed on Mar. 2, 2022, claims priority under 35 U.S.C. § 119(a) to Korean application number 10-2021-0100695, filed on Jul. 30, 2021, in the Korean Intellectual Property Office, which are incorporated herein by reference in its entirety.

BACKGROUND

1. Technical Field

Various embodiments generally relate to an integrated circuit technology, and more particularly, to a semiconductor circuit and a semiconductor apparatus using the same.

2. Related Art

Each of electronic apparatuses may include a large number of electronic components. Among the electronic apparatuses, a computer system may include a large number of semiconductor apparatuses that are configured by semiconductors. The semiconductor apparatuses that configure the computer system may communicate with one another by each including a transmission circuit and a reception circuit. The semiconductor apparatuses may be coupled through signal transmission lines, and may transmit and receive signals through the signal transmission lines. As the operation speeds of semiconductor apparatuses increase and the power consumptions of the semiconductor apparatuses are reduced, signals that are transmitted may be distorted due to the influence of external noise and impedance mismatching between the semiconductor apparatuses communicating with each other. Therefore, each of semiconductor apparatuses may perform a termination operation of matching the resistance and/or impedance of a transmission apparatus or a reception apparatus.

Thus, it is the norm that a semiconductor apparatus includes an on-die termination circuit that performs impedance matching for precise signal transmission. Moreover, the semiconductor apparatus needs to perform calibration of termination resistance depending on a PVT variation such that precise impedance matching may be achieved. In general, a memory apparatus is coupled with an external reference resistor, and calibrates the impedance value of the termination resistance by performing a calibration operation using the external reference resistor. This is generally referred to as a ZQ calibration operation.

SUMMARY

In an embodiment, a semiconductor circuit may include a first pad, a second pad, a swapping circuit, and an internal circuit. The internal circuit may be configured to receive a first external signal and a second external signal, and generate a first internal signal and a second internal signal. The swapping circuit may be configured to, based on master information and swapping information, couple the internal circuit to one of first and second pads to provide a path through which the first internal signal is output and a path through which the first external signal is received, and couple the internal circuit to the other of the first and second pads to provide a path through which the second internal signal is output and a path through which the second external signal is received.

In an embodiment, a semiconductor apparatus may include a first semiconductor chip and a second semiconductor chip. The first semiconductor chip may be configured to, based on first chip master information and swapping information, output a first chip end output signal through a first pad, receive a first chip end input signal that is received through the first pad, and receive a first chip start input signal that is received through a second pad. The second semiconductor chip may be configured to, based on second chip master information and the swapping information, output a second chip start output signal through a first pad, output a second chip end output signal through a second pad, and receive a second chip end input signal that is received through the second pad.

The second semiconductor chip may be disposed such that the first pad of the second semiconductor chip faces the second pad of the first semiconductor chip and the second pad of the second semiconductor chip faces the first pad of the first semiconductor chip. The first pad of the second semiconductor chip may be coupled to the second pad of the first semiconductor chip, and the second pad of the second semiconductor chip may be coupled to the first pad of the first semiconductor chip.

In an embodiment, a semiconductor circuit may include: a first pad, a second pad, a third pad, a swapping circuit, and an internal circuit. The internal circuit may be configured to receive a first external signal and a second external signal, and generate a first internal signal and a second internal signal. The swapping circuit may be configured to, based on master information, swapping information, and a mode signal, couple the internal circuit to the first pad to provide a path through which the first internal signal is output and a path through which the first external signal is received or couple the internal circuit to the first pad to provide a path through which the second internal signal is output and a path through which the second external signal is received, couple the internal circuit to the second pad to provide a path through which the second internal signal is output and a path through which the second external signal is received or couple the internal circuit to the second pad to provide a path through which the first internal signal is output and a path through which the first external signal is received, and couple the internal circuit to the third pad to provide a path through which the first external signal is received.

In an embodiment, a semiconductor apparatus may include a first semiconductor chip and a second semiconductor chip. The first semiconductor chip may be configured to, based on first chip master information and swapping information, output a first chip end output signal through a first pad, provide a first chip end input signal that is received through the first pad, and provide a first chip start input signal that is received through a second pad. The second semiconductor chip may be configured to, based on second chip master information and the swapping information, output a second chip start output signal through a first pad, output a second chip end output signal through a second pad, and provide a second chip end input signal that is received through the second pad.

The second semiconductor chip may be disposed by being rotated 180 degrees with respect to the first semiconductor chip, the first pad of the first semiconductor chip may be coupled to the second pad of the second semiconductor chip, and the second pad of the first semiconductor chip may be coupled to the first pad of the second semiconductor chip.

In an embodiment, a semiconductor apparatus may include a first semiconductor chip, a second semiconductor chip, a third semiconductor chip, and a fourth semiconductor chip. The first semiconductor chip may be configured to receive a first command signal, and based on first chip master information and swapping information, output a first chip end output signal through a first pad, provide a first chip start input signal that is received through a second pad and provide a first chip end input signal that is received through a third pad. The second semiconductor chip may be configured to receive the first command signal, and based on second chip master information and the swapping information, output a second chip end output signal through a second pad and provide a second chip end input signal that is received through a third pad. The third semiconductor chip may be configured to receive a second command signal, and based on third chip master information and the swapping information, output a third chip start output signal through a first pad, output a third chip end output signal through a second pad and provide a third chip end input signal that is received through a third pad. The fourth semiconductor chip may be configured to receive the second command signal, and based on fourth chip master information and the swapping information, output a fourth chip end output signal through a second pad and provide a fourth chip end input signal that is received through a third pad.

The first pad, the second pad, and the third pad of the first semiconductor chip may sequentially face the third pad, the second pad, and the first pad of the third semiconductor chip, and a first pad, the second pad, and the third pad of the second semiconductor chip may sequentially face the third pad, the second pad, and a first pad of the fourth semiconductor chip.

The first pad of the first semiconductor chip may be coupled to the third pad of the third semiconductor chip, the second pad of the first semiconductor chip may be coupled to the first pad of the third semiconductor chip, and the third pad of the first semiconductor chip may be coupled to the second pad of the second semiconductor chip. The third pad of the second semiconductor chip may be coupled to the second pad of the fourth semiconductor chip. The second pad of the third semiconductor chip may be coupled to the third pad of the fourth semiconductor chip.

In an embodiment, a semiconductor circuit may include: a first pad, a second pad, a third pad, a fourth pad, a swapping circuit, and an internal circuit. The internal circuit may be configured to receive a first external signal and a second external signal, and generate a first internal signal and a second internal signal. The swapping circuit may be configured to, based on master information and swapping information, couple the internal circuit to the first pad to provide one of a path through which the first internal signal is output and a path through which the second internal signal is output, couple the internal circuit to the second pad to provide one of a path through which the first external signal is received and a path through which the second external signal is received, couple the internal circuit to the third pad to provide the other of a path through which the first internal signal is output and a path through which the second internal signal is output, couple the internal circuit to the fourth pad to provide the other of a path through which the first external signal is received and a path through which the second external signal is received, and selectively output a received second external signal through the first pad.

In an embodiment, a semiconductor apparatus may include a first semiconductor chip, a second semiconductor chip, a third semiconductor chip, and a fourth semiconductor chip. The first semiconductor chip may be configured to, based on first chip master information and swapping information, output a first chip end output signal to a first pad, provide a first chip end input signal that is received through a second pad, output a first chip start output signal through a third pad, and provide a first chip start input signal that is received through a fourth pad. The second semiconductor chip may be configured to, based on second chip master information and the swapping information, output a second chip start output signal and a second chip start input signal to a first pad, provide the second chip start input signal that is received through a second pad, output a second chip end output signal to a third pad, and provide a second chip end input signal that is received through a fourth pad. The third semiconductor chip may be configured to, based on third chip master information and the swapping information, output a third chip start output signal and a third chip start input signal to a first pad, provide the third chip start input signal that is received through a second pad, output a third chip end output signal to a third pad, and provide a third chip end input signal that is received through a fourth pad. The fourth semiconductor chip may be configured to, based on fourth chip master information and the swapping information, output a fourth chip start output signal and a fourth chip start input signal to a first pad, provide the fourth chip start input signal that is received through a second pad, output a fourth chip end output signal to a third pad, and provide a fourth chip end input signal that is received through a fourth pad.

The first pad, the second pad, the third pad and the fourth pad of the first semiconductor chip may sequentially face the fourth pad, the third pad, the second pad and the first pad of the third semiconductor chip, and the first pad, the second pad, the third pad and the fourth pad of the second semiconductor chip may sequentially face the fourth pad, the third pad, the second pad, and the first pad of the fourth semiconductor chip.

The first pad of the first semiconductor chip may be coupled to the fourth pad of the third semiconductor chip, the second pad of the first semiconductor chip may be coupled to the third pad of the second semiconductor chip, the third pad of the first semiconductor chip may be coupled to the second pad of the third semiconductor chip, and the fourth pad of the first semiconductor chip may be coupled to the first pad of the second semiconductor chip. The second pad of the second semiconductor chip may be coupled to the first pad of the fourth semiconductor chip, and the fourth pad of the second semiconductor chip may be coupled to the third pad of the fourth semiconductor chip. The first pad of the third semiconductor chip may be coupled to the second pad of the fourth semiconductor chip, and the third pad of the third semiconductor chip may be coupled to the fourth pad of the fourth semiconductor chip.

DETAILED DESCRIPTION

Hereinafter, a semiconductor circuit capable of swapping signal paths and a semiconductor apparatus using the same will be described below with reference to the accompanying drawings through various examples of embodiments.

Figure 1A:
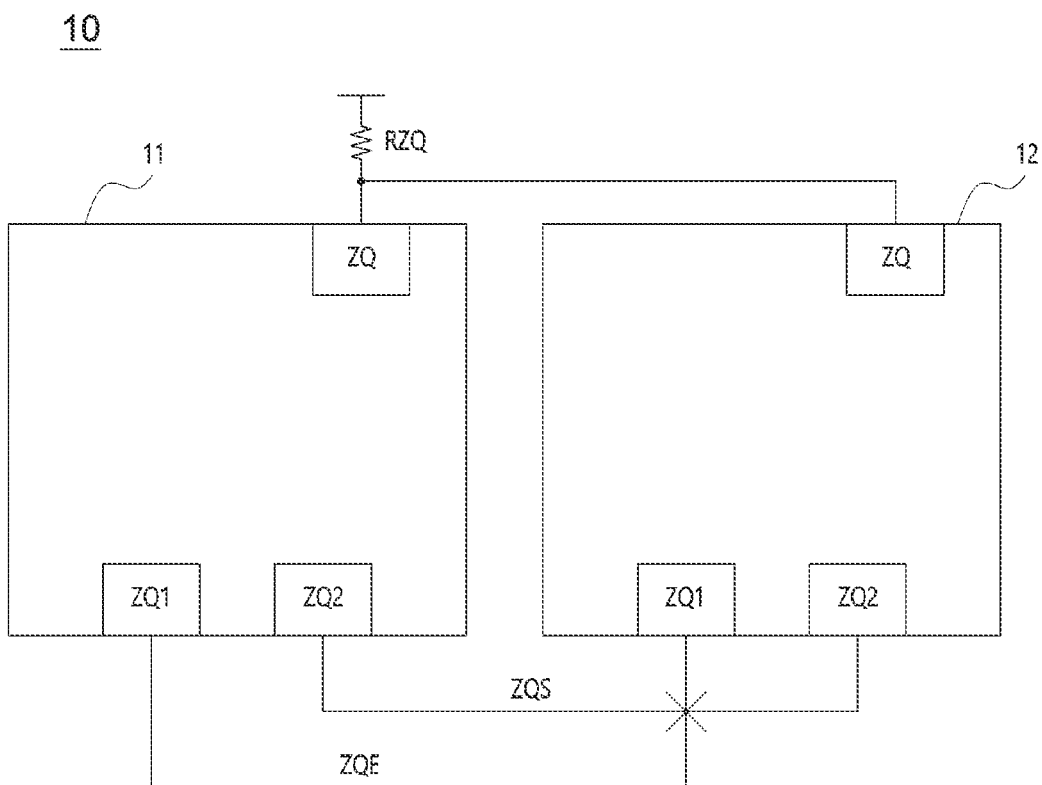
FIGS. 1A and 1B are diagrams illustrating the configurations of semiconductor apparatuses in accordance with embodiments of the present disclosure.

FIG. 1A is a diagram illustrating the configuration of a semiconductor apparatus 10 in accordance with an embodiment of the present disclosure. Referring to FIG. 1A, the semiconductor apparatus may include a first semiconductor chip 11 and a second semiconductor chip 12. The first semiconductor chip 11 may configure a first channel, and the second semiconductor chip 12 may configure a second channel. Each of the first and second channels may mean a unit capable of independently performing a data input/output operation based on an independent command signal and an independent address signal. The first semiconductor chip 11 may receive a first command signal, and the second semiconductor chip 12 may receive a second command signal that is independent of the first command signal. Each of the first and second semiconductor chips 11 and 12 may perform a ZQ calibration operation of calibrating the resistance value of a data input/output circuit to the resistance value of an external reference resistor RZQ for impedance matching with an external apparatus coupled to the semiconductor apparatus 10. Each of the first and second semiconductor chips 11 and 12 may include a resistance pad ZQ. The semiconductor apparatus 10 may include only one external reference resistor RZQ for areal efficiency. The resistance pad ZQ of the first semiconductor chip 11 and the resistance pad ZQ of the second semiconductor chip 12 may be coupled in common to the external reference resistor RZQ. Because the semiconductor apparatus 10 includes one external reference resistor RZQ and the resistance pads ZQ of the first and second semiconductor chips 11 and 12 are coupled in common to the one external reference resistor RZQ, the calibration operations of the first and second semiconductor chips 11 and 12 cannot be simultaneously performed, and the calibration operation of the second semiconductor chip 12 should be performed after the ZQ calibration operation of the first semiconductor chip 11 is performed.

In order for the first and second semiconductor chips 11 and 12 to sequentially perform the calibration operations, at least two control signals may be required. One control signal may be a calibration start signal ZQS, and the other control signal may be a calibration end signal ZQE. In order to transmit and receive two control signals, each of the first and second semiconductor chips 11 and 12 may include first and second pads ZQ1 and ZQ2. Through the first pad ZQ1, the first semiconductor chip 11 may transmit the calibration end signal ZQE to the second semiconductor chip 12 or receive the calibration end signal ZQE transmitted from the second semiconductor chip 12. Through the second pad ZQ2, the first semiconductor chip 11 may transmit the calibration start signal ZQS to the second semiconductor chip 12 or receive the calibration start signal ZQS transmitted from the second semiconductor chip 12. Through the first pad ZQ1, the second semiconductor chip 12 may transmit the calibration end signal ZQE to the first semiconductor chip 11 or receive the calibration end signal ZQE transmitted from the first semiconductor chip 11. Through the second pad ZQ2, the second semiconductor chip 12 may transmit the calibration start signal ZQS to the first semiconductor chip 11 or receive the calibration start signal ZQS transmitted from the first semiconductor chip 11. In order for the first and second semiconductor chips 11 and 12 to transmit and receive the calibration end signal ZQE and the calibration start signal ZQS, the first pad ZQ1 of the first semiconductor chip 11 and the first pad ZQ1 of the second semiconductor chip 12 should be bonded, and the second pad ZQ2 of the first semiconductor chip 11 and the second pad ZQ2 of the second semiconductor chip 12 should be bonded. However, as indicated by "X" in FIG. 1a, a problem may arise in that bonding is impossible because coupling lines between the pads ZQ1 and ZQ2 cross each other.

Figure 1B:
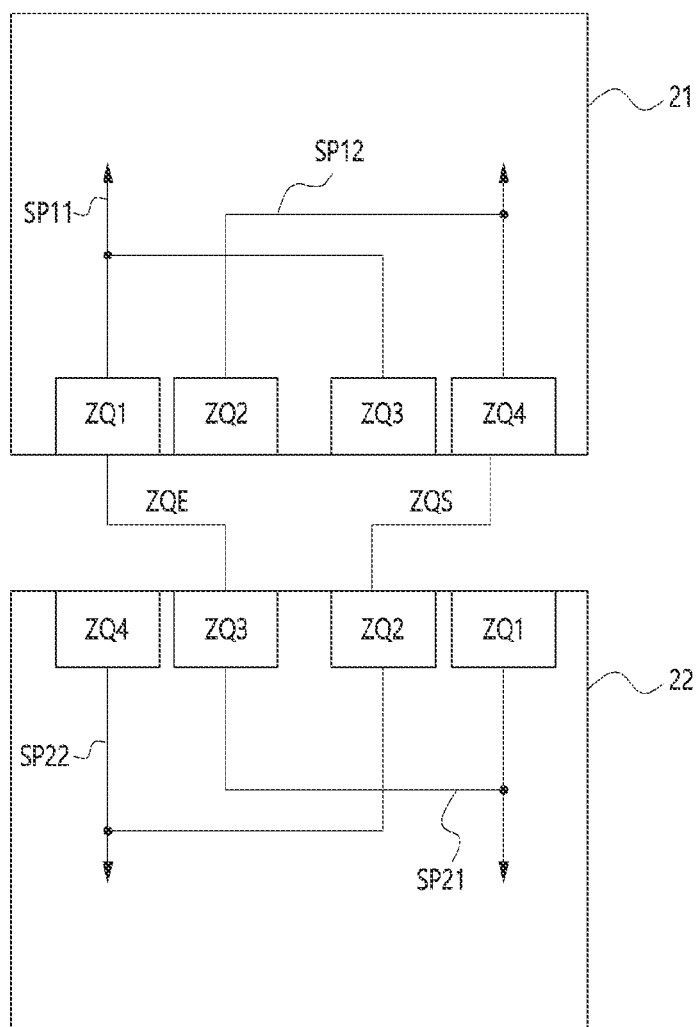

FIG. 1B is a diagram illustrating the configuration of a semiconductor apparatus 20 in accordance with an embodiment of the present disclosure. The semiconductor apparatus 20 may solve the problem of the semiconductor apparatus 10 illustrated in FIG. 1B. The semiconductor apparatus 20 may include a first semiconductor chip 21 and a second semiconductor chip 22, and each of the first and second semiconductor chips 21 and 22 may include four pads. A first signal path SP11 of the first semiconductor chip 21 may be coupled to a first pad ZQ1 and a third pad ZQ3, and a second signal path SP12 of the first semiconductor chip 21 may be coupled to a second pad ZQ2 and a fourth pad ZQ4. A first signal path SP21 of the second semiconductor chip 22 may be coupled to a first pad ZQ1 and a third pad ZQ3, and a second signal path SP22 of the second semiconductor chip 22 may be coupled to a second pad ZQ2 and a fourth pad ZQ4. The second semiconductor chip 22 may be disposed by being rotated 180 degrees with respect to the first semiconductor chip 21. Therefore, the first pad ZQ1, the second pad ZQ2, the third pad ZQ3 and the fourth pad ZQ4 of the first semiconductor chip 21 may sequentially face the fourth pad ZQ4, the third pad ZQ3, the second pad ZQ2, and the first pad ZQ1, respectively, of the second semiconductor chip 22.

The first pad ZQ1 of the first semiconductor chip 21 may be coupled to the third pad ZQ3 of the second semiconductor chip 22, and the first signal paths SP11 and SP21 of the first and second semiconductor chips 21 and 22 may be coupled through the first pad ZQ1 of the first semiconductor chip 21 and the third pad ZQ3 of the second semiconductor chip 22. The fourth pad ZQ4 of the first semiconductor chip 21 may be coupled to the second pad ZQ2 of the second semiconductor chip 22, and the second signal paths SP12 and SP22 of the first and second semiconductor chips 21 and 22 may be coupled through the fourth pad ZQ4 of the first semiconductor chip 21 and the second pad ZQ2 of the second semiconductor chip 22. A calibration end signal ZQE may be transmitted and received between the first and second semiconductor chips 21 and 22 through the first pad ZQ1 of the first semiconductor chip 21 and the third pad ZQ3 of the second semiconductor chip 22, and a calibration start signal ZQS may be transmitted and received between the first and second semiconductor chips 21 and 22 through the fourth pad ZQ4 of the first semiconductor chip 21 and the second pad ZQ2 of the second semiconductor chip 22. In the semiconductor apparatus 20, a wire bonding that couples the first pad ZQ1 of the first semiconductor chip 21 and the third pad ZQ3 of the second semiconductor chip 22 and a wire bonding that couples the fourth pad ZQ4 of the first semiconductor chip 21 and the second pad ZQ2 of the second semiconductor chip 22 might not cross each other. In the semiconductor apparatus 20, the semiconductor chips 21 and 22 may be coupled such that wire bondings do not cross each other, but a problem may arise in that a large number of pads should be used.

Figure 2:
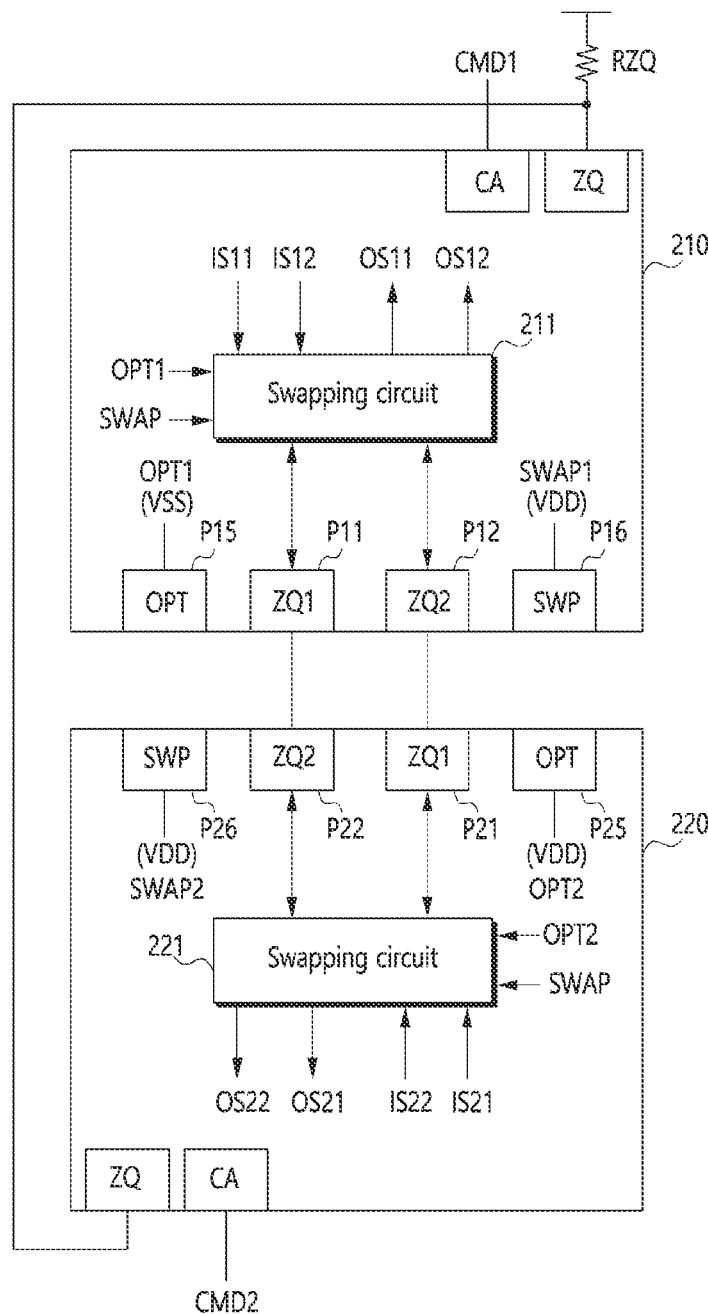
FIG. 2 is a diagram illustrating the configuration of a semiconductor apparatus in accordance with an embodiment of the present disclosure.

In a semiconductor circuit and a semiconductor apparatus in accordance with embodiments of the present disclosure, by swapping signal paths in semiconductor chips, signal coupling between the semiconductor chips may be enabled with a small number of pads. FIG. 2 is a diagram illustrating the configuration of a semiconductor apparatus 200 in accordance with an embodiment of the present disclosure. Referring to FIG. 2, the semiconductor apparatus 200 may include a first semiconductor chip 210 and a second semiconductor chip 220. The first and second semiconductor chips 210 and 220 may have the same structure to be capable of performing the same function. The first and second semiconductor chips 210 and 220 may configure a single semiconductor apparatus and may be packaged as one package. The first and second semiconductor chips 210 and 220 may be mounted on a substrate and may be disposed at predetermined locations depending on the structure of the substrate. The second semiconductor chip 220 may be disposed by being rotated 180 degrees with respect to the first semiconductor chip 210. The first semiconductor chip 210 and the second semiconductor chip 220 may include first pads (ZQ1) P11 and P21 and second pads (ZQ2) P12 and P22, respectively. Because the second semiconductor chip 220 is disposed by being rotated 180 degrees with respect to the first semiconductor chip 210, the first pad P11 and the second pad P12 of the first semiconductor chip 210 may sequentially face the second pad P22 and the first pad P21 of the second semiconductor chip 220. The first pad P11 of the first semiconductor chip 210 may be coupled to the second pad P22 of the second semiconductor chip 220 that faces the first pad P11 of the first semiconductor chip 210. The second pad P12 of the first semiconductor chip 210 may be coupled to the first pad P21 of the second semiconductor chip 220 that faces the second pad P12 of the first semiconductor chip 210.

The first and second semiconductor chips 210 and 220 may operate as independent channels. For example, the first semiconductor chip 210 may receive a first command signal CMD1 through a command pad CA, and the second semiconductor chip 220 may receive a second command signal CMD2 through a command pad CA. The first semiconductor chip 210 may perform a data input/output operation independently of or together with the second semiconductor chip 220 based on the first command signal CMD1. The second semiconductor chip 220 may perform a data input/output operation independently of the first semiconductor chip 210 based on the second command signal CMD2. The first and second semiconductor chips 210 and 220 may support ×16 data bandwidth and may operate with ×8 or ×16 data bandwidth. ×16 data bandwidth may be twice ×8 data bandwidth. In relationship with an external apparatus that is coupled to the semiconductor apparatus 200, the first and second semiconductor chips 210 and 220 may function as two independent chips operating as ×8 or function as two chips operating as ×16. The first semiconductor chip 210 may function as a master chip, and the second semiconductor chip 220 may function as a slave chip. Between the semiconductor apparatus 200 and the external apparatus that is coupled to the semiconductor apparatus 200 and communicates with the semiconductor apparatus 200, it may be prescribed that the first semiconductor chip 210 of the first and second semiconductor chips 210 and 220 is a master chip.

The first semiconductor chip 210 may include a first chip swapping circuit 211, and the second semiconductor chip 220 may include a second chip swapping circuit 221. The first chip swapping circuit 211 may couple the first and second pads P11 and P12 of the first semiconductor chip 210 to signal paths of the first semiconductor chip 210 based on master information OPT1 and swapping information SWAP1 of the first semiconductor chip 210. The master information OPT1 of the first semiconductor chip 210 may also be referred to as first chip master information. The second chip swapping circuit 221 may couple the first and second pads P21 and P22 of the second semiconductor chip 220 to signal paths of the second semiconductor chip 220 based on master information OPT2 and swapping information SWAP2 of the second semiconductor chip 220. The master information OPT2 of the second semiconductor chip 220 may also be referred to as second chip master information. The first semiconductor chip 210 and the second semiconductor chip 220 may transmit and receive signals to and from each other. The first semiconductor chip 210 may transmit a first internal signal IS11 to the second semiconductor chip 220 through the first pad P11 and may receive a first external signal OS11 from the second semiconductor chip 220 through the first pad P11. The first semiconductor chip 210 may transmit a second internal signal IS12 to the second semiconductor chip 220 through the second pad P12 and may receive a second external signal OS12 from the second semiconductor chip 220 through the second pad P12. The second semiconductor chip 220 may transmit a first internal signal IS21 to the first semiconductor chip 210 through the second pad P22 and may receive a first external signal OS21 from the first semiconductor chip 210 through the second pad P22. The second semiconductor chip 220 may transmit a second internal signal IS22 to the first semiconductor chip 210 through the first pad P21 and may receive a second external signal OS22 from the first semiconductor chip 210 through the first pad P21. An internal signal may mean a signal that is generated inside a semiconductor chip, and an external signal may mean a signal that is other than a signal generated inside the semiconductor chip and is received from another semiconductor chip. The first and second internal signals IS11 and IS12 of the first semiconductor chip 210 may be signals that are generated inside the first semiconductor chip 210, and the first and second internal signals IS21 and IS22 of the second semiconductor chip 220 may be signals that are generated inside the second semiconductor chip 220. The first and second external signals OS11 and OS12 of the first semiconductor chip 210 may correspond to the first and second internal signals IS21 and IS22 of the second semiconductor chip 220 that are received from the second semiconductor chip 220. The first and second external signals OS21 and OS22 of the second semiconductor chip 220 may correspond to the first and second internal signals IS11 and IS12 of the first semiconductor chip 210 that are received from the first semiconductor chip 210.

The first chip swapping circuit 211 may provide a path through which the first internal signal IS11 is output and a path through which the first external signal OS11 is received, to one of the first pad P11 and the second pad P12 based on the first chip master information OPT1 and the swapping information SWAP1. The first chip swapping circuit 211 may provide a path through which the second internal signal IS12 is output and a path through which the second external signal OS12 is received, to the other of the first pad P11 and the second pad P12 based on the first chip master information OPT1 and the swapping information SWAP1. The first chip master information OPT1 may be a signal including information on whether the first semiconductor chip 210 functions as a master chip or a slave chip. For example, master information may have a first logic level when a semiconductor chip functions as a master chip and may have a second logic level when the semiconductor chip functions as a slave chip. The first logic level may be a low logic level, and the second logic level may be a high logic level. Swapping information may be a signal including information on whether a semiconductor apparatus operates in a swapping mode. The swapping mode may determine whether the first and second pads P11, P12, P21, and P22 of the first and second semiconductor chips 210 and 220 and the signal paths of the first and second semiconductor chips 210 and 220 are swapped. The swapping information may have a second logic level in the swapping mode and may have a first logic level when not in the swapping mode. The second logic level may be a high logic level. The second chip swapping circuit 221 may provide a path through which the first internal signal IS21 is output and a path through which the first external signal OS21 is received, to one of the first pad P21 and the second pad P22 based on the second chip master information OPT2 and the swapping information SWAP2. The second chip swapping circuit 221 may provide a path through which the second internal signal IS22 is output and a path through which the second external signal OS22 is received, to the other of the first pad P21 and the second pad P22 based on the second chip master information OPT2 and the swapping information SWAP2.

The first semiconductor chip 210 may function as a master chip and may receive master information with the first logic level and swapping information with the second logic level. Based on the first chip master information OPT1 and the swapping information SWAP1, the first chip swapping circuit 211 may provide a path through which the first internal signal IS11 is output and a path through which the first external signal OS11 is received, to the first pad P11, and may provide a path through which the second internal signal IS12 is output and a path through which the second external signal OS12 is received, to the second pad P12. The second semiconductor chip 220 may function as a slave chip and may receive master information with the second logic level and swapping information with the second logic level. Based on the second chip master information OPT2 and the swapping information SWAP2, the second chip swapping circuit 221 may provide a path through which the first internal signal IS21 is output and a path through which the first external signal OS21 is received, to the second pad P22, and may provide a path through which the second internal signal IS22 is output and a path through which the second external signal OS22 is received, to the first pad P21. Accordingly, even though the first pad P11 of the first semiconductor chip 210 is coupled to the second pad P22 of the second semiconductor chip 220 and the first semiconductor chip 210 transmits the first internal signal IS11 to the second semiconductor chip 220 through the first pad P11, the second semiconductor chip 220 may couple the second pad P22 to a path through which the first external signal OS21 is received and thereby may receive the first internal signal IS11 that is output from the first semiconductor chip 210, as the first external signal OS21. The first internal signal IS21 of the second semiconductor chip 220 may be transmitted to the first pad P11 of the first semiconductor chip 210 through the second pad P22, and the first semiconductor chip 210 may receive the first internal signal IS21 of the second semiconductor chip 220 as the first external signal OS11 through the first pad P11. Even though the second pad P12 of the first semiconductor chip 210 is coupled to the first pad P21 of the second semiconductor chip 220 and the first semiconductor chip 210 transmits the second internal signal IS12 to the second semiconductor chip 220 through the second pad P12, the second semiconductor chip 220 may couple the first pad P21 to a path through which the second external signal OS22 is received and thereby may receive the second internal signal IS12 that is output from the first semiconductor chip 210, as the second external signal OS22. The second internal signal IS22 of the second semiconductor chip 220 may be transmitted to the second pad P12 of the first semiconductor chip 210 through the first pad P21, and the first semiconductor chip 210 may receive the second internal signal IS22 of the second semiconductor chip 220 as the second external signal OS12 through the second pad P12.

The first and second semiconductor chips 210 and 220 may include third pads P15 and P25 and fourth pads P16 and P26, respectively. The third pad P15 of the first semiconductor chip 210 may receive the first chip master information OPT1. The third pad P15 may receive a first power supply voltage with a voltage level that is determined as a first logic level. For example, the first power supply voltage may be a ground voltage VSS. The third pad P15 may be wire-bonded to a terminal of the ground voltage VSS. The fourth pad P16 of the first semiconductor chip 210 may receive the swapping information SWAP1. In order for the semiconductor apparatus 200 to operate in the swapping mode, the fourth pad P16 may receive a second power supply voltage with a voltage level that is determined as a second logic level. For example, the second power supply voltage may be an operating power supply voltage VDD of the semiconductor apparatus 200. The fourth pad P16 may be wire-bonded to a terminal to which the operating power supply voltage VDD is supplied. The third pad P25 of the second semiconductor chip 220 may receive the second chip master information OPT2. The third pad P25 may receive the second power supply voltage. The third pad P25 may be wire-bonded to a terminal to which the operating power supply voltage VDD is supplied. The fourth pad P26 of the second semiconductor chip 220 may receive the swapping information SWAP2. In order for the semiconductor apparatus 200 to operate in the swapping mode, the fourth pad P26 may receive the second power supply voltage. The fourth pad P26 may be wire-bonded to a terminal to which the operating power supply voltage VDD is supplied.

Each of the first and second semiconductor chips 210 and 220 may include a resistance pad ZQ. The first semiconductor chip 210 may be coupled to an external reference resistor RZQ through the resistance pad ZQ. The external reference resistor RZQ may provide a reference resistance value for performing a calibration operation. The second semiconductor chip 220 may be coupled to the external reference resistor RZQ through the resistance pad ZQ. The semiconductor apparatus 200 may include only one external reference resistor RZQ, and the first and second semiconductor chips 210 and 220 may be coupled in common to the one external reference resistor RZQ through the resistance pads ZQ. The first internal signals IS11 and IS21 and the first external signals OS11 and OS21 of the first and second semiconductor chips 210 and 220 may be end signals, respectively. The second internal signals IS12 and IS22 and the second external signals OS12 and OS22 of the first and second semiconductor chips 210 and 220 may be start signals, respectively. The end signals and the start signals may be signals that control the first and second semiconductor chips 210 and 220 sharing the one external reference resistor RZQ such that the first and second semiconductor chips 210 and 220 sequentially perform calibration operations. The calibration operations of the first and second semiconductor chips 210 and 220 will be described later.

Figure 3:
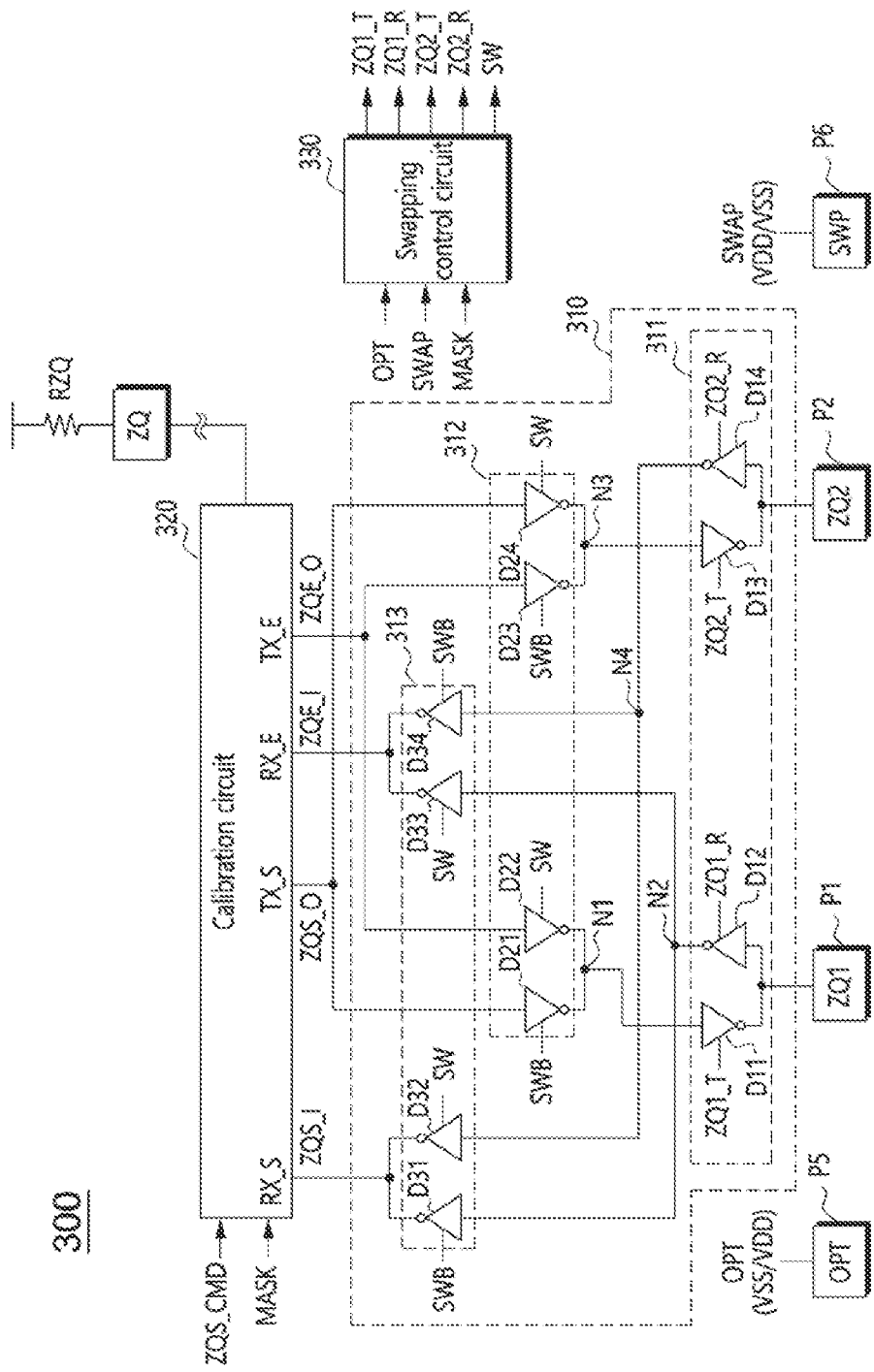
FIG. 3 is a diagram illustrating the configuration of a semiconductor circuit in accordance with an embodiment of the present disclosure.

FIG. 3 is a diagram illustrating the configuration of a semiconductor circuit 300 in accordance with an embodiment of the present disclosure. The semiconductor circuit 300 may be applied as each of the first and second semiconductor chips 210 and 220 illustrated in FIG. 2. Referring to FIG. 3, the semiconductor circuit 300 may include a first pad P1, a second pad P2, a swapping circuit 310, and an internal circuit 320. The first pad P1 and the second pad P2 may be coupled to a first pad (ZQ1) P1 and a second pad (ZQ2) P2, respectively, of another semiconductor circuit. The swapping circuit 310 may couple the internal circuit 320 to one of the first and second pads P1 and P2 to provide a path through which a first internal signal is output and a path through which a first external signal is received, based on master information OPT and swapping information SWAP. The swapping circuit 310 may couple the internal circuit 320 to the other one of the first and second pads P1 and P2 to provide a path through which a second internal signal is output and a path through which a second external signal is received, based on the master information OPT and the swapping information SWAP.

The internal circuit 320 may be a calibration circuit for performing a calibration operation of the semiconductor circuit 300. The calibration circuit 320 may receive the first external signal and the second external signal and may generate the first internal signal and the second internal signal. The calibration circuit 320 may generate an end output signal ZQE_O and a start output signal ZQS_O and may receive an end input signal ZQE_I and a start input signal ZQS_I. The end output signal ZQE_O may be the first internal signal, and the start output signal ZQS_O may be the second internal signal. The end input signal ZQE_I may be the first external signal, and the start input signal ZQS_I may be the second external signal. The calibration circuit 320 may output the end output signal ZQE_O through a first output terminal TX_E and may output the start output signal ZQS_O through a second output terminal TX_S. The calibration circuit 320 may receive the end input signal ZQE_I through a first input terminal RX_E and may receive the start input signal ZQS_I through a second input terminal RX_S.

Based on the master information OPT and the swapping information SWAP, the swapping circuit 310 may provide one of a path through which the end output signal ZQE_O is output and a path through which the start output signal ZQS_O is output to one of the first and second pads P1 and P2, and may provide the other of the path through which the end output signal ZQE_O is output and the path through which the start output signal ZQS_O is output, to the other of the first and second pads P1 and P2. Based on the master information OPT and the swapping information SWAP, the swapping circuit 310 may provide one of a path through which the end input signal ZQE_I is received and a path through which the start input signal ZQS_I is received, to one of the first and second pads P1 and P2, and may provide the other of the path through which the end input signal ZQE_I is received and the path through which the start input signal ZQS_I is received, to the other of the first and second pads P1 and P2. As will be described later, a semiconductor circuit that functions as a master chip might not need to transmit the start output signal ZQS_O to another semiconductor circuit that functions as a slave chip, and a semiconductor circuit that functions as a slave chip might not need to receive the start input signal ZQS_I from another semiconductor circuit that functions as a master chip. Accordingly, based on the master information OPT and the swapping information SWAP, the swapping circuit 310 may couple the internal circuit 320 to one of the first and second pads P1 and P2 to provide a path through which the start output signal ZQS_O is output, and may couple the internal circuit 320 to the other one of the first and second pads P1 and P2 to provide a path through which the start input signal ZQS_I is received.

When the semiconductor circuit 300 functions as a master chip, the calibration circuit 320 may perform a calibration operation based on the start input signal ZQS_I. When the calibration operation is completed, the calibration circuit 320 may generate the end output signal ZQE_O. When the semiconductor circuit 300 functions as a master chip, if the end input signal ZQE_I is received, the calibration circuit 320 may determine that all calibration operations of the semiconductor circuit 300 and another semiconductor circuit have been completed. When the semiconductor circuit 300 functions as a slave chip, the calibration circuit 320 may perform the calibration operation if the end input signal ZQE_I is received. The calibration circuit 320 may further receive a calibration command signal ZQS_CMD and a mask signal MASK. The calibration circuit 320 may generate a calibration enable signal based on the calibration command signal ZQS_CMD, the mask signal MASK and the start input signal ZQS_I. The calibration circuit 320 may perform the calibration operation based on the calibration enable signal. The calibration command signal ZQS_CMD may be a signal that is generated from a command signal (e.g., each of the first and second command signals CMD1 and CMD2 of FIG. 2), received by the semiconductor circuit 300, and may be a signal that is enabled to a second logic level when the command signal is a command signal that instructs the calibration operation of the semiconductor circuit 300. The mask signal MASK may include information on whether the semiconductor circuit 300 functions as a master chip or a slave chip and may mask a period during which the calibration operation of the semiconductor circuit 300 is performed. For example, when the semiconductor circuit 300 functions as a master chip, the mask signal MASK may be maintained at a first logic level before the calibration circuit 320 performs the calibration operation and may transition to a second logic level and be maintained at the second logic level after the calibration operation of the calibration circuit 320 is completed. When all calibration operations of the semiconductor circuit 300 and another semiconductor circuit are completed, the mask signal MASK may transition again to the first logic level and be maintained at the first logic level. When the semiconductor circuit 300 functions as a slave chip, the mask signal MASK may be maintained at the second logic level before the calibration circuit 320 performs the calibration operation and may transition to the first logic level and be maintained at the first logic level when the calibration operation of the calibration circuit 320 is started. After the calibration operation of the calibration circuit 320 is completed, the mask signal MASK may transition again to the second logic level and be maintained at the second logic level. When the semiconductor circuit 300 functions as a master chip, the initial level of the mask signal MASK may be the first logic level. After the calibration circuit 320 generates the end output signal ZQE_O, the mask signal MASK may transition to the second logic level, and when the calibration circuit 320 receives the end input signal ZQE_I, the mask signal MASK may transition again to the first logic level. When the semiconductor circuit 300 functions as a slave chip, the initial level of the mask signal MASK may be the second logic level. When the calibration circuit 320 receives the end input signal ZQE_I, the mask signal MASK may transition to the first logic level, and when the calibration circuit 320 generates the end output signal ZQE_O, the mask signal MASK may transition to the second logic level. The mask signal MASK may be generated from a logic circuit capable of defining a period of the mask signal MASK based on the master information OPT, the end output signal ZQE_O and the end input signal ZQE_I. When the mask signal MASK is the first logic level, the calibration circuit 320 may generate the calibration enable signal based on at least one of the calibration command signal ZQS_CMD and the start input signal ZQS_I and may perform the calibration operation based on the calibration enable signal. When the mask signal MASK is the second logic level, the calibration circuit 320 may generate the start output signal ZQS_O based on the calibration command signal ZQS_CMD and may generate the calibration enable signal based on the end input signal ZQE_I.

The semiconductor circuit 300 may further include a third pad P5 and a fourth pad P6. The third pad P5 may receive the master information OPT. When the semiconductor circuit 300 functions as a master chip, the third pad P5 may receive a first power supply voltage that may be determined as a first logic level. The first power supply voltage may be a ground voltage VSS. When the semiconductor circuit 300 functions as a slave chip, the third pad P5 may receive a second power supply voltage with a voltage level that may be determined as a second logic level. The second power supply voltage may be an operating power supply voltage VDD of the semiconductor circuit 300. The fourth pad P6 may receive the swapping information SWAP. The fourth pad P6 may receive a signal with a different voltage level depending on whether the semiconductor circuit 300 operates in a swapping mode. When the semiconductor circuit 300 operates in the swapping mode, the fourth pad P6 may receive the second power supply voltage (i.e., the operating power supply voltage VDD). When the semiconductor circuit 300 does not operate in the swapping mode, the fourth pad P6 may receive the first power supply voltage (i.e., the ground voltage VSS).

The swapping circuit 310 may include a pad selection circuit 311, a transmission selection circuit 312 and a reception selection circuit 313. The pad selection circuit 311 may couple a first node N1 to the first pad P1 based on a first transmission control signal ZQ1_T and may output a signal, transmitted through the first node N1, through the first pad P1. The pad selection circuit 311 may couple a second node N2 to the first pad P1 based on a first reception control signal ZQ1_R and may output a signal, received through the first pad P1, to the second node N2. The pad selection circuit 311 may couple a third node N3 to the second pad P2 based on a second transmission control signal ZQ2_T and may output a signal, transmitted through the third node N3, through the second pad P2. The pad selection circuit 311 may couple a fourth node N4 to the second pad P2 based on a second reception control signal ZQ2_R and may output a signal, received through the second pad P2, to the fourth node N4.

The pad selection circuit 311 may include a first driver D11, a second driver D12, a third driver D13 and a fourth driver D14. The first driver D11 may be coupled between the first node N1 and the first pad P1, may receive the first transmission control signal ZQ1_T, and when the first transmission control signal ZQ1_T is enabled, may output a signal, transmitted through the first node N1, to the first pad P1. The second driver D12 may be coupled between the first pad P1 and the second node N2, may receive the first reception control signal ZQ1_R, and when the first reception control signal ZQ1_R is enabled, may output a signal, received through the first pad P1, to the second node N2. The third driver D13 may be coupled between the third node N3 and the second pad P2, may receive the second transmission control signal ZQ2_T, and when the second transmission control signal ZQ2_T is enabled, may output a signal, transmitted through the third node N3, to the second pad P2. The fourth driver D14 may be coupled between the second pad P2 and the fourth node N4, may receive the second reception control signal ZQ2_R, and when the second reception control signal ZQ2_R is enabled, may output a signal, received through the second pad P2, to the fourth node N4.

The transmission selection circuit 312 may output one of the end output signal ZQE_O and the start output signal ZQS_O to the first node N1 and output the other of the end output signal ZQE_O and the start output signal ZQS_O to the third node N3, based on a swapping control signal SW. When the swapping control signal SW is enabled, the transmission selection circuit 312 may output the end output signal ZQE_O to the first node N1 and output the start output signal ZQS_O to the third node N3. When the swapping control signal SW is disabled, the transmission selection circuit 312 may output the end output signal ZQE_O to the third node N3 and output the start output signal ZQS_O to the first node N1. The transmission selection circuit 312 may include a first driver D21, a second driver D22, a third driver D23, and a fourth driver D24. The first driver D21 may receive a complementary signal SWB of the swapping control signal SW, and when the complementary signal SWB of the swapping control signal SW is enabled, may output the start output signal ZQS_O to the first node N1. The second driver D22 may receive the swapping control signal SW, and when the swapping control signal SW is enabled, may output the end output signal ZQE_O to the first node N1. The third driver D23 may receive the complementary signal SWB of the swapping control signal SW, and when the complementary signal SWB of the swapping control signal SW is enabled, may output the end output signal ZQE_O to the third node N3. The fourth driver D24 may receive the swapping control signal SW, and when the swapping control signal SW is enabled, may output the start output signal ZQS_O to the third node N3.

The reception selection circuit 313 may output a signal, transmitted from one of the second and fourth nodes N2 and N4, as the start input signal ZQS_I and output a signal, transmitted from the other of the second and fourth nodes N2 and N4, as the end input signal ZQE_I, based on the swapping control signal SW. When the swapping control signal SW is enabled, the reception selection circuit 313 may output a signal, transmitted from the fourth node N4, as the start input signal ZQS_I, and may output a signal, transmitted from the second node N2, as the end input signal ZQE_I. When the swapping control signal SW is disabled, the reception selection circuit 313 may output a signal, transmitted from the second node N2, as the start input signal ZQS_I, and may output a signal, transmitted from the fourth node N4, as the end input signal ZQE_I. The reception selection circuit 313 may include a first driver D31, a second driver D32, a third driver D33 and a fourth driver D34. The first driver D31 may receive the complementary signal SWB of the swapping control signal SW, and when the complementary signal SWB of the swapping control signal SW is enabled, may output a signal, transmitted from the second node N2, as the start input signal ZQS_I. The second driver D32 may receive the swapping control signal SW, and when the swapping control signal SW is enabled, may output a signal, transmitted from the fourth node N4, as the start input signal ZQS_I. The third driver D33 may receive the swapping control signal SW, and when the swapping control signal SW is enabled, may output a signal, transmitted from the second node N2, as the end input signal ZQE_I. The fourth driver D34 may receive the complementary signal SWB of the swapping control signal SW, and when the complementary signal SWB of the swapping control signal SW is enabled, may output a signal, transmitted from the fourth node N4, as the end input signal ZQE_I.

The semiconductor circuit 300 may further include a swapping control circuit 330. The swapping control circuit 330 may generate the first transmission control signal ZQ1_T, the first reception control signal ZQ1_R, the second transmission control signal ZQ2_T, the second reception control signal ZQ2_R, and the swapping control signal SW, based on the master information OPT and the swapping information SWAP. The swapping control circuit 330 may further receive the mask signal MASK. The mask signal MASK may be used as a signal that sets logic levels of the first transmission control signal ZQ1_T, the first reception control signal ZQ1_R, the second transmission control signal ZQ2_T and the second reception control signal ZQ2_R based on the swapping control signal SW.

The semiconductor circuit 300 may further include a resistance pad ZQ. The resistance pad ZQ may be coupled to an external reference resistor RZQ. The calibration circuit 320 may be coupled to the external reference resistor RZQ through the resistance pad ZQ. The calibration circuit 320 may be coupled to the external reference resistor RZQ through the resistance pad ZQ when the calibration enable signal is enabled and may perform the calibration operation according to a reference resistance value provided from the external reference resistor RZQ.

Figure 4:
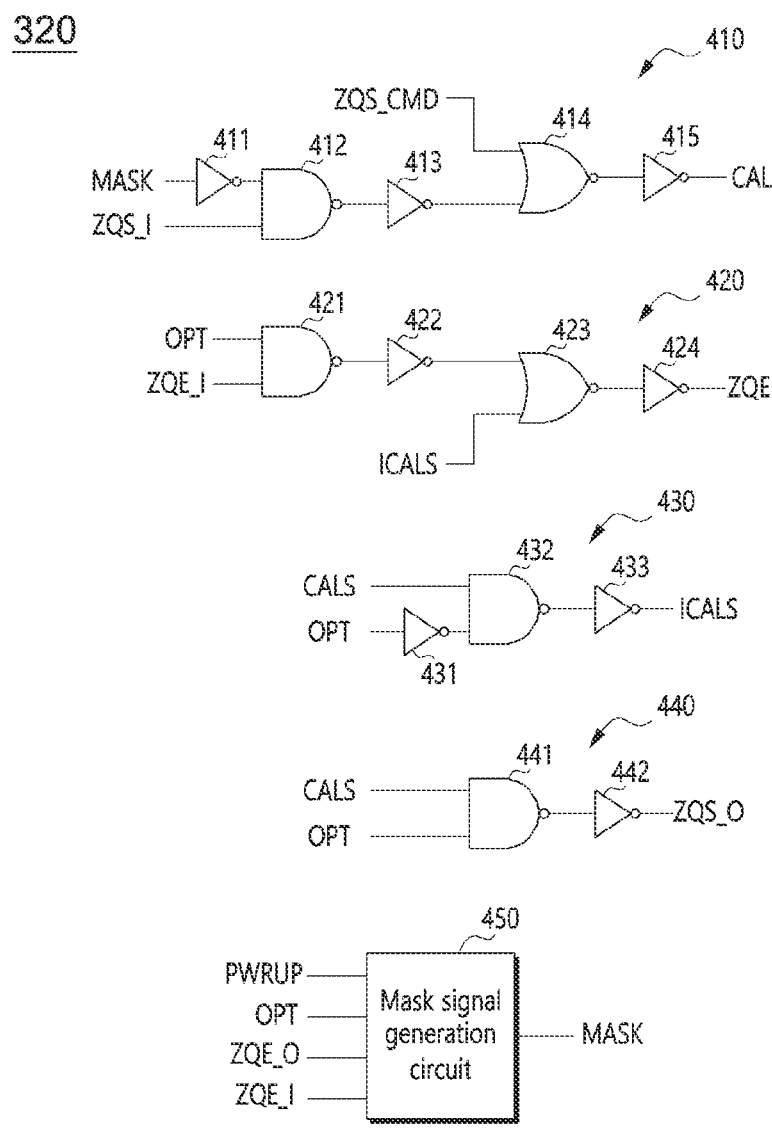
FIG. 4 is a diagram illustrating the configuration of at least a part of a calibration circuit illustrated in FIG. 3.

FIG. 4 is a diagram illustrating the configuration of at least a part of the calibration circuit 320 illustrated in FIG. 3. Referring to FIG. 4, the calibration circuit 320 may include a calibration start control circuit 410, a calibration enable control circuit 420, an internal calibration start signal generation circuit 430, and a start output signal generation circuit 440. The calibration start control circuit 410 may generate a calibration start signal CALS by receiving the calibration command signal ZQS_CMD, the mask signal MASK and the start input signal ZQS_I. When the mask signal MASK is the first logic level, if one of the start input signal ZQS_I and the calibration command signal ZQS_CMD is enabled, the calibration start control circuit 410 may enable the calibration start signal CALS. When the mask signal MASK is the second logic level, the calibration start control circuit 410 may enable the calibration start signal CALS only by the calibration command signal ZQS_CMD. The calibration start control circuit 410 may include a first inverter 411, a NAND gate 412, a second inverter 413, a NOR gate 414 and a third inverter 415. The first inverter 411 may receive the mask signal MASK and may invert the mask signal MASK. The NAND gate 412 may receive the output of the first inverter 411 and the start input signal ZQS_I and may perform a NAND logic operation on the output of the first inverter 411 and the start input signal ZQS_I. The second inverter 413 may receive the output of the NAND gate 412 and may invert the output of the NAND gate 412. The NOR gate 414 may receive the calibration command signal ZQS_CMD and the output of the second inverter 413 and may perform a NOR logic operation on the calibration command signal ZQS_CMD and the output of the second inverter 413. The third inverter 415 may receive the output of the NOR gate 414 and may generate the calibration start signal CALS by inverting the output of the NOR gate 414.

The calibration enable control circuit 420 may generate a calibration enable signal ZQEN by receiving the master information OPT, the end input signal ZQE_I and an internal calibration start signal ICALS. When the master information OPT is a second logic level and the enabled end input signal ZQE_I is received or when the internal calibration start signal ICALS is enabled, the calibration enable control circuit 420 may enable the calibration enable signal ZQEN. The calibration enable control circuit 420 may include a NAND gate 421, a first inverter 422, a NOR gate 423 and a second inverter 424. The NAND gate 421 may receive the master information OPT and the end input signal ZQE_I and may perform a NAND logic operation on the master information OPT and the end input signal ZQE_I. The first inverter 422 may receive the output of the NAND gate 421 and may invert the output of the NAND gate 421. The NOR gate 423 may receive the output of the first inverter 422 and the internal calibration start signal ICALS and may perform a NOR logic operation on the output of the first inverter 422 and the internal calibration start signal ICALS. The second inverter 424 may receive the output of the NOR gate 423 and may generate the calibration enable signal ZQEN by inverting the output of the NOR gate 423.

The internal calibration start signal generation circuit 430 may generate the internal calibration start signal ICALS by receiving the calibration start signal CALS and the master information OPT. When the calibration start signal CALS is enabled and the master information OPT is a first logic level, the internal calibration start signal generation circuit 430 may enable the internal calibration start signal ICALS. The internal calibration start signal generation circuit 430 may include a first inverter 431, a NAND gate 432, and a second inverter 433. The first inverter 431 may receive the master information OPT and may invert the master information OPT. The NAND gate 432 may receive the calibration start signal CALS and the output of the first inverter 431 and may perform a NAND logic operation on the calibration start signal CALS and the output of the first inverter 431. The second inverter 433 may receive the output of the NAND gate 432 and may generate the internal calibration start signal ICALS by inverting the output of the NAND gate 432.

The start output signal generation circuit 440 may generate the start output signal ZQS_O by receiving the calibration start signal CALS and the master information OPT. When the master information OPT is the second logic level and the enabled calibration start signal CALS is received, the start output signal generation circuit 440 may enable the start output signal ZQS_O. The start output signal generation circuit 440 may include a NAND gate 441 and an inverter 442. The NAND gate 441 may receive the calibration start signal CALS and the master information OPT and may perform a NAND logic operation on the calibration start signal CALS and the master information OPT. The inverter 442 may receive the output of the NAND gate 441 and may generate the start output signal ZQS_O by inverting the output of the NAND gate 441.

The calibration circuit 320 may further include a mask signal generation circuit 450. The mask signal generation circuit 450 may generate the mask signal MASK based on a power-up signal PWRUP, the master information OPT, the end output signal ZQE_O and the end input signal ZQE_I. The power-up signal PWRUP may be a signal that can be enabled when the semiconductor circuit 300 is activated by receiving the operating power supply voltage VDD. The power-up signal PWRUP may maintain a low logic level and may be enabled to a high logic level when the operating power supply voltage VDD rises above a target voltage level. The target voltage level may have a voltage level corresponding to a state in which the voltage level of the operating power supply voltage VDD has sufficiently risen. The target voltage level may have a voltage level between the minimum voltage level of the operating power supply voltage VDD and the maximum voltage level of the operating power supply voltage VDD. The mask signal generation circuit 450 may set an initial logic level of the mask signal MASK based on the power-up signal PWRUP and the master information OPT. The mask signal generation circuit 450 may transition the mask signal MASK from the first logic level to the second logic level based on the end output signal ZQE_O. The mask signal generation circuit 450 may transition the mask signal MASK from the second logic level to the first logic level based on the end input signal ZQE_I.

Figure 5:
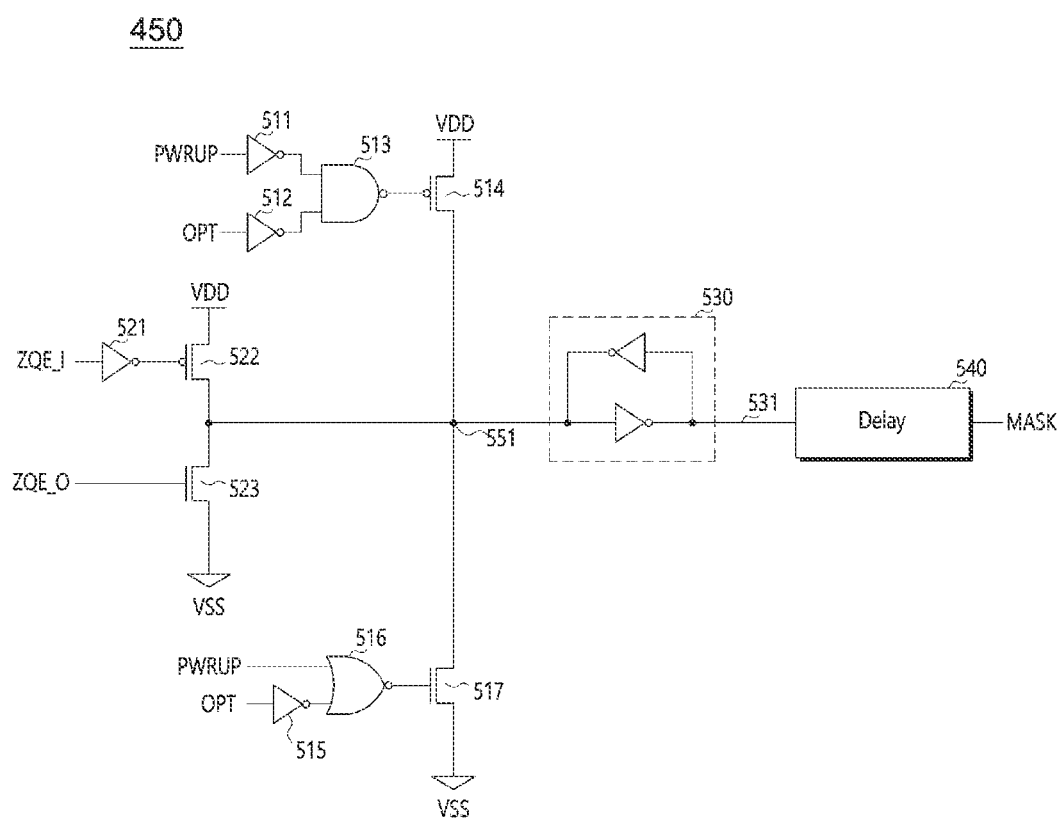
FIG. 5 is a diagram illustrating the configuration of a mask signal generation circuit illustrated in FIG. 4.

FIG. 5 is a diagram illustrating the configuration of the mask signal generation circuit 450 illustrated in FIG. 4. The mask signal generation circuit 450 may include a first inverter 511, a second inverter 512, a NAND gate 513, a first transistor 514, a third inverter 515, an OR gate 516, a second transistor 517, a fourth inverter 521, a third transistor 522, a fourth transistor 523, a latch 530, and a delay 540. The first inverter 511 may receive the power-up signal PWRUP and may invert the power-up signal PWRUP. The second inverter 512 may receive the master information OPT and may invert the master information OPT. The NAND gate 513 may receive the outputs of the first and second inverters 511 and 512 and may perform a NAND logic operation on the outputs of the first and second inverters 511 and 512. The first transistor 514 may be a P-channel MOS transistor. The gate of the first transistor 514 may receive the output of the NAND gate 513, the source of the first transistor 514 may be coupled to a terminal to which the operating power supply voltage VDD is supplied, and the drain of the first transistor 514 may be coupled to a node 551. The third inverter 515 may receive the master information OPT and may invert the master information OPT. The NOR gate 516 may receive the power-up signal PWRUP and the output of the third inverter 515 and may perform a NOR logic operation on the power-up signal PWRUP and the output of the third inverter 515. The second transistor 517 may be an N-channel MOS transistor. The gate of the second transistor 517 may receive the output of the NOR gate 516, the drain of the second transistor 517 may be coupled to the node 551, and the source of the second transistor 517 may be coupled to terminal of the ground voltage VSS.

The fourth inverter 521 may receive the end input signal ZQE_I and may invert the end input signal ZQE_I. The third transistor 522 may be a P-channel MOS transistor. The gate of the third transistor 522 may receive the output of the fourth inverter 521, the source of the third transistor 522 may be coupled to a terminal to which the operating power supply voltage VDD is supplied, and the drain of the third transistor 522 may be coupled to the node 551. The fourth transistor 523 may be an N-channel MOS transistor. The gate of the fourth transistor 523 may receive the end output signal ZQE_O, the drain of the fourth transistor 523 may be coupled to the node 551, and the source of the fourth transistor 523 may be coupled to a terminal of the ground voltage VSS. The latch 530 may be coupled between the node 551 and the delay 540. The latch 530 may maintain the logic level of a signal 531 that is output through the node 551 and the latch 530. The delay 540 may generate the mask signal MASK by delaying the signal 531 output from the latch 530. The delay time of the delay 540 may be longer than a time from a time point when the end output signal ZQE_O is generated from the calibration circuit 320 to a time point when the end output signal ZQE_O is output through a pad.

When the semiconductor circuit 300 functions as a master chip, the master information OPT may have a low logic level. When the power-up signal PWRUP is in a state in which it is disabled to a low logic level, the output of the NAND gate 513 may become a low logic level, and the node 551 may be driven to the operating power supply voltage VDD by the first transistor 514. The latch 530 may output the signal 531 that has an opposite logic level compared to the logic level of the node 551 and may maintain the logic level of the signal 531. Accordingly, the initial logic level of the mask signal MASK may be set to a low logic level. Thereafter, when the end output signal ZQE_O is enabled, the fourth transistor 523 may drive the node 551 to the ground voltage VSS, and the signal 531 output from the latch 530 may have a high logic level. The delay 540 may transition the mask signal MASK from a low logic level to a high logic level by delaying the output 531 of the latch 530 and may maintain the logic level of the mask signal MASK. When the end input signal ZQE_I is enabled, the third transistor 522 may drive the node 551 to the operating power supply voltage VDD, and the signal 531 output from the latch 530 may have a low logic level. The delay 540 may transition the mask signal MASK from a high logic level to a low logic level by delaying the signal 531 output from the latch 530 and may maintain the logic level of the mask signal MASK.

When the semiconductor circuit 300 functions as a slave chip, the master information OPT may have a high logic level. When the power-up signal PWRUP is in a state in which it is disabled to a low logic level, the output of the NOR gate 516 may become a high logic level, and the node 551 may be driven to the ground voltage VSS by the second transistor 517. The latch 530 may output the signal 531 that has an opposite logic level compared to the logic level of the node 551 and may maintain the logic level of the signal 531. Accordingly, the initial logic level of the mask signal MASK may be set to a high logic level. Thereafter, when the end input signal ZQE_I is enabled, the third transistor 522 may drive the node 551 to the operating power supply voltage VDD, and the signal 531 output from the latch 530 may have a low logic level. The delay 540 may transition the mask signal MASK from a high logic level to a low logic level by delaying the signal 531 output from the latch 530 and may maintain the logic level of the mask signal MASK. When the end output signal ZQE_O is enabled, the fourth transistor 523 may drive the node 551 to the ground voltage VSS, and the signal 531 output from the latch 530 may have a high logic level. The delay 540 may transition the mask signal MASK from a low logic level to a high logic level by delaying the signal 531 output from the latch 530 and may maintain the logic level of the mask signal MASK.

Figure 6:
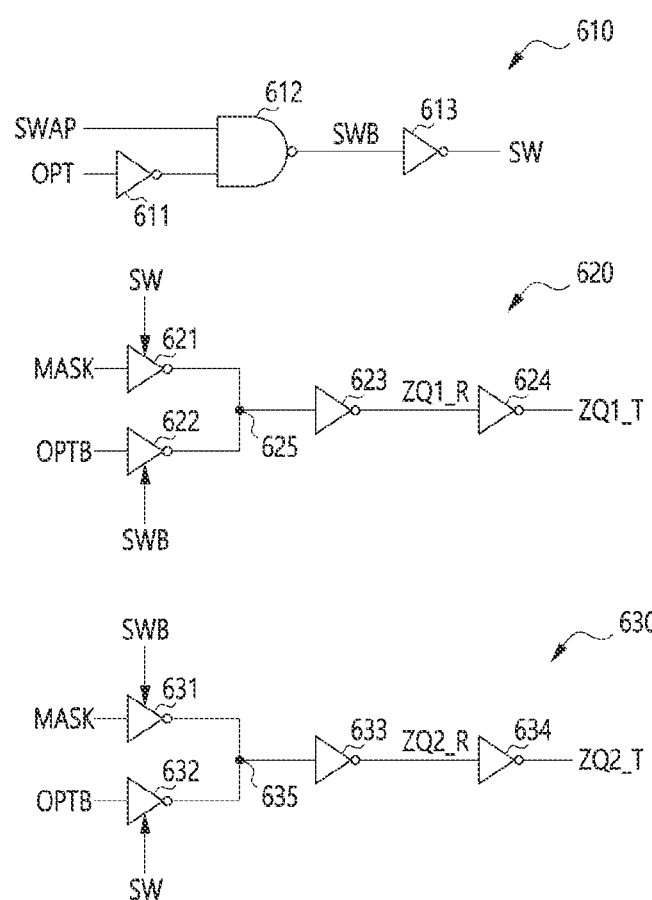
FIG. 6 is a diagram illustrating the configuration of a swapping control circuit illustrated in FIG. 3.

FIG. 6 is a diagram illustrating the configuration of the swapping control circuit 330 illustrated in FIG. 3. Referring to FIG. 6, the swapping control circuit 330 may include a swapping control signal generation circuit 610, a first transmission and reception control signal generation circuit 620 and a second transmission and reception control signal generation circuit 630. The swapping control signal generation circuit 610 may generate the swapping control signal SW by receiving the swapping information SWAP and the master information OPT. When the master information OPT is the first logic level and the swapping information SWAP is a second logic level, the swapping control signal generation circuit 610 may enable the swapping control signal SW and disable the complementary signal SWB of the swapping control signal SW. When the master information OPT is the second logic level, the swapping control signal generation circuit 610 may disable the swapping control signal SW and enable the complementary signal SWB of the swapping control signal SW. The swapping control signal generation circuit 610 may include a first inverter 611, a NAND gate 612, and a second inverter 613. The first inverter 611 may receive the master information OPT and may invert the master information OPT. The NAND gate 612 may receive the swapping information SWAP and the output of the first inverter 611 and may generate the complementary signal SWB of the swapping control signal SW by performing a NAND logic operation on the swapping information SWAP and the output of the first inverter 611. The second inverter 613 may receive the complementary signal SWB of the swapping control signal SW and may generate the swapping control signal SW by inverting the complementary signal SWB of the swapping control signal SW.

The first transmission and reception control signal generation circuit 620 may generate the first transmission control signal ZQ1_T and the first reception control signal ZQ1_R based on the mask signal MASK, the master information OPT and the swapping control signal SW. When the swapping control signal SW is enabled, the first transmission and reception control signal generation circuit 620 may output the mask signal MASK as the first reception control signal ZQ1_R and may generate the first transmission control signal ZQ1_T that has an opposite logic level compared to that of the first reception control signal ZQ1_R. When the swapping control signal SW is disabled (when the complementary signal SWB of the swapping control signal SW is enabled), the first transmission and reception control signal generation circuit 620 may output inverted master information OPTB as the first reception control signal ZQ1_R and may generate the first transmission control signal ZQ1_T that has an opposite logic level compared to that of the first reception control signal ZQ1_R. The first transmission and reception control signal generation circuit 620 may include a first inverter 621, a second inverter 622, a third inverter 623, and a fourth inverter 624. When the swapping control signal SW is enabled, the first inverter 621 may invert the mask signal MASK and may output an inverted signal to a first node 625. When the complementary signal SWB of the swapping control signal SW is enabled, the second inverter 622 may invert the inverted master information OPTB and may output an inverted signal to the first node 625. The third inverter 623 may receive a signal transmitted through the first node 625 and may generate the first reception control signal ZQ1_R by inverting the signal transmitted through the first node 625. The fourth inverter 624 may receive the first reception control signal ZQ1_R and may generate the first transmission control signal ZQ1_T by inverting the first reception control signal ZQ1_R.

The second transmission and reception control signal generation circuit 630 may generate the second transmission control signal ZQ2_T and the second reception control signal ZQ2_R based on the mask signal MASK, the master information OPT and the swapping control signal SW. When the swapping control signal SW is disabled (when the complementary signal SWB of the swapping control signal SW is enabled), the second transmission and reception control signal generation circuit 630 may output the mask signal MASK as the second reception control signal ZQ2_R and may generate the second transmission control signal ZQ2_T that has an opposite logic level compared to that of the second reception control signal ZQ2_R. When the swapping control signal SW is enabled, the second transmission and reception control signal generation circuit 630 may output the inverted master information OPTB as the second reception control signal ZQ2_R and may generate the second transmission control signal ZQ2_T that has an opposite logic level compared to that of the second reception control signal ZQ2_R. The second transmission and reception control signal generation circuit 630 may include a first inverter 631, a second inverter 632, a third inverter 633 and a fourth inverter 634. When the complementary signal SWB of the swapping control signal SW is enabled, the first inverter 631 may invert the mask signal MASK and may output an inverted signal to a second node 635. When the swapping control signal SW is enabled, the second inverter 632 may invert the inverted master information OPTB and may output an inverted signal to the second node 635. The third inverter 633 may receive a signal transmitted through the second node 635 and may generate the second reception control signal ZQ2_R by inverting the signal transmitted through the second node 635. The fourth inverter 634 may receive the second reception control signal ZQ2_R and may generate the second transmission control signal ZQ2_T by inverting the second reception control signal ZQ2_R.

TABLE 1

| OPT | SWAP | SW | ZQ1_T | ZQ1_R | ZQ2_T | ZQ2_R |
|-----|------|-----|-------|-------|-------|-------|
| L   | L    | L   | L     | H     | MASKB | MASK  |
| H   | L    | L   | H     | L     | MASKB | MASK  |
| L   | H    | H   | MASKB | MASK  | L     | H     |
| H   | H    | L   | H     | L     | MASKB | MASK  |

Referring to Table 1 together, when the master information OPT is a low logic level and the swapping information SWAP is a low logic level (when the semiconductor circuit 300 functions as a master chip and does not operate in the swapping mode), the swapping control circuit 330 may disable the swapping control signal SW to a low logic level. The first transmission control signal ZQ1_T may be disabled to a low logic level according to the master information OPT, and the first reception control signal ZQ1_R may be enabled to a high logic level. The second transmission control signal ZQ2_T may have a logic level corresponding to a logic level of a complementary signal MASKB of the mask signal MASK, and the second reception control signal ZQ2_R may have a logic level corresponding to a logic level of the mask signal MASK.

When the master information OPT is a high logic level and the swapping information SWAP is a low logic level (when the semiconductor circuit 300 functions as a slave chip and does not operate in the swapping mode), the swapping control circuit 330 may disable the swapping control signal SW to a low logic level. The first transmission control signal ZQ1_T may be enabled to a high logic level according to the master information OPT, and the first reception control signal ZQ1_R may be disabled to a low logic level. The second transmission control signal ZQ2_T may have a logic level corresponding to a logic level of the complementary signal MASKB of the mask signal MASK, and the second reception control signal ZQ2_R may have a logic level corresponding to a logic level of the mask signal MASK.

When the master information OPT is a low logic level and the swapping information SWAP is a high logic level (when the semiconductor circuit 300 functions as a master chip and operates in the swapping mode), the swapping control circuit 330 may enable the swapping control signal SW to a high logic level. The first transmission control signal ZQ1_T may have a logic level corresponding to a logic level of the complementary signal MASKB of the mask signal MASK, and the first reception control signal ZQ1_R may have a logic level corresponding to a logic level of the mask signal MASK. The second transmission control signal ZQ2_T may be disabled to a low logic level according to the master information OPT, and the second reception control signal ZQ2_R may be enabled to a high logic level.

When the master information OPT is a high logic level and the swapping information SWAP is a high logic level (when the semiconductor circuit 300 functions as a slave chip and operates in the swapping mode), the swapping control circuit 330 may disable the swapping control signal SW to a low logic level. The first transmission control signal ZQ1_T may be enabled to a high logic level according to the master information OPT, and the first reception control signal ZQ1_R may be disabled to a low logic level. The second transmission control signal ZQ2_T may have a logic level corresponding to a logic level of the complementary signal MASKB of the mask signal MASK, and the second reception control signal ZQ2_R may have a logic level corresponding to a logic level of the mask signal MASK.

Figure 7:
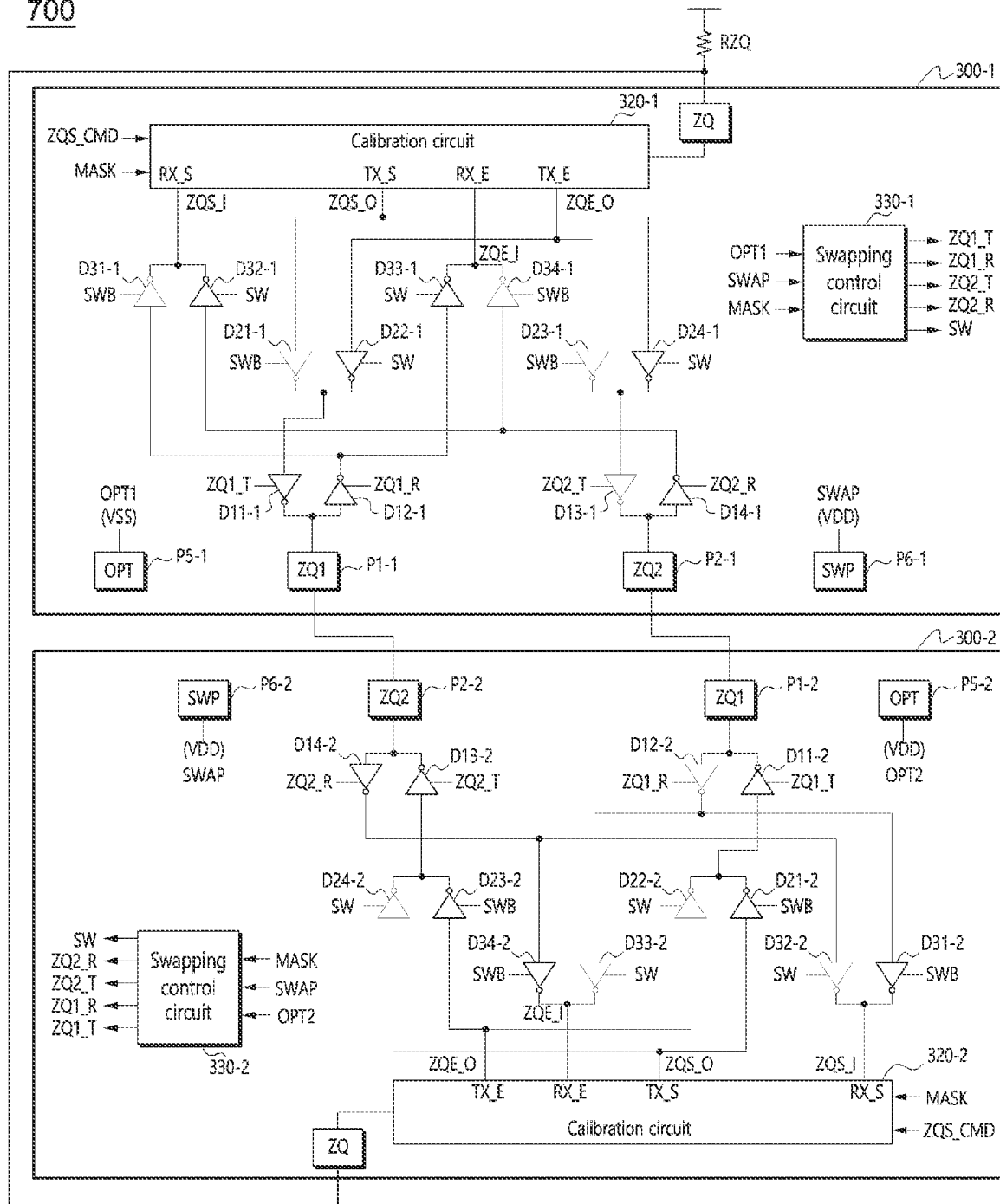
FIG. 7 is a diagram illustrating the configuration and coupling relationship of a semiconductor apparatus including two semiconductor chips which operate in a swapping mode.
Figure 8:
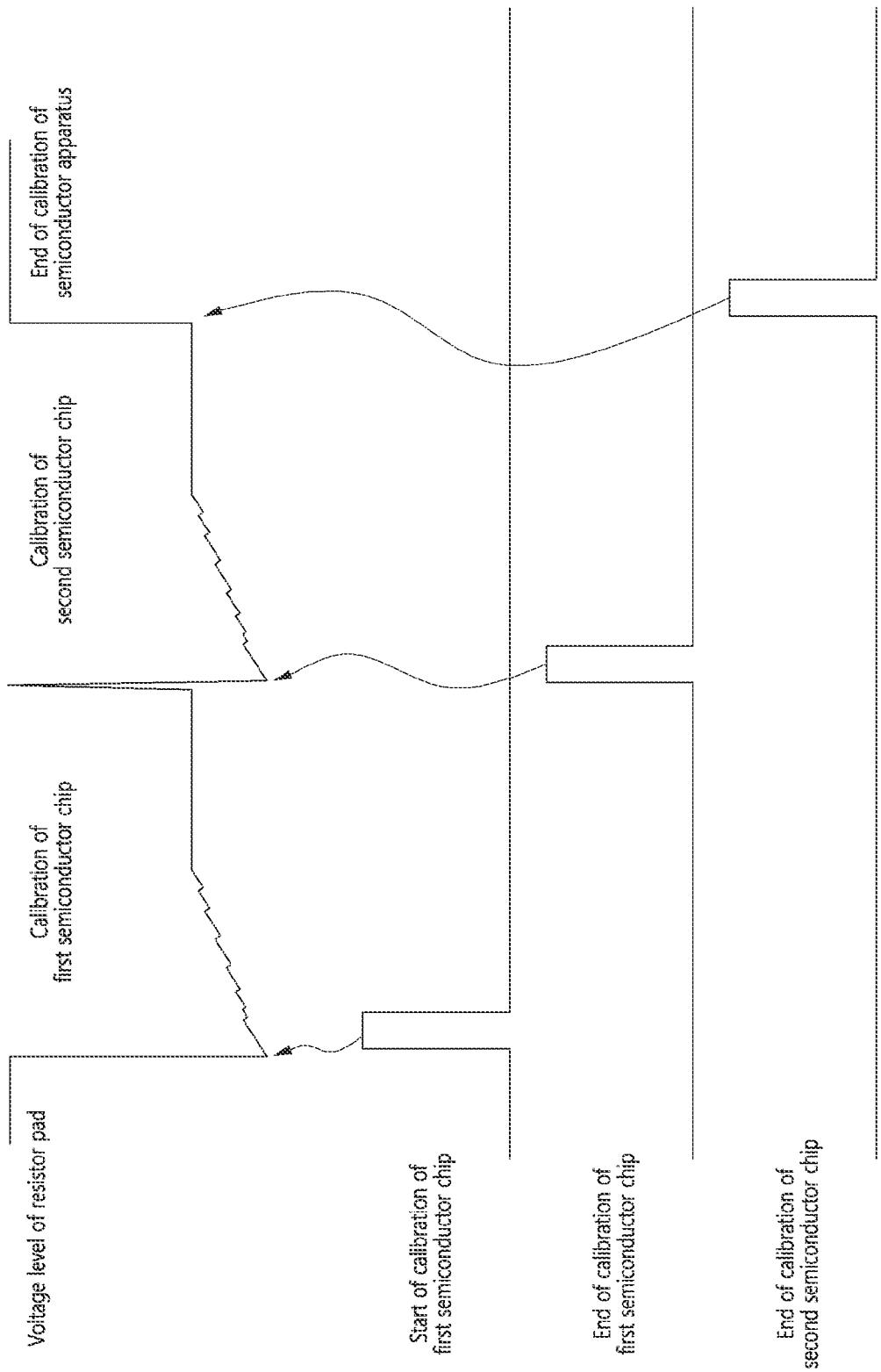
FIG. 8 is a timing diagram illustrating the operation of a semiconductor apparatus in accordance with an embodiment of the present disclosure.

FIG. 7 is a diagram illustrating the coupling relationship of a semiconductor apparatus 700 in accordance with an embodiment of the present disclosure, and FIG. 8 is a timing diagram illustrating the operation of the semiconductor apparatus 700 in accordance with the embodiment of the present disclosure. Referring to FIGS. 7 and 8, the semiconductor apparatus 700 may include a first semiconductor chip 300-1 and a second semiconductor chip 300-2. The second semiconductor chip 300-2 may be disposed by being rotated 180 degrees with respect to the first semiconductor chip 300-1. Each of the first and second semiconductor chips 300-1 and 300-2 may have the same configuration as the semiconductor circuit 300 illustrated in FIG. 3. The first semiconductor chip 300-1 may function as a master chip, and the second semiconductor chip 300-2 may function as a slave chip. A first pad (ZQ1) P1-1 of the first semiconductor chip 300-1 may be coupled to a second pad (ZQ2) P2-2 of the second semiconductor chip 300-2, and a second pad (ZQ2) P2-1 of the first semiconductor chip 300-1 may be coupled to a first pad (ZQ1) P1-2 of the second semiconductor chip 300-2. The first pad P1-1 of the first semiconductor chip 300-1 may be wire-bonded to the second pad P2-2 of the second semiconductor chip 300-2, and the second pad P2-1 of the first semiconductor chip 300-1 may be wire-bonded to the first pad P1-2 of the second semiconductor chip 300-2. The first and second semiconductor chips 300-1 and 300-2 may operate in a swapping mode.

A third pad (OPT) P5-1 of the first semiconductor chip 300-1 may receive a first power supply voltage (i.e., a ground voltage VSS) that may be determined as a low logic level, as first chip master information OPT1. A third pad (OPT) P5-2 of the second semiconductor chip 300-2 may receive a second power supply voltage (i.e., an operating power supply voltage VDD) that may be determined as a high logic level, as second chip master information OPT2. A fourth pad (SWP) P6-1 of the first semiconductor chip 300-1 may receive the second power supply voltage as swapping information SWAP. A fourth pad (SWP) P6-2 of the second semiconductor chip 300-2 may receive the second power supply voltage as swapping information SWAP.

Based on the first chip master information OPT1 and the swapping information SWAP, a swapping control circuit 330-1 of the first semiconductor chip 300-1 may provide a mask signal MASK as a first transmission control signal ZQ1_T, may provide a complementary signal MASKB of the mask signal MASK as a first reception control signal ZQ1_R, may disable a second transmission control signal ZQ2_T to a low logic level and may enable a second reception control signal ZQ2_R to a high logic level. In a pad selection circuit of a swapping circuit, first and second drivers D11-1 and D12-1 may be activated according to a logic level of the mask signal MASK, a third driver D13-1 may be deactivated, and a fourth driver D14-1 may be activated. In a transmission selection circuit of the swapping circuit, a first driver D21-1 may be deactivated, a second driver D22-1 may be activated, a third driver D23-1 may be deactivated, and a fourth driver D24-1 may be activated. In a reception selection circuit of the swapping circuit, a first driver D31-1 may be deactivated, a second driver D32-1 may be activated, a third driver D33-1 may be activated, and a fourth driver D34-1 may be deactivated. Accordingly, the swapping circuit of the first semiconductor chip 300-1 may provide a path through which an end output signal ZQE_O is output and a path through which an end input signal ZQE_I is received, to the first pad P1-1. The swapping circuit of the first semiconductor chip 300-1 may provide a path through which a start input signal ZQS_I is received, to the second pad P2-1.

Based on the second chip master information OPT2 and the swapping information SWAP, a swapping control circuit 330-2 of the second semiconductor chip 300-2 may enable a first transmission control signal ZQ1_T to a high logic level, may disable a first reception control signal ZQ1_R to a low logic level, may provide a mask signal MASK as a second transmission control signal ZQ2_T and may provide a complementary signal MASKB of the mask signal MASK as a second reception control signal ZQ2_R. In a pad selection circuit of a swapping circuit, a first driver D11-2 may be activated, a second driver D12-2 may be deactivated, and third and fourth drivers D13-2 and D14-2 may be activated according to a logic level of the mask signal MASK. In a transmission selection circuit of the swapping circuit, a first driver D21-2 may be activated, a second driver D22-2 may be deactivated, a third driver D23-2 may be activated, and a fourth driver D24-2 may be deactivated. In a reception selection circuit of the swapping circuit, a first driver D31-2 may be activated, a second driver D32-2 may be deactivated, a third driver D33-2 may be deactivated, and a fourth driver D34-2 may be activated. Accordingly, the swapping circuit of the second semiconductor chip 300-2 may provide a path through which a start output signal ZQS_O is output, to the first pad P1-2. The swapping circuit of the second semiconductor chip 300-2 may provide a path through which an end output signal ZQE_O is output and a path through which an end input signal ZQE_I is received, to the second pad P2-2.

The mask signal MASK of the first semiconductor chip 300-1 may initially have a low logic level, and the mask signal MASK of the second semiconductor chip 300-2 may initially have a high logic level. When the first semiconductor chip 300-1 receives a calibration command signal ZQS_CMD, a calibration circuit 320-1 of the first semiconductor chip 300-1 may generate a calibration enable signal and may perform a calibration operation by being coupled to an external reference resistor RZQ through a resistance pad ZQ. If the second semiconductor chip 300-2 receives the calibration command signal ZQS_CMD, a calibration circuit 320-2 of the second semiconductor chip 300-2 may output the start output signal ZQS_O through the first pad P1-2, and the swapping circuit of the first semiconductor chip 300-1 may provide a signal, received through the second pad P2-1, to the calibration circuit 320-1 as the start input signal ZQS_I. The calibration circuit 320-1 of the first semiconductor chip 300-1 may generate the calibration enable signal based on the start input signal ZQS_I and may perform the calibration operation by being coupled to the external reference resistor RZQ through the resistance pad ZQ.

When the calibration circuit 320-1 of the first semiconductor chip 300-1 completes the calibration operation, the calibration circuit 320-1 of the first semiconductor chip 300-1 may generate the end output signal ZQE_O. The end output signal ZQE_O may be output through the first pad P1-1 and may be provided to the second pad P2-2 of the second semiconductor chip 300-2. When the end output signal ZQE_O is generated and is output through the first pad P1-1, the mask signal MASK of the first semiconductor chip 300-1 may be changed to a high logic level. The second semiconductor chip 300-2 may receive a signal, received through the second pad P2-2, as the end input signal ZQE_I. The mask signal MASK of the second semiconductor chip 300-2 may be changed to a low logic level. The calibration circuit 320-2 of the second semiconductor chip 300-2 may generate a calibration enable signal based on the end input signal ZQE_I and may perform a calibration operation by being coupled to the external reference resistor RZQ through a resistance pad ZQ. When the calibration operation of the calibration circuit 320-2 is completed, the calibration circuit 320-2 may generate the end output signal ZQE_O. The end output signal ZQE_O may be output through the second pad P2-2 and may be provided to the first pad P1-1 of the first semiconductor chip 300-1. When the end output signal ZQE_O of the second semiconductor chip 300-2 is generated and is output through the second pad P2-2, the mask signal MASK may transition again to a low logic level. The first semiconductor chip 300-1 may receive the end output signal ZQE_O of the second semiconductor chip 300-2, received through the first pad P1-1, as the end input signal ZQE_I. The calibration circuit 320-1 of the first semiconductor chip 300-1 may end a calibration operation of the semiconductor apparatus 700 based on the end input signal ZQE_I. For example, the calibration circuit 320-1 may transmit a flag indicating the end of the calibration operation to an external apparatus that provides a command signal to the semiconductor apparatus 700.

Figure 9:
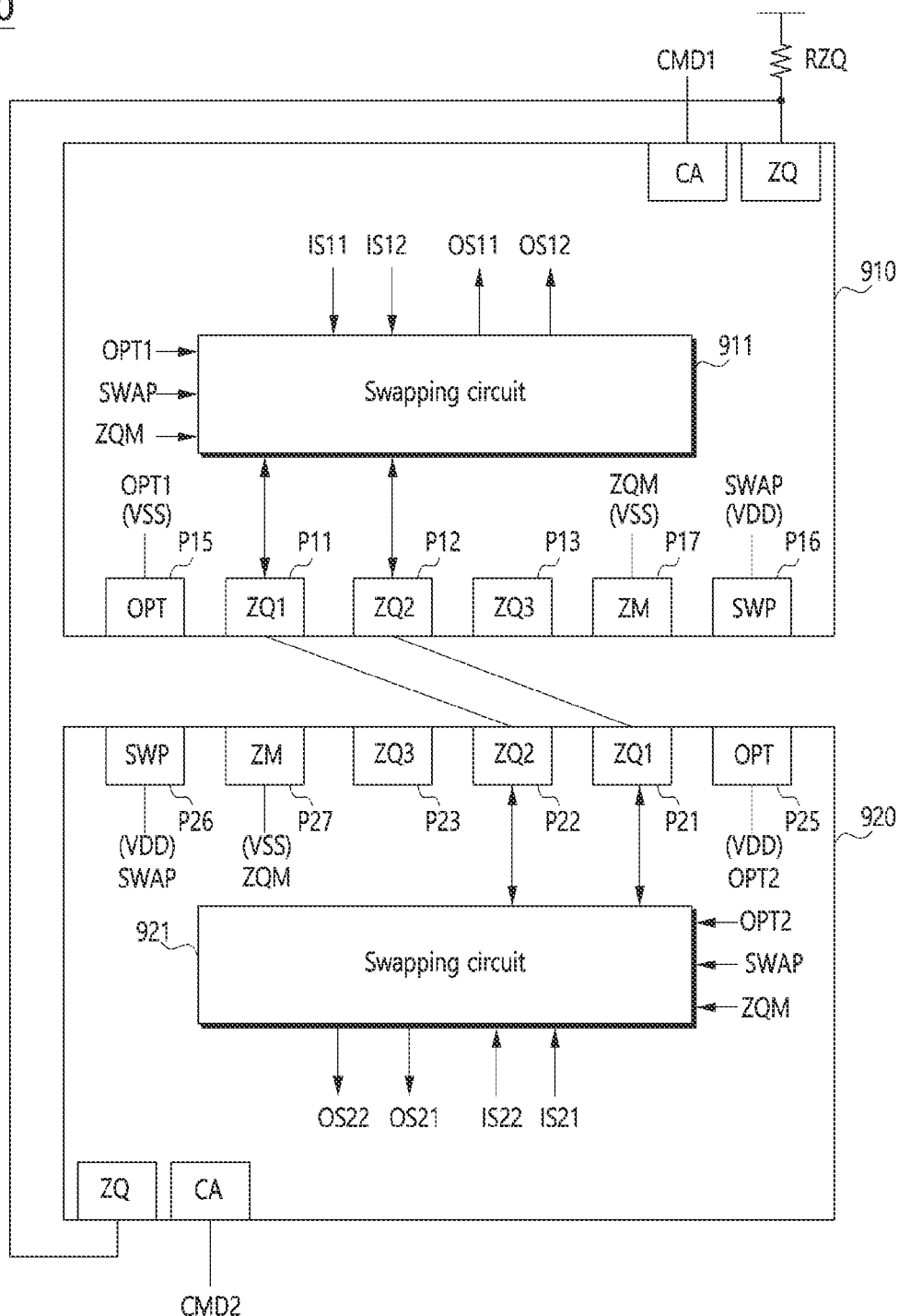
FIG. 9 is a diagram illustrating the configuration of a semiconductor apparatus in accordance with an embodiment of the present disclosure.

FIG. 9 is a diagram illustrating the configuration of a semiconductor apparatus 900 in accordance with an embodiment of the present disclosure. The semiconductor apparatus 900 may include at least two semiconductor chips and may have a configuration that provides efficient pad coupling of the at least two semiconductor chips. The semiconductor apparatus 900 may include a first semiconductor chip 910 and a second semiconductor chip 920. The first and second semiconductor chips 910 and 920 may include first pads (ZQ1) P11 and P21, second pads (ZQ2) P12 and P22 and third pads (ZQ3) P13 and P23, respectively. The second semiconductor chip 920 may be disposed by being rotated 180 degrees with respect to the first semiconductor chip 910. The first pad P11, the second pad P12 and the third pad P13 of the first semiconductor chip 910 may sequentially face the third pad P23, the second pad P22 and the first pad P21 of the second semiconductor chip 920. The first pad P11 of the first semiconductor chip 910 may be coupled to the second pad P22 of the second semiconductor chip 920, and the second pad P12 of the first semiconductor chip 910 may be coupled to the first pad P21 of the second semiconductor chip 920. The first pad P11 of the first semiconductor chip 910 may be wire-bonded to the second pad P22 of the second semiconductor chip 920. The second pad P12 of the first semiconductor chip 910 may be wire-bonded to the first pad P21 of the second semiconductor chip 920. The third pads P13 and P23 of the first and second semiconductor chips 910 and 920 might not have any coupling.

The first and second semiconductor chips 910 and 920 may operate as independent channels. For example, the first semiconductor chip 910 may receive a first command signal CMD1 through a command pad CA, and the second semiconductor chip 920 may receive a second command signal CMD2 through a command pad CA. The first semiconductor chip 910 may perform a data input/output operation independently of or together with the second semiconductor chip 920 based on the first command signal CMD1. The second semiconductor chip 920 may perform a data input/output operation independently of the first semiconductor chip 910 based on the second command signal CMD2. In relationship with an external apparatus that is coupled to the semiconductor apparatus 900, the first and second semiconductor chips 910 and 920 may function as two independent chips operating as ×8 or function as two independent chips operating as ×16. The first semiconductor chip 910 may function as a master chip, and the second semiconductor chip 920 may function as a slave chip. Between the semiconductor apparatus 900 and the external apparatus that is coupled to the semiconductor apparatus 900 and communicates with the semiconductor apparatus 900, it may be prescribed that the first semiconductor chip 910 of the first and second semiconductor chips 910 and 920 is a master chip.

The first semiconductor chip 910 may include a first chip swapping circuit 911, and the second semiconductor chip 920 may include a second chip swapping circuit 921. The first chip swapping circuit 911 may couple the first and second pads P11 and P12 to signal paths of the first semiconductor chip 910 based on master information OPT1 of the first semiconductor chip 910, swapping information SWAP and a mode signal ZQM. The master information OPT1 of the first semiconductor chip 910 may be referred to as first chip master information. The second chip swapping circuit 921 may couple the first and second pads P21 and P22 to signal paths of the second semiconductor chip 920 based on master information OPT2 of the second semiconductor chip 920, the swapping information SWAP and the mode signal ZQM. The master information OPT2 of the second semiconductor chip 920 may be referred to as second chip master information. The first semiconductor chip 910 and the second semiconductor chip 920 may transmit and receive signals to and from each other. The first semiconductor chip 910 may transmit a first internal signal IS11 to the second semiconductor chip 920 through the first pad P11 and may receive a first external signal OS11 from the second semiconductor chip 920 through the first pad P11. The first semiconductor chip 910 may transmit a second internal signal IS12 to the second semiconductor chip 920 through the second pad P12 and may receive a second external signal OS12 from the second semiconductor chip 920 through the second pad P12. The second semiconductor chip 920 may transmit a first internal signal IS21 to the first semiconductor chip 910 through the second pad P22 and may receive a first external signal OS21 from the first semiconductor chip 910 through the second pad P22. The second semiconductor chip 920 may transmit a second internal signal IS22 to the first semiconductor chip 910 through the first pad P21 and may receive a second external signal OS22 from the first semiconductor chip 910 through the first pad P21. The first and second internal signals IS11 and IS12 of the first semiconductor chip 910 may be signals that are generated inside the first semiconductor chip 910, and the first and second internal signals IS21 and IS22 of the second semiconductor chip 920 may be signals that are generated inside the second semiconductor chip 920. The first and second external signals OS11 and OS12 of the first semiconductor chip 910 may be the first and second internal signals IS21 and IS22 of the second semiconductor chip 920 that are received from the second semiconductor chip 920. The first and second external signals OS21 and OS22 of the second semiconductor chip 920 may be the first and second internal signals IS11 and IS12 of the first semiconductor chip 910 that are received from the first semiconductor chip 910.

The first chip swapping circuit 911 may provide a path through which the first internal signal IS11 is output and a path through which the first external signal OS11 is received, to one of the first pad P11 and the second pad P12 based on the first chip master information OPT1, the swapping information SWAP and the mode signal ZQM. The first chip swapping circuit 911 may provide a path through which the second internal signal IS12 is output and a path through which the second external signal OS12 is received, to the other of the first pad P11 and the second pad P12 based on the first chip master information OPT1, the swapping information SWAP and the mode signal ZQM. The mode signal ZQM may have information on semiconductor chips included in the semiconductor apparatus 900. When the semiconductor apparatus 900 includes two semiconductor chips, the mode signal ZQM may have a first logic level. When the semiconductor apparatus 900 includes four semiconductor chips, the mode signal ZQM may have a second logic level. The second chip swapping circuit 921 may provide a path through which the first internal signal IS21 is output and a path through which the first external signal OS21 is received, to one of the first pad P21 and the second pad P22 based on the second chip master information OPT2, the swapping information SWAP and the mode signal ZQM. The second chip swapping circuit 921 may provide a path through which the second internal signal IS22 is output and a path through which the second external signal OS22 is received, to the other of the first pad P21 and the second pad P22 based on the second chip master information OPT2, the swapping information SWAP and the mode signal ZQM.

The first semiconductor chip 910 may function as a master chip and may receive the first chip master information OPT1 with a first logic level, the swapping information SWAP with a second logic level and the mode signal ZQM with the first logic level. Based on the first chip master information OPT1, the swapping information SWAP and the mode signal ZQM, the first chip swapping circuit 911 may provide a path through which the first internal signal IS11 is output and a path through which the first external signal OS11 is received, to the first pad P11, and may provide a path through which the second internal signal IS12 is output and a path through which the second external signal OS12 is received, to the second pad P12. The second semiconductor chip 920 may function as a slave chip and may receive the second chip master information OPT2 with a second logic level, the swapping information SWAP with the second logic level and the mode signal ZQM with the first logic level. Based on the second chip master information OPT2, the swapping information SWAP and the mode signal ZQM, the second chip swapping circuit 921 may provide a path through which the first internal signal IS21 is output and a path through which the first external signal OS21 is received, to the second pad P22, and may provide a path through which the second internal signal IS22 is output and a path through which the second external signal OS22 is received, to the first pad P21. Accordingly, even though the first pad P11 of the first semiconductor chip 910 is coupled to the second pad P22 of the second semiconductor chip 920, the second semiconductor chip 920 may couple the second pad P22 to a path through which the first external signal OS21 is received, and thereby, may receive the first internal signal IS11, output from the first semiconductor chip 910, as the first external signal OS21. The first internal signal IS21 of the second semiconductor chip 920 may be transmitted to the first pad P11 of the first semiconductor chip 910 through the second pad P22, and the first semiconductor chip 910 may receive the first internal signal IS21 of the second semiconductor chip 920 as the first external signal OS11 through the first pad P11. Even though the second pad P12 of the first semiconductor chip 910 is coupled to the first pad P21 of the second semiconductor chip 920, the second semiconductor chip 920 may couple the first pad P21 to a path through which the second external signal OS22 is received, and thereby, may receive the second internal signal IS12, output from the first semiconductor chip 910, as the second external signal OS22. The second internal signal IS22 of the second semiconductor chip 920 may be transmitted to the second pad P12 of the first semiconductor chip 910 through the first pad P21, and the first semiconductor chip 910 may receive the second internal signal IS22 of the second semiconductor chip 920 as the second external signal OS12 through the second pad P12.

The first and second semiconductor chips 910 and 920 may include fourth pads (OPT) P15 and P25, fifth pads (SWP) P16 and P26, and sixth pads (ZM) P17 and P27, respectively. The fourth pad P15 of the first semiconductor chip 910 may receive the first chip master information OPT1. The fourth pad P15 may receive a first power supply voltage with a voltage level that is determined as a first logic level. The fourth pad P15 may be wire-bonded to a terminal of a ground voltage VSS. The fifth pad P16 of the first semiconductor chip 910 may receive the swapping information SWAP. In order for the semiconductor apparatus 900 to operate in a swapping mode, the fifth pad P16 may receive a second power supply voltage with a voltage level that is determined as a second logic level. The fifth pad P16 may be wire-bonded to a terminal to which an operating power supply voltage VDD is supplied. The sixth pad P17 of the first semiconductor chip 910 may receive the mode signal ZQM. The sixth pad P17 may receive the first power supply voltage. The sixth pad P17 may be wire-bonded to a terminal of the ground voltage VSS.

The fourth pad P25 of the second semiconductor chip 920 may receive the second chip master information OPT2. The fourth pad P25 may receive the second power supply voltage. The fourth pad P25 may be wire-bonded to a terminal to which the operating power supply voltage VDD is supplied. The fifth pad P26 of the second semiconductor chip 920 may receive the swapping information SWAP. In order for the semiconductor apparatus 900 to operate in the swapping mode, the fifth pad P26 may receive the second power supply voltage. The fifth pad P26 may be wire-bonded to a terminal to which the operating power supply voltage VDD is supplied. The sixth pad P27 of the second semiconductor chip 920 may receive the mode signal ZQM. The sixth pad P27 may receive the first power supply voltage. The sixth pad P27 may be wire-bonded to a terminal of the ground voltage VSS.

Each of the first and second semiconductor chips 910 and 920 may include a resistance pad ZQ. The first semiconductor chip 910 may be coupled to an external reference resistor RZQ through the resistance pad ZQ. The external reference resistor RZQ may provide a reference resistance value for performing a calibration operation. The second semiconductor chip 920 may be coupled to the external reference resistor RZQ through the resistance pad ZQ. The semiconductor apparatus 900 may include only one external reference resistor RZQ, and the first and second semiconductor chips 910 and 920 may be coupled in common to the one external reference resistor RZQ through the resistance pads ZQ. The first internal signals IS11 and IS21 and the first external signals OS11 and OS21 of the first and second semiconductor chips 910 and 920 may be end signals, respectively. The second internal signals IS12 and IS22 and the second external signals OS12 and OS22 of the first and second semiconductor chips 910 and 920 may be start signals, respectively. The end signals and the start signals may be signals that control the first and second semiconductor chips 910 and 920 sharing the one external reference resistor RZQ such that the first and second semiconductor chips 910 and 920 sequentially perform calibration operations.

Figure 10:
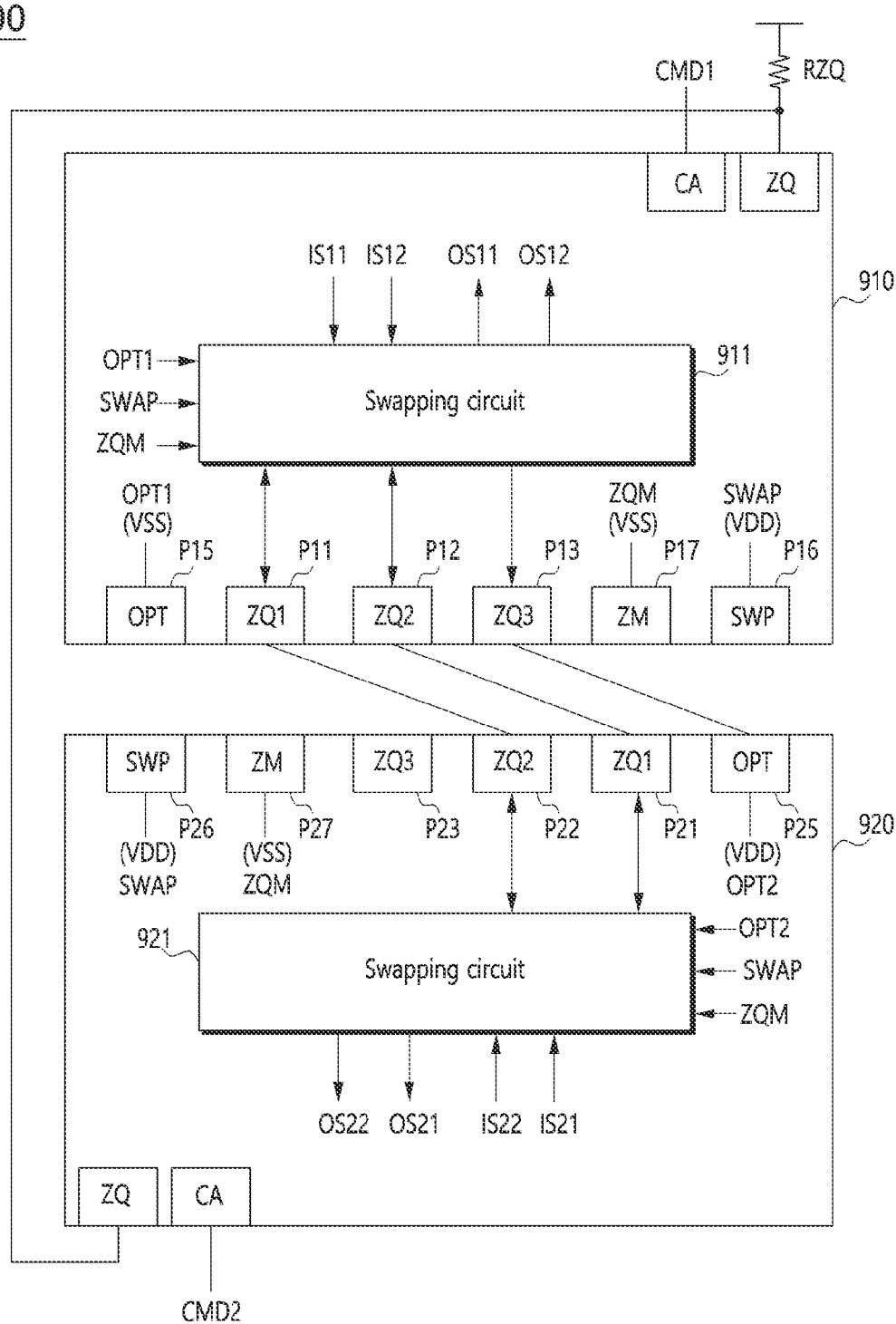
FIG. 10 is a diagram illustrating the configuration of a semiconductor apparatus in accordance with an embodiment of the present disclosure.

FIG. 10 is a diagram illustrating the configuration of a semiconductor apparatus 1000 in accordance with an embodiment of the present disclosure. Referring to FIG. 10, the semiconductor apparatus 1000 may have substantially the same configuration as the semiconductor apparatus 900 of FIG. 9. Repeated descriptions for the same components will be omitted herein. In the semiconductor apparatus 900 of FIG. 9, the third pads (ZQ3) P13 and P23 of the first and second semiconductor chips 910 and 920 might not have any coupling. In FIG. 10, the semiconductor apparatus 1000 may reduce the number of wire bondings between power supply voltage terminals and pads by using pads that have no coupling. The third pad P13 of the first semiconductor chip 910 may be coupled to the fourth pad P25 of the second semiconductor chip 920. The fourth pad P25 of the second semiconductor chip 920 may receive the second chip master information OPT2 from the third pad P13 of the first semiconductor chip 910. The first chip swapping circuit 911 may provide the second power supply voltage to the third pad P13 based on the first chip master information OPT1, the swapping information SWAP and the mode signal ZQM. The fourth pad P25 of the second semiconductor chip 920 might not be wire-bonded to a terminal to which the second power supply voltage is supplied and may receive the second power supply voltage as the second chip master information OPT2 from the third pad P13 of the first semiconductor chip 910.

Figure 11:
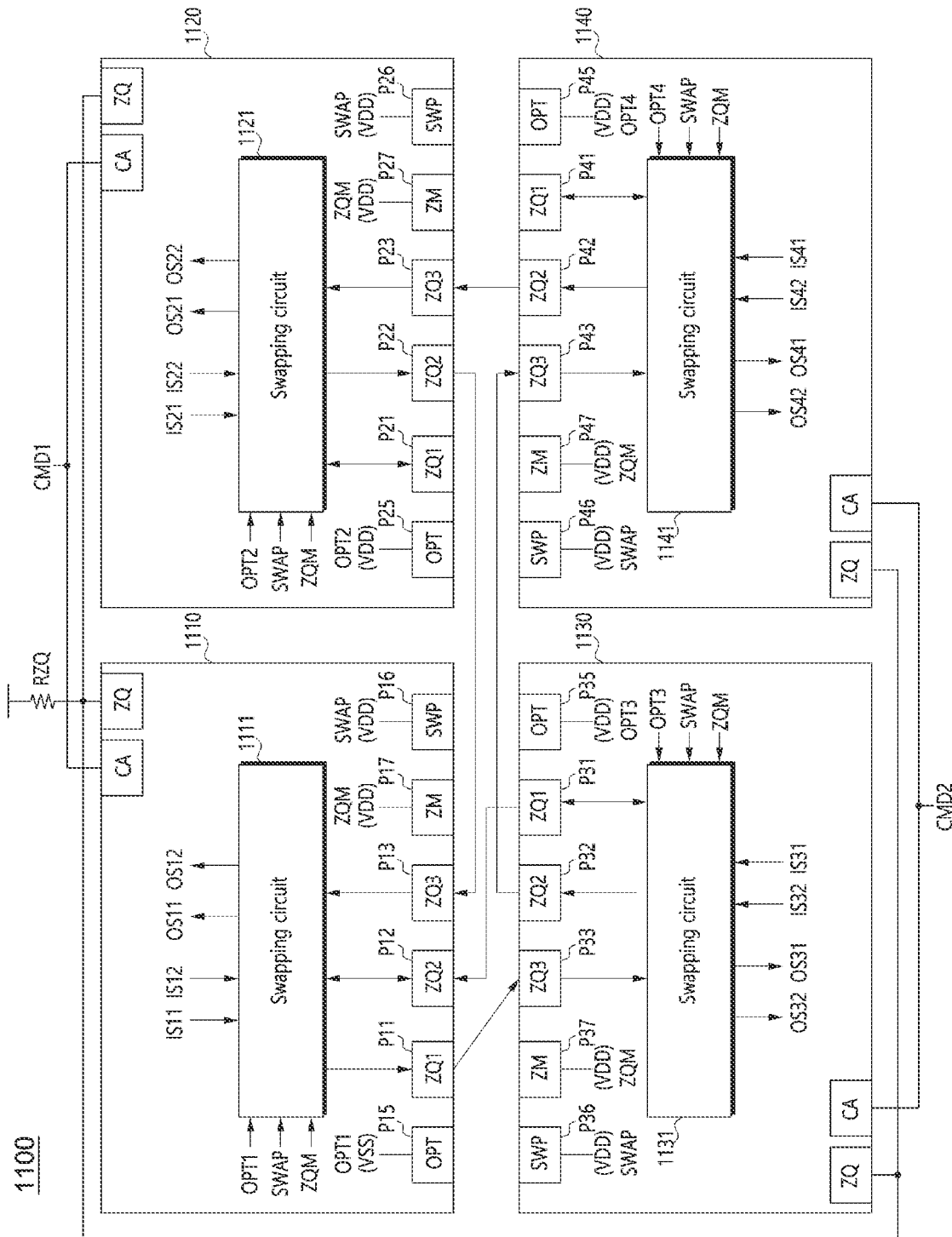
FIG. 11 is a diagram illustrating the configuration of a semiconductor apparatus in accordance with an embodiment of the present disclosure.

FIG. 11 is a diagram illustrating the configuration of a semiconductor apparatus 1100 in accordance with an embodiment of the present disclosure. Referring to FIG. 11, the semiconductor apparatus 1100 may include a first semiconductor chip 1110, a second semiconductor chip 1120, a third semiconductor chip 1130, and a fourth semiconductor chip 1140. The first to fourth semiconductor chips 1110, 1120, 1130, and 1140 may have the same structure to be capable of performing the same function. The first to fourth semiconductor chips 1110, 1120, 1130, and 1140 may configure a single semiconductor apparatus and may be packaged as one package. The first to fourth semiconductor chips 1110, 1120, 1130, and 1140 may be mounted on a substrate, and may be disposed at predetermined locations depending on the structure of the substrate. The second semiconductor chip 1120 may be disposed side by side with the first semiconductor chip 1110. The third semiconductor chip 1130 may be disposed to face the first semiconductor chip 1110 by being rotated 180 degrees with respect to the first and second semiconductor chips 1110 and 1120. The fourth semiconductor chip 1140 may be disposed to face the second semiconductor chip 1120 by being rotated 180 degrees with respect to the first and second semiconductor chips 1110 and 1120. The first to fourth semiconductor chips 1110, 1120, 1130, and 1140 may include first pads (ZQ1) P11, P21, P31, and P41, second pads (ZQ2) P12, P22, P32, and P42 and third pads (ZQ3) P13, P23, P33, and P43, respectively. Because the third semiconductor chip 1130 is rotated 180 degrees with respect to the first semiconductor chip 1110 and is disposed to face the first semiconductor chip 1110, the first pad P11, the second pad P12, and the third pad P13 of the first semiconductor chip 1110 may sequentially face the third pad P33, the second pad P32 and the first pad P31 of the third semiconductor chip 1130. Because the fourth semiconductor chip 1140 is rotated 180 degrees with respect to the second semiconductor chip 1120 and is disposed to face the second semiconductor chip 1120, the first pad P21, the second pad P22, and the third pad P23 of the second semiconductor chip 1120 may sequentially face the third pad P43, the second pad P42 and the first pad P41 of the fourth semiconductor chip 1140. The first pad P11 of the first semiconductor chip 1110 may be coupled to the third pad P33 of the third semiconductor chip 1130. The second pad P12 of the first semiconductor chip 1110 may be coupled to the first pad P31 of the third semiconductor chip 1130. The third pad P13 of the first semiconductor chip 1110 may be coupled to the second pad P22 of the second semiconductor chip 1120. The third pad P23 of the second semiconductor chip 1120 may be coupled to the second pad P42 of the fourth semiconductor chip 1140. The second pad P32 of the third semiconductor chip 1130 may be coupled to the third pad P43 of the fourth semiconductor chip 1140. The first pads P21 and P41 of the second and fourth semiconductor chips 1120 and 1140 might not have any coupling.

The semiconductor apparatus 1100 may operate as two independent channels. The first and second semiconductor chips 1110 and 1120 may configure a first channel and may receive in common a first command signal CMD1. The third and fourth semiconductor chips 1130 and 1140 may configure a second channel and may receive in common a second command signal CMD2. The first and second semiconductor chips 1110 and 1120 may perform a data input/output operation independently of or together with the third and fourth semiconductor chips 1130 and 1140 based on the first command signal CMD1. The third and fourth semiconductor chips 1130 and 1140 may perform a data input/output operation independently of the first and second semiconductor chips 1110 and 1120 based on the second command signal CMD2. Each of the first to fourth semiconductor chips 1110, 1120, 1130 and 1140 may support ×8 data bandwidth. In relationship with an external apparatus that is coupled to the semiconductor apparatus 1100, the first to fourth semiconductor chips 1110, 1120, 1130, and 1140 may function as two chips operating as ×8 or function as two chips operating as ×16. The first semiconductor chip 1110 may function as a master chip of the semiconductor apparatus 1100, and the second to fourth semiconductor chips 1120, 1130 and 1140 may serve as slave chips of the semiconductor apparatus 1100. The first semiconductor chip 1110 may function as a master chip of the first channel, and the second semiconductor chip 1120 may function as a slave chip of the first channel. The third semiconductor chip 1130 may function as a master chip of the second channel, and the fourth semiconductor chip 1140 may function as a slave chip of the second channel. Between the semiconductor apparatus 1100 and the external apparatus that is coupled to the semiconductor apparatus 1100 and communicates with the semiconductor apparatus 1100, it may be prescribed that the first semiconductor chip 1110 or each of the first and third semiconductor chips 1110 and 1130 is a master chip.

The first semiconductor chip 1110 may include a first chip swapping circuit 1111, the second semiconductor chip 1120 may include a second chip swapping circuit 1121, the third semiconductor chip 1130 may include a third chip swapping circuit 1131, and the fourth semiconductor chip 1140 may include a fourth chip swapping circuit 1141. The first chip swapping circuit 1111 may couple the first to third pads P11, P12, and P13 to signal paths of the first semiconductor chip 1110 based on master information OPT1 of the first semiconductor chip 1110, swapping information SWAP and a mode signal ZQM. The master information OPT1 of the first semiconductor chip 1110 may be referred to as first chip master information. The second chip swapping circuit 1121 may couple the second pad P22 and the third pad P23 to signal paths of the second semiconductor chip 1120 based on master information OPT2 of the second semiconductor chip 1120, the swapping information SWAP and the mode signal ZQM. The master information OPT2 of the second semiconductor chip 1120 may be referred to as second chip master information. The third chip swapping circuit 1131 may couple the first to third pads P31, P32, and P33 to signal paths of the third semiconductor chip 1130 based on master information OPT3 of the third semiconductor chip 1130, the swapping information SWAP, and the mode signal ZQM. The master information OPT3 of the third semiconductor chip 1130 may be referred to as third chip master information. The fourth chip swapping circuit 1141 may couple the second pad P42 and the third pad P43 to signal paths of the fourth semiconductor chip 1140 based on master information OPT4 of the fourth semiconductor chip 1140, the swapping information SWAP and the mode signal ZQM. The master information OPT4 of the fourth semiconductor chip 1140 may be referred to as fourth chip master information.

The first to fourth semiconductor chips 1110, 1120, 1130, and 1140 may transmit and receive signals to and from one another. The first semiconductor chip 1110 may transmit a first internal signal IS11 to the third semiconductor chip 1130 through the first pad P11. The first semiconductor chip 1110 may couple a second internal signal IS12 to the second pad P12 and may receive a second external signal OS12 from the third semiconductor chip 1130 through the second pad P12. The first semiconductor chip 1110 may receive a first external signal OS11 from the second semiconductor chip 1120 through the third pad P13. The second semiconductor chip 1120 may transmit a first internal signal IS21 to the first semiconductor chip 1110 through the second pad P22. The second semiconductor chip 1120 may receive a first external signal OS21 from the fourth semiconductor chip 1140 through the third pad P23. The second semiconductor chip 1120 may couple a second internal signal IS22 and a second external signal OS22 to the first pad P21. The third semiconductor chip 1130 may transmit a second internal signal IS32 to the first semiconductor chip 1110 through the first pad P31 and may couple a second external signal OS32 to the first pad P31. The third semiconductor chip 1130 may transmit a first internal signal IS31 to the fourth semiconductor chip 1140 through the second pad P32. The third semiconductor chip 1130 may receive a first external signal OS31 from the first semiconductor chip 1110 through the third pad P33. The fourth semiconductor chip 1140 may transmit a first internal signal IS41 to the second semiconductor chip 1120 through the second pad P42. The fourth semiconductor chip 1140 may receive a first external signal OS41 from the third semiconductor chip 1130 through the third pad P43. The fourth semiconductor chip 1140 may couple a second internal signal IS42 and a second external signal OS42 to the first pad P41.

Based on the first chip master information OPT1, the swapping information SWAP and the mode signal ZQM, the first chip swapping circuit 1111 may provide a path through which the first internal signal IS11 is output, to the first pad P11, may provide a path through which the second internal signal IS12 is output and a path through which the second external signal OS12 is received, to the second pad P12, and may provide a path through which the first external signal OS11 is received, to the third pad P13. Based on the second chip master information OPT2, the swapping information SWAP and the mode signal ZQM, the second chip swapping circuit 1121 may provide a path through which the second internal signal IS22 is output and a path through which the second external signal OS22 is received, to the first pad P21, may provide a path through which the first internal signal IS21 is output, to the second pad P22, and may provide a path through which the first external signal OS21 is received, to the third pad P23. Based on the third chip master information OPT3, the swapping information SWAP and the mode signal ZQM, the third chip swapping circuit 1131 may provide a path through which the second internal signal IS32 is output and a path through which the second external signal OS32 is received, to the first pad P31, may provide a path through which the first internal signal IS31 is output, to the second pad P32, and may provide a path through which the first external signal OS31 is received, to the third pad P33. Based on the fourth chip master information OPT4, the swapping information SWAP and the mode signal ZQM, the fourth chip swapping circuit 1141 may provide a path through which the second internal signal IS42 is output and a path through which the second external signal OS42 is received, to the first pad P41, may provide a path through which the first internal signal IS41 is output, to the second pad P42, and may provide a path through which the first external signal OS41 is received, to the third pad P43.

The first to fourth semiconductor chips 1110, 1120, 1130, and 1140 may include fourth pads (OPT) P15, P25, P35, and P45, fifth pads (SWP) P16, P26, P36, and P46 and sixth pads (ZM) P17, P27, P37 and P47, respectively. The fourth pad P15 of the first semiconductor chip 1110 may receive the first chip master information OPT1. The fourth pad P15 may receive a first power supply voltage with a voltage level that is determined as a first logic level. The fourth pad P15 may be wire-bonded to a terminal of a ground voltage VSS. The fifth pad P16 of the first semiconductor chip 1110 may receive the swapping information SWAP. In order for the semiconductor apparatus 1100 to operate in a swapping mode, the fifth pad P16 may receive a second power supply voltage with a voltage level that is determined as a second logic level. The fifth pad P16 may be wire-bonded to a terminal to which an operating power supply voltage VDD is supplied. The sixth pad P17 of the first semiconductor chip 1110 may receive the mode signal ZQM. Because the semiconductor apparatus 1100 includes four semiconductor chips, the mode signal ZQM may have a second logic level. The sixth pad P17 may receive the second power supply voltage and may be wire-bonded to a terminal to which the operating power supply voltage VDD is supplied.

The fourth pad P25 of the second semiconductor chip 1120 may receive the second chip master information OPT2. The fourth pad P25 may receive the second power supply voltage. The fourth pad P25 may be wire-bonded to a terminal to which the operating power supply voltage VDD is supplied. The fifth pad P26 of the second semiconductor chip 1120 may receive the swapping information SWAP. The fifth pad P26 may receive the second power supply voltage and may be wire-bonded to a terminal to which the operating power supply voltage VDD is supplied. The sixth pad P27 of the second semiconductor chip 1120 may receive the mode signal ZQM. The sixth pad P27 may receive the second power supply voltage and may be wire-bonded to a terminal to which the operating power supply voltage VDD is supplied.

The fourth pad P35 of the third semiconductor chip 1130 may receive the third chip master information OPT3. The fourth pad P35 may receive the second power supply voltage. The fourth pad P35 may be wire-bonded to a terminal to which the operating power supply voltage VDD is supplied. The fifth pad P36 of the third semiconductor chip 1130 may receive the swapping information SWAP. The fifth pad P36 may receive the second power supply voltage and may be wire-bonded to a terminal to which the operating power supply voltage VDD is supplied. The sixth pad P37 of the third semiconductor chip 1130 may receive the mode signal ZQM. The sixth pad P37 may receive the second power supply voltage and may be wire-bonded to a terminal to which the operating power supply voltage VDD is supplied.

The fourth pad P45 of the fourth semiconductor chip 1140 may receive the fourth chip master information OPT4. The fourth pad P45 may receive the second power supply voltage. The fourth pad P45 may be wire-bonded to a terminal to which the operating power supply voltage VDD is supplied. The fifth pad P46 of the fourth semiconductor chip 1140 may receive the swapping information SWAP. The fifth pad P46 may receive the second power supply voltage and may be wire-bonded to a terminal to which the operating power supply voltage VDD is supplied. The sixth pad P47 of the fourth semiconductor chip 1140 may receive the mode signal ZQM. The sixth pad P47 may receive the second power supply voltage and may be wire-bonded to a terminal to which the operating power supply voltage VDD is supplied.

Each of the first to fourth semiconductor chips 1110, 1120, 1130, and 1140 may include a resistance pad ZQ. The first semiconductor chip 1110 may be coupled to an external reference resistor RZQ through the resistance pad ZQ. The second semiconductor chip 1120 may be coupled to the external reference resistor RZQ through the resistance pad ZQ. The third semiconductor chip 1130 may be coupled to the external reference resistor RZQ through the resistance pad ZQ. The fourth semiconductor chip 1140 may be coupled to the external reference resistor RZQ through the resistance pad ZQ. The semiconductor apparatus 1100 may include only one external reference resistor RZQ, and the first to fourth second semiconductor chips 1110, 1120, 1130, and 1140 may be coupled in common to the one external reference resistor RZQ through the resistance pads ZQ. The first internal signals IS11, IS21, IS31, and IS41 and the first external signals OS11, OS21, OS31, and OS41 of the first to fourth semiconductor chips 1110, 1120, 1130, and 1140 may be end signals, respectively. The second internal signals IS12 and IS32 and the second external signals OS12 and OS32 of the first and third semiconductor chips 1110 and 1130 may be start signals, respectively. The end signals and the start signals may be signals that control the first to fourth semiconductor chips 1110, 1120, 1130 and, 1140 sharing the one external reference resistor RZQ such that the first to fourth second semiconductor chips 1110, 1120, 1130, and 1140 sequentially perform calibration operations.

Figure 12:
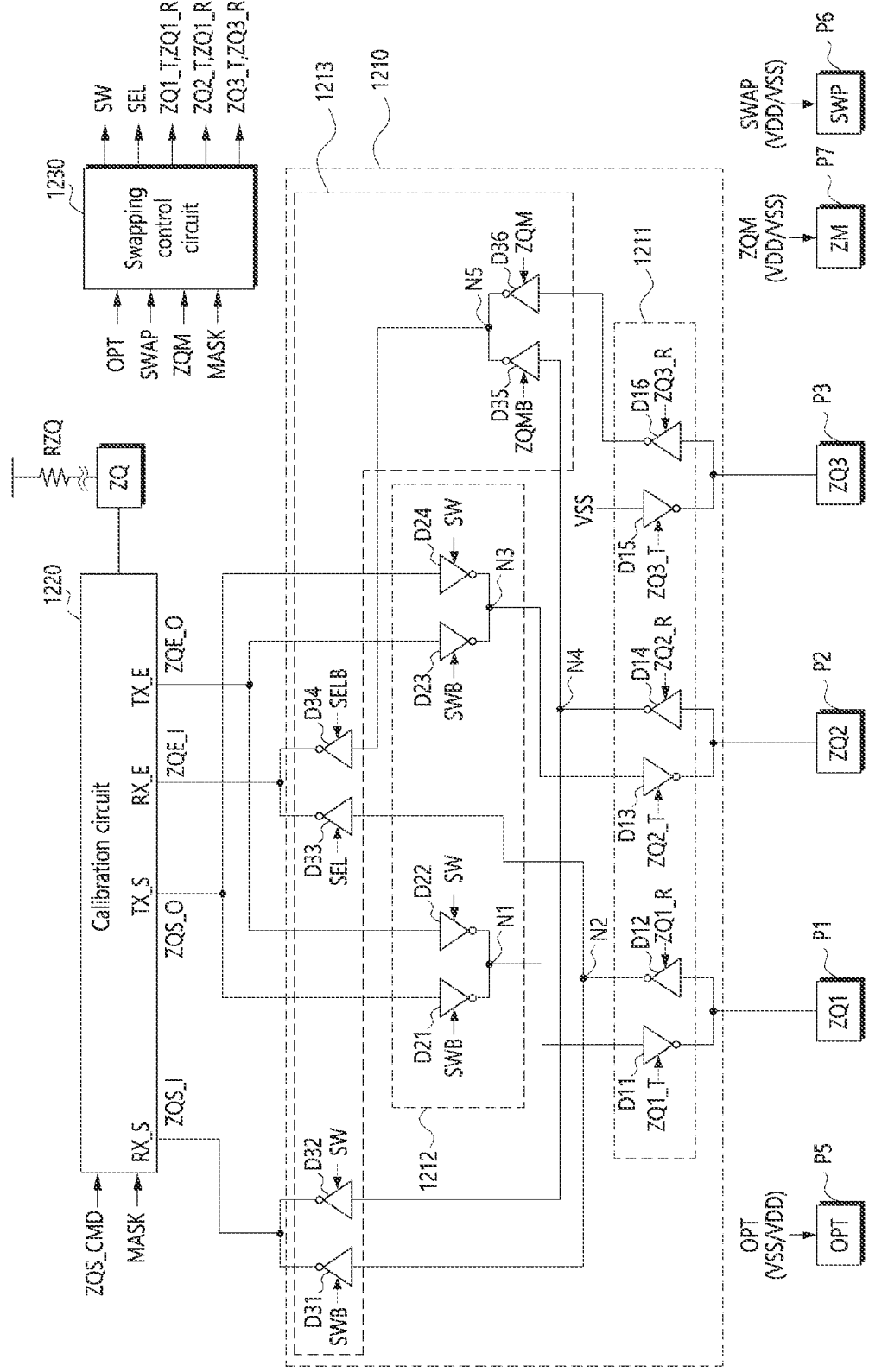
FIG. 12 is a diagram illustrating the configuration of a semiconductor circuit in accordance with an embodiment of the present disclosure.

FIG. 12 is a diagram illustrating the configuration of a semiconductor circuit 1200 in accordance with an embodiment of the present disclosure. The semiconductor circuit 1200 may be applied as each of the semiconductor chips 910, 920, 1110, 1120, 1130, and 1140 of the semiconductor apparatuses 900, 1000 and 1100 illustrated in FIGS. 9, 10 and 11. Referring to FIG. 12, the semiconductor circuit 1200 may include a first pad (ZQ1) P1, a second pad (ZQ2) P2, a third pad (ZQ3) P3, a swapping circuit 1210, and an internal circuit 1220. The first pad P1, the second pad P2 and the third pad P3 may be coupled to different semiconductor circuits and/or pads of circuits, respectively. Based on master information OPT, swapping information SWAP and a mode signal ZQM, the swapping circuit 1210 may provide a path through which a first internal signal is output and a path through which a first external signal is received, to the first pad P1, or may provide a path through which a second internal signal is output and a path through which a second external signal is received, to the first pad P1. Based on the master information OPT, the swapping information SWAP and the mode signal ZQM, the swapping circuit 1210 may provide a path through which the second internal signal is output and a path through which the second external signal is received, to the second pad P2, or may provide a path through which the first internal signal is output and a path through which the first external signal is received, to the second pad P2. Based on the master information OPT, the swapping information SWAP and the mode signal ZQM, the swapping circuit 1210 may provide a path through which a power supply voltage is output, to the third pad P3, or may provide a path through which a first external signal is received, to the third pad P3.

The internal circuit 1220 may be a calibration circuit for performing a calibration operation of the semiconductor circuit 1200. The calibration circuit 1220 may receive the first external signal and the second external signal and may generate the first internal signal and the second internal signal. The calibration circuit 1220 may generate an end output signal ZQE_O and a start output signal ZQS_O and may receive an end input signal ZQE_I and a start input signal ZQS_I. The end output signal ZQE_O may be the first internal signal, and the start output signal ZQS_O may be the second internal signal. The end input signal ZQE_I may be the first external signal, and the start input signal ZQS_I may be the second external signal. The calibration circuit 1220 may output the end output signal ZQE_O through a first output terminal TX_E and may output the start output signal ZQS_O through a second output terminal TX_S. The calibration circuit 1220 may receive the end input signal ZQE_I through a first input terminal RX_E and may receive the start input signal ZQS_I through a second input terminal RX_S.

Based on the master information OPT, the swapping information SWAP and the mode signal ZQM, the swapping circuit 1210 may provide a path through which the end output signal ZQE_O is output, to one of the first pad P1 and the second pad P2, may provide a path through which the end input signal ZQE_I is received, to one of the first pad P1 and the third pad P3, may provide a path through which the start output signal ZQS_O is output, to one of the first pad P1 and the second pad P2 and may provide a path through which the start input signal ZQS_I is received, to one of the first pad P1 and the second pad P2. Additionally, the swapping circuit 1210 may output the power supply voltage through the third pad P3, and the power supply voltage may be used as master information of another semiconductor circuit that is coupled to the semiconductor circuit 1200. For example, when the semiconductor circuit 1200 functions as a master chip, master information of another semiconductor circuit provided by the semiconductor circuit 1200 may be a second logic level, and the swapping circuit 1210 may provide a second power supply voltage with a voltage level corresponding to the second logic level, to the third pad P3.

When the semiconductor circuit 1200 functions as a master chip, the calibration circuit 1220 may perform a calibration operation based on the start input signal ZQS_I. When the calibration operation is completed, the calibration circuit 1220 may generate the end output signal ZQE_O. When the semiconductor circuit 1200 functions as a master chip, if the end input signal ZQE_I is received, the calibration circuit 1220 may determine that all calibration operations of the semiconductor circuit 1200 and another semiconductor circuit have been completed. When the semiconductor circuit 1200 functions as a slave chip, the calibration circuit 1220 may perform the calibration operation if the end input signal ZQE_I is received. The calibration circuit 1220 may further receive a calibration command signal ZQS_CMD and a mask signal MASK. The calibration circuit 1220 may generate a calibration enable signal based on the calibration command signal ZQS_CMD, the mask signal MASK and the start input signal ZQS_I. The calibration command signal ZQS_CMD may be a signal that is generated from a command signal (e.g., each of the first and second command signals CMD1 and CMD2 of FIG. 9), received by the semiconductor circuit 1200, and may be a signal that is enabled to a second logic level when the command signal is a command signal that instructs the calibration operation of the semiconductor circuit 1200. When the mask signal MASK is a first logic level, the calibration circuit 1220 may generate the calibration enable signal based on at least one of the calibration command signal ZQS_CMD and the start input signal ZQS_I and may perform the calibration operation based on the calibration enable signal. When the mask signal MASK is a second logic level, the calibration circuit 1220 may generate the start output signal ZQS_O based on the calibration command signal ZQS_CMD and may generate the calibration enable signal based on the end input signal ZQE_I.

The semiconductor circuit 1200 may further include a fourth pad (OPT) P5, a fifth pad (SWP) P6 and a sixth pad (ZM) P7. The fourth pad P5 may receive the master information OPT. The fourth pad P5 may be coupled to one of a terminal to which a first power supply voltage is supplied and a terminal to which the second power supply voltage is supplied, to receive the master information OPT. When the semiconductor circuit 1200 functions as a master chip, the fourth pad P5 may receive the first power supply voltage with a voltage level that may be determined as a first logic level. When the semiconductor circuit 1200 functions as a slave chip, the fourth pad P5 may receive the second power supply voltage with a voltage level that may be determined as the second logic level. The first power supply voltage may be a ground voltage VSS, and the second power supply voltage may be an operating power supply voltage VDD. In an embodiment, the fourth pad P5 might not be coupled to terminals to which the first and second power supply voltages are supplied and may receive the master information OPT from another semiconductor circuit that is coupled to the semiconductor circuit 1200. For example, the fourth pad P5 may receive the master information OPT from the other semiconductor circuit by being coupled to a third pad of the other semiconductor circuit. The fifth pad P6 may receive the swapping information SWAP. The fifth pad P6 may receive a signal with a different voltage level depending on whether the semiconductor circuit 1200 operates in a swapping mode. The fifth pad P6 may be coupled to one of a terminal to which the first power supply voltage is supplied and a terminal to which the second power supply voltage is supplied, to receive the swapping information SWAP. When the semiconductor circuit 1200 operates in the swapping mode, the fifth pad P6 may receive the second power supply voltage. When the semiconductor circuit 1200 does not operate in the swapping mode, the fifth pad P6 may receive the first power supply voltage. The sixth pad P7 may receive the mode signal ZQM. The sixth pad P7 may receive a signal with a different voltage level depending on the number of semiconductor chips included in a semiconductor apparatus. The sixth pad P7 may be coupled to one of a terminal to which the first power supply voltage is supplied and a terminal to which the second power supply voltage is supplied, to receive the mode signal ZQM. When the semiconductor apparatus includes two semiconductor chips, the sixth pad P7 may receive the first power supply voltage. When the semiconductor apparatus includes four semiconductor chips, the sixth pad P7 may receive the second power supply voltage.

The swapping circuit 1210 may include a pad selection circuit 1211, a transmission selection circuit 1212 and a reception selection circuit 1213. The pad selection circuit 1211 may couple a first node N1 to the first pad P1 based on a first transmission control signal ZQ1_T and may output a signal, transmitted through the first node N1, through the first pad P1. The pad selection circuit 1211 may couple a second node N2 to the first pad P1 based on a first reception control signal ZQ1_R and may output a signal, received through the first pad P1, to the second node N2. The pad selection circuit 1211 may couple a third node N3 to the second pad P2 based on a second transmission control signal ZQ2_T and may output a signal, transmitted through the third node N3, to the second pad P2. The pad selection circuit 1211 may couple a fourth node N4 to the second pad P2 based on a second reception control signal ZQ2_R and may output a signal, received through the second pad P2, to the fourth node N4. The pad selection circuit 1211 may output the first power supply voltage to the third pad P3 based on a third transmission control signal ZQ3_T. The pad selection circuit 1211 may receive a signal through the third pad P3 based on a third reception control signal ZQ3_R. The pad selection circuit 1211 may include a first driver D11, a second driver D12, a third driver D13, a fourth driver D14, a fifth driver D15 and a sixth driver D16. The first driver D11 may be coupled between the first node N1 and the first pad P1, may receive the first transmission control signal ZQ1_T, and when the first transmission control signal ZQ1_T is enabled, may output a signal, transmitted through the first node N1, to the first pad P1. The second driver D12 may be coupled between the first pad P1 and the second node N2, may receive the first reception control signal ZQ1_R, and when the first reception control signal ZQ1_R is enabled, may output a signal, received through the first pad P1, to the second node N2. The third driver D13 may be coupled between the third node N3 and the second pad P2, may receive the second transmission control signal ZQ2_T, and when the second transmission control signal ZQ2_T is enabled, may output a signal, transmitted through the third node N3, to the second pad P2. The fourth driver D14 may be coupled between the second pad P2 and the fourth node N4, may receive the second reception control signal ZQ2_R, and when the second reception control signal ZQ2_R is enabled, may output a signal, received through the second pad P2, to the fourth node N4. The fifth driver D15 may be coupled to the third pad P3, may receive the third transmission control signal ZQ3_T and the first power supply voltage, and when the third transmission control signal ZQ3_T is enabled, may invert the first power supply voltage and thereby output a voltage, with a voltage level corresponding to the second power supply voltage, through the third pad P3. The fifth driver D15 may be selectively used. For example, when the semiconductor circuit 1200 is applied as the semiconductor chips of the semiconductor apparatuses 900 and 1100 illustrated in FIGS. 9 and 11, the fifth driver D15 might not be provided or used. When the semiconductor circuit 1200 is applied as the semiconductor chips of the semiconductor apparatus 1000 illustrated in FIG. 10, the fifth driver D15 may be provided or used. The sixth driver D16 may be coupled to the third pad P3, may receive the third reception control signal ZQ3_R, and based on the third reception control signal ZQ3_R, may receive a signal through the third pad P3.

The transmission selection circuit 1212 may output one of the end output signal ZQE_O and the start output signal ZQS_O to the first node N1 and output the other of the end output signal ZQE_O and the start output signal ZQS_O to the third node N3, based on a swapping control signal SW. When the swapping control signal SW is enabled, the transmission selection circuit 1212 may output the end output signal ZQE_O to the first node N1 and output the start output signal ZQS_O to the third node N3. When the swapping control signal SW is disabled, the transmission selection circuit 1212 may output the end output signal ZQE_O to the third node N3 and output the start output signal ZQS_O to the first node N1. The transmission selection circuit 1212 may include a first driver D21, a second driver D22, a third driver D23 and a fourth driver D24. The first driver D21 may receive a complementary signal SWB of the swapping control signal SW, and when the complementary signal SWB of the swapping control signal SW is enabled, may output the start output signal ZQS_O to the first node N1. The second driver D22 may receive the swapping control signal SW, and when the swapping control signal SW is enabled, may output the end output signal ZQE_O to the first node N1. The third driver D23 may receive the complementary signal SWB of the swapping control signal SW, and when the complementary signal SWB of the swapping control signal SW is enabled, may output the end output signal ZQE_O to the third node N3. The fourth driver D24 may receive the swapping control signal SW, and when the swapping control signal SW is enabled, may output the start output signal ZQS_O to the third node N3.

The reception selection circuit 1213 may output the start input signal ZQS_I from one of the second and fourth nodes N2 and N4 based on the swapping control signal SW. The reception selection circuit 1213 may output signals, received through the fourth node N4 and the third pad P3, to a fifth node N5 based on the mode signal ZQM. The reception selection circuit 1213 may output the end input signal ZQE_I from the second node N2 and the fifth node N5 based on the swapping control signal SW and the mode signal ZQM. When the swapping control signal SW is enabled, the reception selection circuit 1213 may output a signal, transmitted from the fourth node N4, as the start input signal ZQS_I. When the swapping control signal SW is disabled, the reception selection circuit 1213 may output a signal, transmitted from the second node N2, as the start input signal ZQS_I. When the mode signal ZQM is enabled, the reception selection circuit 1213 may output a signal, received through the third pad P3, to the fifth node N5. When the mode signal ZQM is disabled, the reception selection circuit 1213 may output a signal, transmitted from the fourth node N4, to the fifth node N5. When the swapping control signal SW is enabled and the mode signal ZQM is disabled, the reception selection circuit 1213 may output the end input signal ZQE_I from the second node N2. When the swapping control signal SW is disabled or the mode signal ZQM is enabled, the reception selection circuit 1213 may output the end input signal ZQE_I from the fifth node N5. The reception selection circuit 1213 may include a first driver D31, a second driver D32, a third driver D33, a fourth driver D34, a fifth driver D35 and a sixth driver D36. The first driver D31 may receive the complementary signal SWB of the swapping control signal SW, and when the complementary signal SWB of the swapping control signal SW is enabled, may output a signal, transmitted from the second node N2, as the start input signal ZQS_I. The second driver D32 may receive the swapping control signal SW, and when the swapping control signal SW is enabled, may output a signal, transmitted from the fourth node N4, as the start input signal ZQS_I. The third driver D33 may receive a selection control signal SEL, and when the selection control signal SEL is enabled, may output a signal, transmitted from the second node N2, as the end input signal ZQE_I. The selection control signal SEL may be generated based on the swapping control signal SW and the mode signal ZQM. The selection control signal SEL may be enabled when the swapping control signal SW is enabled and the mode signal ZQM is disabled. The fourth driver D34 may receive a complementary signal SELB of the selection control signal SEL, and when the complementary signal SELB of the selection control signal SEL is enabled, may output a signal, transmitted from the fifth node N5, as the end input signal ZQE_I. The fifth driver D35 may receive a complementary signal ZQMB of the mode signal ZQM, and when the complementary signal ZQMB of the mode signal ZQM is enabled, may output a signal, transmitted from the fourth node N4, to the fifth node N5. The sixth driver D36 may receive the mode signal ZQM, and when the mode signal ZQM is enabled, may output a signal, received through the third pad P3, to the fifth node N5.

The semiconductor circuit 1200 may further include a swapping control circuit 1230. The swapping control circuit 1230 may generate the first transmission control signal ZQ1_T, the first reception control signal ZQ1_R, the second transmission control signal ZQ2_T, the second reception control signal ZQ2_R, the third reception control signal ZQ3_R, the swapping control signal SW and the selection control signal SEL, based on the master information OPT, the swapping information SWAP and the mode signal ZQM. When the pad selection circuit 1211 includes the fifth driver D15, the swapping control circuit 1230 may further generate the third transmission control signal ZQ3_T. The swapping control circuit 1230 may further receive the mask signal MASK. The mask signal MASK may be used as a signal that sets logic levels of the first transmission control signal ZQ1_T, the first reception control signal ZQ1_R, the second transmission control signal ZQ2_T and the second reception control signal ZQ2_R based on the swapping control signal SW. The mask signal MASK may be the same as the mask signal MASK, illustrated in FIG. 3, and may be generated by the mask signal generation circuit 450 illustrated in FIG. 5. The mode signal ZQM may be used as a signal that sets logic levels of the third transmission control signal ZQ3_T and the third reception control signal ZQ3_R.

The semiconductor circuit 1200 may further include a resistance pad ZQ. The resistance pad ZQ may be coupled to an external reference resistor RZQ. The calibration circuit 1220 may be coupled to the external reference resistor RZQ through the resistance pad ZQ. The calibration circuit 1220 may be coupled to the external reference resistor RZQ through the resistance pad ZQ when the calibration enable signal is enabled and may perform the calibration operation according to a reference resistance value provided from the external reference resistor RZQ.

Figure 13:
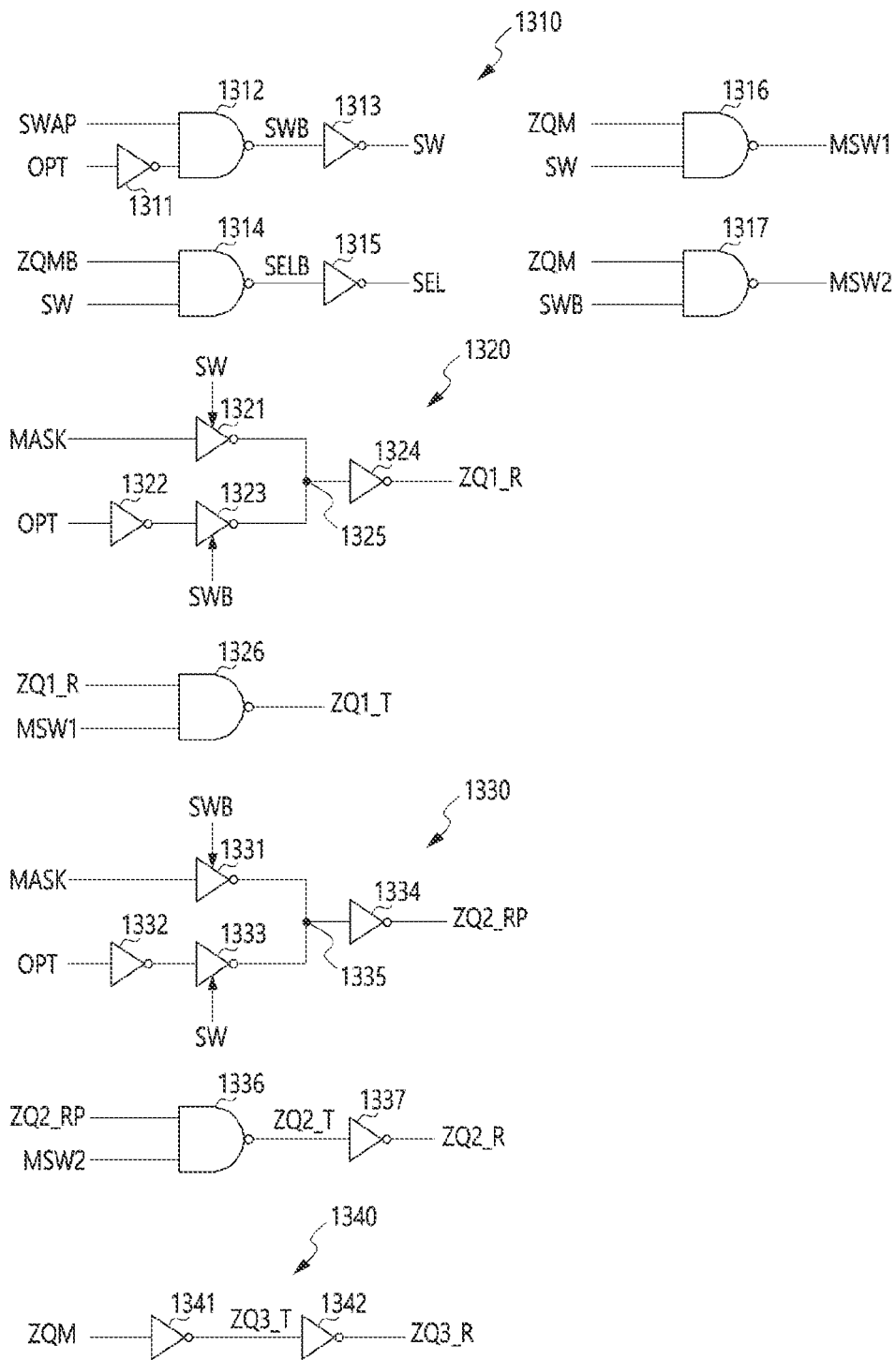
FIG. 13 is a diagram illustrating the configuration of a swapping control circuit illustrated in FIG. 12.

FIG. 13 is a diagram illustrating the configuration of the swapping control circuit 1230 illustrated in FIG. 12. Referring to FIG. 13, the swapping control circuit 1230 may include a control signal generation circuit 1310, a first transmission and reception control signal generation circuit 1320, a second transmission and reception control signal generation circuit 1330 and a third transmission and reception control signal generation circuit 1340. The control signal generation circuit 1310 may generate the swapping control signal SW, the selection control signal SEL, a first mode swapping control signal MSW1 and a second mode swapping control signal MSW2 based on the master information OPT, the swapping information SWAP and the mode signal ZQM. The control signal generation circuit 1310 may include a first inverter 1311, a first NAND gate 1312, a second inverter 1313, a second NAND gate 1314, a third inverter 1315, a third NAND gate 1316 and a fourth NAND gate 1317. The first inverter 1311 may receive the master information OPT and may output inverted master information by inverting the master information OPT. The first NAND gate 1312 may receive the swapping information SWAP and the output of the first inverter 1311 and may generate the complementary signal SWB of the swapping control signal SW by performing a NAND logic operation on the swapping information SWAP and the output of the first inverter 1311. The second inverter 1313 may generate the swapping control signal SW by inverting the output of the first NAND gate 1312. The second NAND gate 1314 may receive the complementary signal ZQMB of the mode signal ZQM and the swapping control signal SW. The second NAND gate 1314 may generate the complementary signal SELB of the selection control signal SEL by performing a NAND logic operation on the complementary signal ZQMB of the mode signal ZQM and the swapping control signal SW. The third inverter 1315 may generate the selection control signal SEL by inverting the output of the second NAND gate 1314. The third NAND gate 1316 may receive the mode signal ZQM and the swapping control signal SW. The third NAND gate 1316 may generate the first mode swapping control signal MSW1 by performing a NAND logic operation on the mode signal ZQM and the swapping control signal SW. The fourth NAND gate 1317 may receive the mode signal ZQM and the complementary signal SWB of the swapping control signal SW. The fourth NAND gate 1317 may generate the second mode swapping control signal MSW2 by performing a NAND logic operation on the mode signal ZQM and the complementary signal SWB of the swapping control signal SW.

The first transmission and reception control signal generation circuit 1320 may generate the first transmission control signal ZQ1_T and the first reception control signal ZQ1_R based on the mask signal MASK, the master information OPT, the swapping control signal SW and the first mode swapping control signal MSW1. The first transmission and reception control signal generation circuit 1320 may include a first inverter 1321, a second inverter 1322, a third inverter 1323, a fourth inverter 1324 and a NAND gate 1326. The first inverter 1321 may invert the mask signal MASK and output an inverted mask signal to a first node 1325 when the swapping control signal SW is enabled. The second inverter 1322 may receive the master information OPT and may generate inverted master information by inverting the master information OPT. When the complementary signal SWB of the swapping control signal SW is enabled, the third inverter 1323 may invert the output of the second inverter 1322 and may output an inverted signal to the first node 1325. The fourth inverter 1324 may generate the first reception control signal ZQ1_R by inverting a signal output through the first node 1325. The NAND gate 1326 may receive the first reception control signal ZQ1_R and the first mode swapping control signal MSW1. The NAND gate 1326 may generate the first transmission control signal ZQ1_T by performing a NAND logic operation on the first reception control signal ZQ1_R and the first mode swapping control signal MSW1.

The second transmission and reception control signal generation circuit 1330 may generate the second transmission control signal ZQ2_T and the second reception control signal ZQ2_R based on the mask signal MASK, the master information OPT, the swapping control signal SW and the second mode swapping control signal MSW2. The second transmission and reception control signal generation circuit 1330 may include a first inverter 1331, a second inverter 1332, a third inverter 1333, a fourth inverter 1334, a NAND gate 1336 and a fifth inverter 1337. When the complementary signal SWB of the swapping control signal SW is enabled, the first inverter 1331 may invert the mask signal MASK and may output an inverted mask signal to a second node 1335. The second inverter 1332 may receive the master information OPT and may generate inverted master information by inverting the master information OPT. When the swapping control signal SW is enabled, the third inverter 1333 may invert the output of the second inverter 1332 and may output an inverted signal to the second node 1335. The fourth inverter 1334 may generate a pre-reception control signal ZQ2_RP by inverting a signal output through the second node 1335. The NAND gate 1336 may receive the pre-reception control signal ZQ2_RP and the second mode swapping control signal MSW2. The NAND gate 1336 may generate the second transmission control signal ZQ2_T by performing a NAND logic operation on the pre-reception control signal ZQ2_RP and the second mode swapping control signal MSW2. The fifth inverter 1337 may receive the second transmission control signal ZQ2_T output from the NAND gate 1336 and may generate the second reception control signal ZQ2_R by inverting the second transmission control signal ZQ2_T.

The third transmission and reception control signal generation circuit 1340 may generate the third transmission control signal ZQ3_T and the third reception control signal ZQ3_R based on the mode signal ZQM. The third transmission and reception control signal generation circuit 1340 may include a first inverter 1341 and a second inverter 1342. The first inverter 1341 may receive the mode signal ZQM and may generate the third transmission control signal ZQ3_T by inverting the mode signal ZQM. The second inverter 1342 may receive the third transmission control signal ZQ3_T and may generate the third reception control signal ZQ3_R by inverting the third transmission control signal ZQ3_T.

signal ZQM is a high logic level (i.e., when a semiconductor apparatus includes four semiconductor chips), the swapping control circuit 1230 may disable the third transmission control signal ZQ3_T to a low logic level and enable the third reception control signal ZQ3_R to a high logic level.

When the mode signal ZQM is a low logic level, the master information OPT is a low logic level and the swapping information SWAP is a low logic level (i.e., when a semiconductor apparatus includes two semiconductor chips and the semiconductor circuit 1200 functions as a master chip and does not operate in the swapping mode), the swapping control circuit 1230 may disable the swapping control signal SW to a low logic level, disable the selection control signal SEL to a low logic level, enable the first mode swapping control signal MSW1 to a high logic level and enable the second mode swapping control signal MSW2 to a high logic level. The first reception control signal ZQ1_R may be enabled to a high logic level according to the master information OPT, and the first transmission control signal ZQ1_T may be disabled to a low logic level. The pre-reception control signal ZQ2_RP may have a logic level corresponding to the logic level of the mask signal MASK, the second transmission control signal ZQ2_T may have a logic level corresponding to the logic level of a complementary signal MASKB of the mask signal MASK, and the second reception control signal ZQ2_R may have a logic level corresponding to the logic level of the mask signal MASK.

When the mode signal ZQM is a low logic level, the master information OPT is a high logic level and the swapping information SWAP is a low logic level (i.e., when a semiconductor apparatus includes two semiconductor chips and the semiconductor circuit 1200 functions as a slave chip and does not operate in the swapping mode), the swapping control circuit 1230 may disable the swapping control signal SW to a low logic level, disable the selection control signal SEL to a low logic level, enable the first mode swapping control signal MSW1 to a high logic level and enable the second mode swapping control signal MSW2 to a high logic level. The first reception control signal ZQ1_R may be disabled to a low logic level according to the master information OPT, and the first transmission control signal ZQ1_T may be enabled to a high logic level. The pre-reception control signal ZQ2_RP may have a logic level corresponding to the logic level of the mask signal MASK, the second transmission control signal ZQ2_T may have a logic level corresponding to the logic level of the complementary signal MASKB of the mask signal MASK, and the

TABLE 2

| OPT | SWAP | ZQM | ZQ1_T | ZQ1_R | ZQ2_T | ZQ2_R | ZQ3_T | ZQ3_R |
|---|---|---|---|---|---|---|---|---|
| L | L | L | L | H | MASKB | MASK | H | L |
| H | L | L | H | L | MASKB | MASK | H | L |
| L | H | L | MASKB | MASK | L | H | H | L |
| H | H | L | H | L | MASKB | MASK | H | L |
| L | L | H | L | H | H | L | L | H |
| H | L | H | H | L | H | L | L | H |
| L | H | H | H | MASK | L | H | L | H |
| H | H | H | H | L | H | L | L | H |

Referring to Table 2 together, when the mode signal ZQM is a low logic level (i.e., when a semiconductor apparatus includes two semiconductor chips), the swapping control circuit 1230 may enable the third transmission control signal ZQ3_T to a high logic level and disable the third reception control signal ZQ3_R to a low logic level. When the mode second reception control signal ZQ2_R may have a logic level corresponding to the logic level of the mask signal MASK.

When the mode signal ZQM is a low logic level, the master information OPT is a low logic level and the swapping information SWAP is a high logic level (i.e., when a semiconductor apparatus includes two semiconductor chips and the semiconductor circuit 1200 functions as a master chip and operates in the swapping mode), the swapping control circuit 1230 may enable the swapping control signal SW to a high logic level, enable the selection control signal SEL to a high logic level, enable the first mode swapping control signal MSW1 to a high logic level and enable the second mode swapping control signal MSW2 to a high logic level. The first reception control signal ZQ1_R may have a logic level corresponding to the logic level of the mask signal MASK, and the first transmission control signal ZQ1_T may have a logic level corresponding to the logic level of the complementary signal MASKB of the mask signal MASK. The pre-reception control signal ZQ2_RP may be enabled to a high logic level according to the master information OPT, the second transmission control signal ZQ2_T may be disabled to a low logic level, and the second reception control signal ZQ2_R may be enabled to a high logic level.

When the mode signal ZQM is a low logic level, the master information OPT is a high logic level and the swapping information SWAP is a high logic level (i.e., when a semiconductor apparatus includes two semiconductor chips and the semiconductor circuit 1200 functions as a slave chip and operates in the swapping mode), the swapping control circuit 1230 may disable the swapping control signal SW to a low logic level, enable the selection control signal SEL to a high logic level, enable the first mode swapping control signal MSW1 to a high logic level and enable the second mode swapping control signal MSW2 to a high logic level. The first reception control signal ZQ1_R may be disabled to a low logic level according to the master information OPT, and the first transmission control signal ZQ1_T may be enabled to a high logic level. The pre-reception control signal ZQ2_RP may have a logic level corresponding to the logic level of the mask signal MASK, the second transmission control signal ZQ2_T may have a logic level corresponding to the logic level of the complementary signal MASKB of the mask signal MASK, and the second reception control signal ZQ2_R may have a logic level corresponding to the logic level of the mask signal MASK.

When the mode signal ZQM is a high logic level, the master information OPT is a low logic level and the swapping information SWAP is a low logic level (i.e., when a semiconductor apparatus includes four semiconductor chips and the semiconductor circuit 1200 functions as a master chip and does not operate in the swapping mode), the swapping control circuit 1230 may disable the swapping control signal SW to a low logic level, disable the selection control signal SEL to a low logic level, enable the first mode swapping control signal MSW1 to a high logic level and disable the second mode swapping control signal MSW2 to a low logic level. The first reception control signal ZQ1_R may be enabled to a high logic level according to the master information OPT, and the first transmission control signal ZQ1_T may be disabled to a low logic level. The pre-reception control signal ZQ2_RP may have a logic level corresponding to the logic level of the mask signal MASK, but the second transmission control signal ZQ2_T may be enabled to a high logic level and the second reception control signal ZQ2_R may be disabled to a low logic level.

When the mode signal ZQM is a high logic level, the master information OPT may be a high logic level and the swapping information SWAP may be a low logic level (i.e., when a semiconductor apparatus includes four semiconductor chips and the semiconductor circuit 1200 functions as a slave chip and does not operate in the swapping mode), the swapping control circuit 1230 may disable the swapping control signal SW to a low logic level, disable the selection control signal SEL to a low logic level, enable the first mode swapping control signal MSW1 to a high logic level and disable the second mode swapping control signal MSW2 to a low logic level. The first reception control signal ZQ1_R may be disabled to a low logic level according to the master information OPT, and the first transmission control signal ZQ1_T may be enabled to a high logic level. The pre-reception control signal ZQ2_RP may have a logic level corresponding to the logic level of the mask signal MASK, but the second transmission control signal ZQ2_T may be enabled to a high logic level and the second reception control signal ZQ2_R may be disabled to a low logic level.

When the mode signal ZQM is a high logic level, the master information OPT is a low logic level and the swapping information SWAP is a high logic level (i.e., when a semiconductor apparatus includes four semiconductor chips and the semiconductor circuit 1200 functions as a master chip and operates in the swapping mode), the swapping control circuit 1230 may enable the swapping control signal SW to a high logic level, disable the selection control signal SEL to a low logic level, disable the first mode swapping control signal MSW1 to a low logic level and enable the second mode swapping control signal MSW2 to a high logic level. The first reception control signal ZQ1_R may have a logic level corresponding to the logic level of the mask signal MASK, but the first transmission control signal ZQ1_T may be enabled to a high logic level. The pre-reception control signal ZQ2_RP may be enabled to a high logic level according to the master information OPT, and the second transmission control signal ZQ2_T may be disabled to a low logic level. The second reception control signal ZQ2_R may be enabled to a high logic level.

When the mode signal ZQM is a high logic level, the master information OPT is a high logic level and the swapping information SWAP is a high logic level (i.e., when a semiconductor apparatus includes four semiconductor chips and the semiconductor circuit 1200 functions as a slave chip and operates in the swapping mode), the swapping control circuit 1230 may disable the swapping control signal SW to a low logic level, disable the selection control signal SEL to a low logic level, enable the first mode swapping control signal MSW1 to a high logic level and disable the second mode swapping control signal MSW2 to a low logic level. The first reception control signal ZQ1_R may be disabled to a low logic level according to the master information OPT, and the first transmission control signal ZQ1_T may be enabled to a high logic level. The pre-reception control signal ZQ2_RP may have a logic level corresponding to the logic level of the mask signal MASK, but the second transmission control signal ZQ2_T may be enabled to a high logic level and the second reception control signal ZQ2_R may be disabled to a low logic level.

Figure 14:
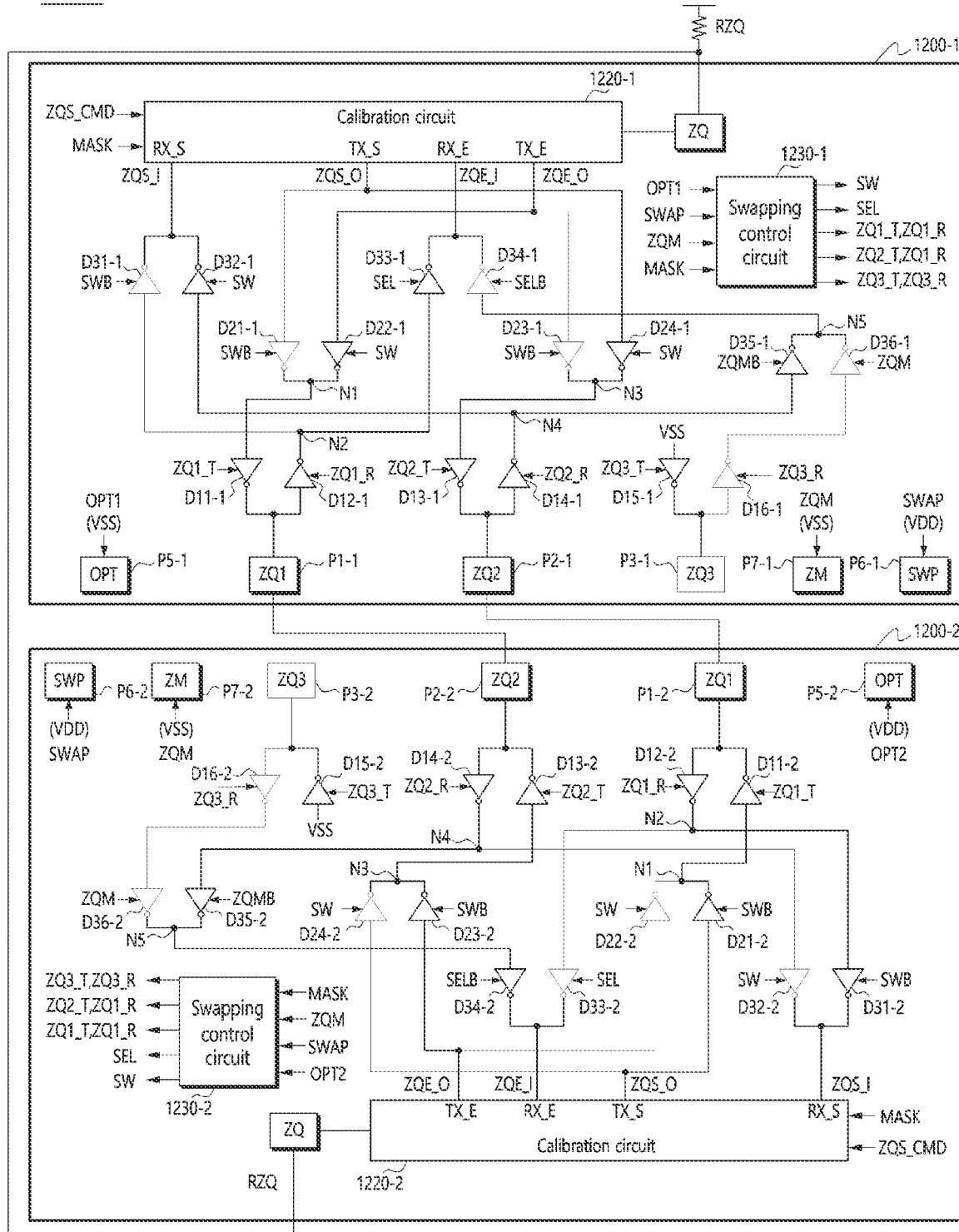
FIG. 14 is a diagram illustrating the configuration and coupling relationship of a semiconductor apparatus including two semiconductor chips which operate in a swapping mode.

FIG. 14 is a diagram illustrating the configuration and coupling relationship of a semiconductor apparatus 1400 including two semiconductor chips that operate in a swapping mode. Referring to FIG. 14, the semiconductor apparatus 1400 may include a first semiconductor chip 1200-1 and a second semiconductor chip 1200-2. The semiconductor circuit 1200 illustrated in FIG. 12 may be applied as each of the first and second semiconductor chips 1200-1 and 1200-2. The first semiconductor chip 1200-1 may function as a master chip, and the second semiconductor chip 1200-2 may function as a slave chip. A first pad (ZQ1) P1-1 of the first semiconductor chip 1200-1 may be coupled to a second pad (ZQ2) P2-2 of the second semiconductor chip 1200-2, and a second pad (ZQ2) P2-1 of the first semiconductor chip 1200-1 may be coupled to a first pad (ZQ1) P1-2 of the second semiconductor chip 1200-2. Third pads (ZQ3) P3-1 and P3-2 of the first and second semiconductor chips 1200-1 and 1200-2 might not have any coupling. A fourth pad (OPT) P5-1 of the first semiconductor chip 1200-1 may receive first chip master information OPT1, a fifth pad (SWP) P6-1 may receive the swapping information SWAP, and a sixth pad (ZM) P7-1 may receive the mode signal ZQM. A fourth pad (OPT) P5-2 of the second semiconductor chip 1200-2 may receive second chip master information OPT2, a fifth pad (SWP) P6-2 may receive the swapping information SWAP, and a sixth pad (ZM) P7-2 may receive the mode signal ZQM.

The first chip master information OPT1 may be a low logic level, the swapping information SWAP may be a high logic level, and the mode signal ZQM may be a low logic level. Accordingly, a swapping control circuit 1230-1 may enable the swapping control signal SW to a high logic level, enable the selection control signal SEL to a high logic level, enable the first mode swapping control signal MSW1 to a high logic level, and enable the second mode swapping control signal MSW2 to a high logic level. The first reception control signal ZQ1_R may have a logic level corresponding to the logic level of the mask signal MASK, and the first transmission control signal ZQ1_T may have a logic level corresponding to the logic level of the complementary signal MASKB of the mask signal MASK. The pre-reception control signal ZQ2_RP may be enabled to a high logic level according to the first chip master information OPT1, the second transmission control signal ZQ2_T may be disabled to a low logic level, and the second reception control signal ZQ2_R may be enabled to a high logic level. The third transmission control signal ZQ3_T may be enabled to a high logic level, and the third reception control signal ZQ3_R may be disabled to a low logic level.

In the first semiconductor chip 1200-1, a first driver D11-1 and a second driver D12-1 of a pad selection circuit that are coupled to the first pad P1-1 may be selectively activated according to the logic level of the mask signal MASK. A third driver D13-1 of the pad selection circuit that is coupled to the second pad P2-1 may be deactivated, and a fourth driver D14-1 may be activated. A fifth driver D15-1 of the pad selection circuit that is coupled to the third pad P3-1 may be activated, and a sixth driver D16-1 may be deactivated. However, the fifth driver D15-1 might not be used. A first driver D21-1 of a transmission selection circuit may be deactivated, a second driver D22-1 may be activated, a third driver D23-1 may be deactivated, and a fourth driver D24-1 may be activated. A first driver D31-1 of a reception selection circuit may be deactivated, a second driver D32-1 may be activated, a third driver D33-1 may be activated, a fourth driver D34-1 may be deactivated, a fifth driver D35-1 may be activated, and a sixth driver D36-1 may be deactivated. Accordingly, the first semiconductor chip 1200-1 may transmit the end output signal ZQE_O through the first pad P1-1 or may receive a signal, received through the first pad P1-1, as the end input signal ZQE_I. Also, the first semiconductor chip 1200-1 may receive a signal, received through the second pad P2-1, as the start input signal ZQS_I.

The second chip master information OPT2 may be a high logic level, the swapping information SWAP may be a high logic level, and the mode signal ZQM may be a low logic level. Accordingly, a swapping control circuit 1230-2 may disable the swapping control signal SW to a low logic level, enable the selection control signal SEL to a high logic level, enable the first mode swapping control signal MSW1 to a high logic level, and enable the second mode swapping control signal MSW2 to a high logic level. The first reception control signal ZQ1_R may be disabled to a low logic level according to the second chip master information OPT2, and the first transmission control signal ZQ1_T may be enabled to a high logic level. The pre-reception control signal ZQ2_RP may have a logic level corresponding to the logic level of the mask signal MASK, the second transmission control signal ZQ2_T may have a logic level corresponding to the logic level of the complementary signal MASKB of the mask signal MASK, and the second reception control signal ZQ2_R may have a logic level corresponding to the logic level of the mask signal MASK. The third transmission control signal ZQ3_T may be enabled to a high logic level, and the third reception control signal ZQ3_R may be disabled to a low logic level.

In the second semiconductor chip 1200-2, a first driver D11-2 of a pad selection circuit that is coupled to the first pad P1-2 may be activated, and a second driver D12-2 may be deactivated. A third driver D13-2 and a fourth driver D14-2 of the pad selection circuit that are coupled to the second pad P2-2 may be selectively activated according to the logic level of the mask signal MASK. A fifth driver D15-2 of the pad selection circuit that is coupled to the third pad P3-2 may be activated, and a sixth driver D16-2 of the pad selection circuit that is coupled to the third pad P3-2 may be deactivated. However, the fifth driver D15-2 might not be used. A first driver D21-2 of a transmission selection circuit may be activated, a second driver D22-2 may be deactivated, a third driver D23-2 may be activated, and a fourth driver D24-2 may be deactivated. A first driver D31-2 of a reception selection circuit may be activated, a second driver D32-2 may be deactivated, a third driver D33-2 may be deactivated, a fourth driver D34-2 may be activated, a fifth driver D35-2 may be activated, and a sixth driver D36-2 may be deactivated. Accordingly, the second semiconductor chip 1200-2 may transmit the end output signal ZQE_O through the second pad P2-2 or may receive a signal, received through the second pad P2-2, as the end input signal ZQE_I. Also, the second semiconductor chip 1200-2 may transmit the start output signal ZQS_O through the first pad P1-2.

When the first semiconductor chip 1200-1 receives the calibration command signal ZQS_CMD, a calibration circuit 1220-1 of the first semiconductor chip 1200-1 may start a calibration operation by being coupled to an external reference resistor RZQ through a resistance pad ZQ based on the calibration command signal ZQS_CMD. If the second semiconductor chip 1200-2 receives the calibration command signal ZQS_CMD, a calibration circuit 1220-2 of the second semiconductor chip 1200-2 may generate the start output signal ZQS_O, and the start output signal ZQS_O may be transmitted to the second pad P2-1 of the first semiconductor chip 1200-1 through the first pad P1-2. The first semiconductor chip 1200-1 may receive a signal, received through the second pad P2-1, as the start input signal ZQS_I, and the calibration circuit 1220-1 may start the calibration operation based on the start input signal ZQS_I.

When the calibration circuit 1220-1 of the first semiconductor chip 1200-1 completes the calibration operation, the calibration circuit 1220-1 may generate the end output signal ZQE_O, and the end output signal ZQE_O may be transmitted to the second pad P2-2 of the second semiconductor chip 1200-2 through the first pad P1-1. The second semiconductor chip 1200-2 may receive a signal, received through the second pad P2-2, as the end input signal ZQE_I, and the calibration circuit 1220-2 of the second semiconductor chip 1200-2 may perform a calibration operation by being coupled to the external reference resistor RZQ through a resistance pad ZQ based on the end input signal ZQE_I. When the calibration circuit 1220-2 completes the calibration operation, the calibration circuit 1220-2 may generate the end output signal ZQE_O, and the end output signal ZQE_O may be transmitted to the first pad P1-1 of the first semiconductor chip 1200-1 through the second pad P2-2. The first semiconductor chip 1200-1 may receive a signal, received through the first pad P1-1, as the end input signal ZQE_I. The calibration circuit 1220-1 of the first semiconductor chip 1200-1 may end a calibration operation of the semiconductor apparatus 1400 based on the end input signal ZQE_I.

Figure 15:
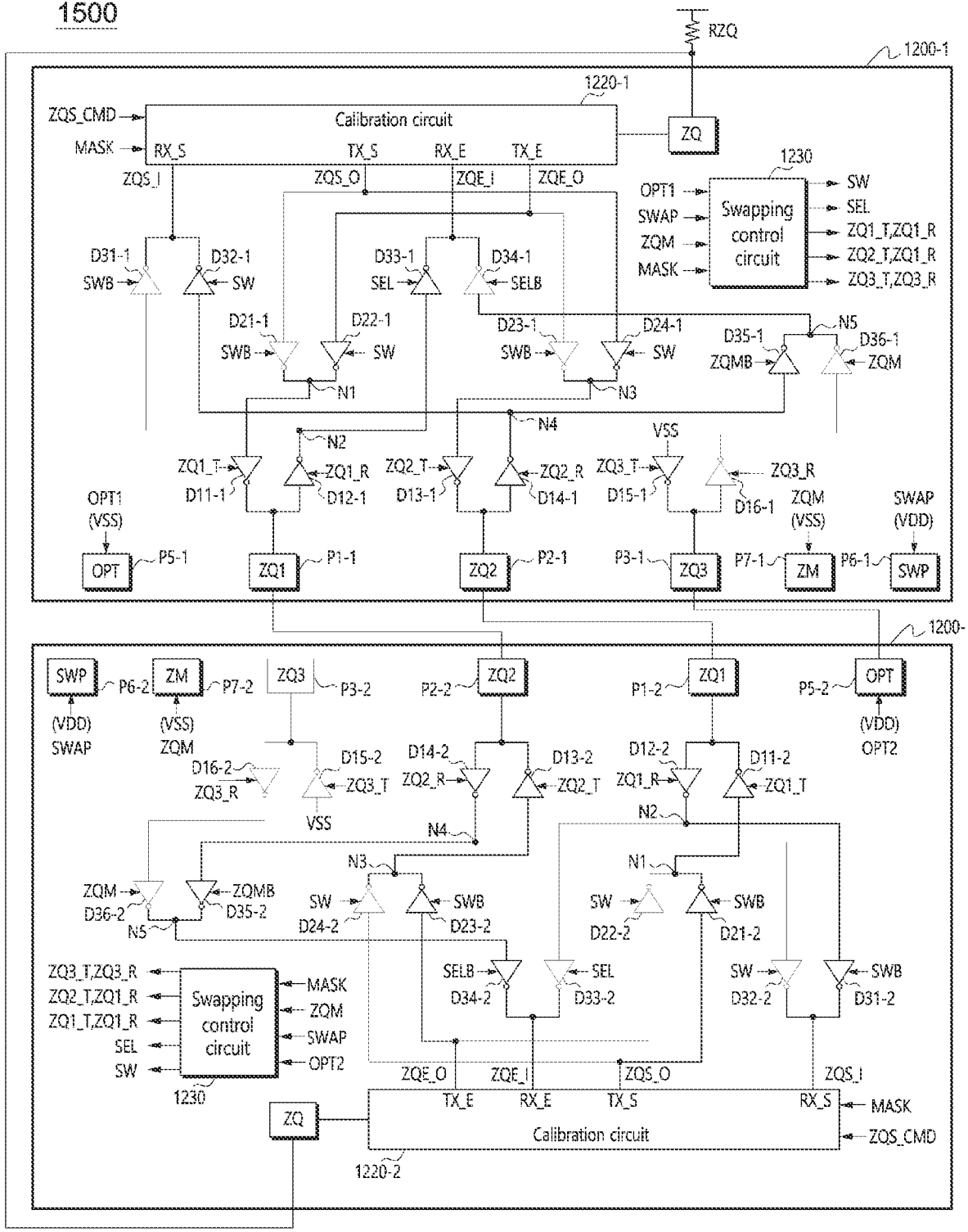
FIG. 15 is a diagram illustrating the configuration and coupling relationship of a semiconductor apparatus including two semiconductor chips which operate in a swapping mode.

FIG. 15 is a diagram illustrating the configuration and coupling relationship of a semiconductor apparatus 1500 including two semiconductor chips that operate in a swapping mode. FIG. 15 has the same configuration as FIG. 14, and description of the coupling relationships of the same components will be omitted. In FIG. 14, the third pad P3-1 of the first semiconductor chip 1200-1 does not have any coupling. However, the third pad P3-1 of the first semiconductor chip 1200-1 of the semiconductor apparatus 1500 may be coupled to the fourth pad P5-2 of the second semiconductor chip 1200-2. The fifth driver D15-1 of the pad selection circuit that is coupled to the third pad P3-1 of the first semiconductor chip 1200-1 may receive the third transmission control signal ZQ3_T. When the mode signal ZQM is disabled to a low logic level, because the third transmission control signal ZQ3_T is enabled to a high logic level, the fifth driver D15-1 may be activated. The fifth driver D15-1 may invert a first power supply voltage, and thereby, may transmit an inverted power supply voltage (i.e., a second power supply voltage) to the fourth pad P5-2 of the second semiconductor chip 1200-2 through the third pad P3-1. Instead that the fourth pad P5-2 of the second semiconductor chip 1200-2 is wire-bonded to a terminal to which the second power supply voltage is supplied, the fourth pad P5-2 of the second semiconductor chip 1200-2 may receive a signal, transmitted through the third pad P3-1 of the first semiconductor chip 1200-1, as the second chip master information OPT2.

Figure 16:
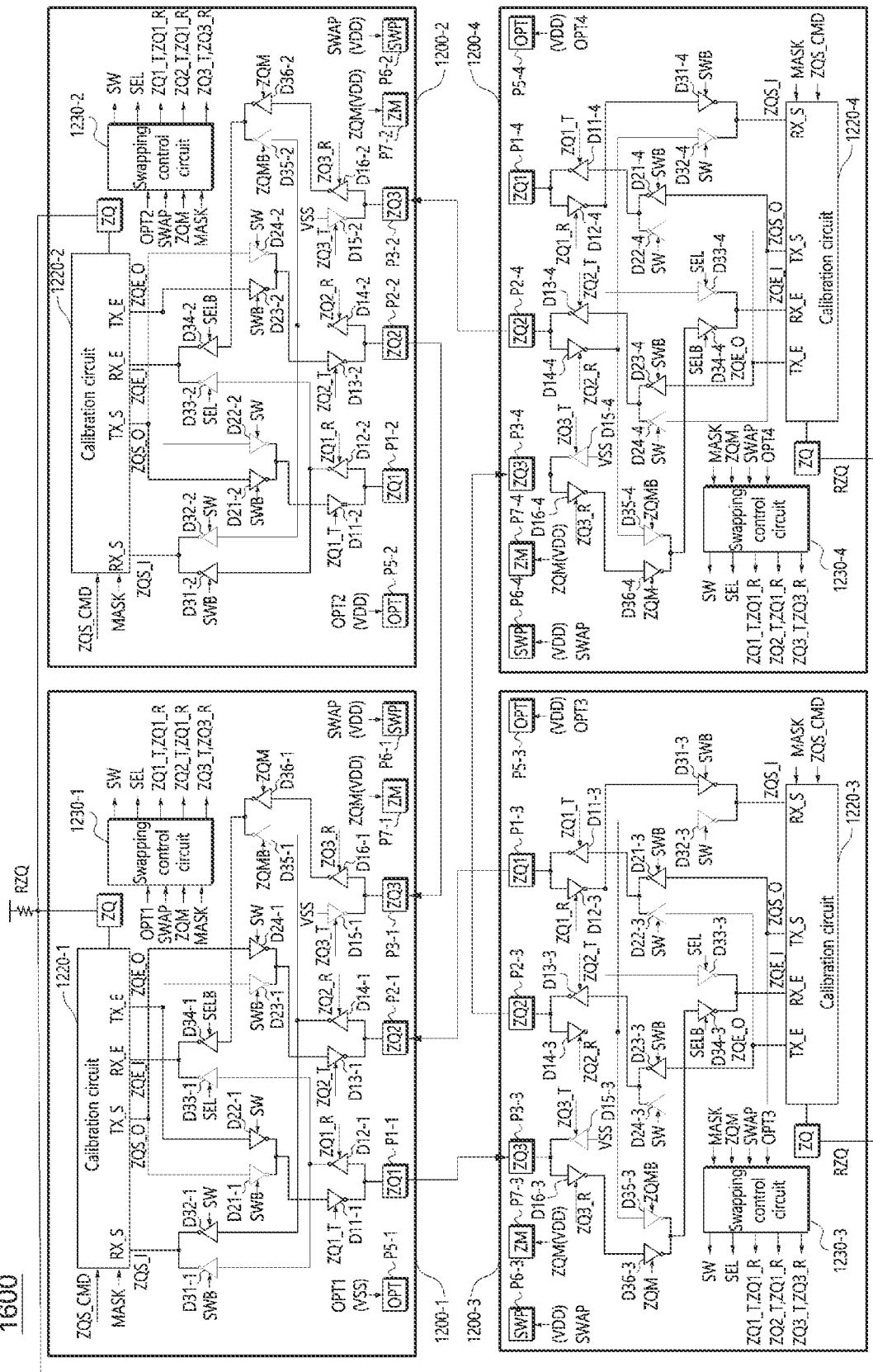
FIG. 16 is a diagram illustrating the configuration and coupling relationship of a semiconductor apparatus including four semiconductor chips which operate in a swapping mode.

FIG. 16 is a diagram illustrating the configuration and coupling relationship of a semiconductor apparatus 1600 including four semiconductor chips that operate in a swapping mode. Referring to FIG. 16, the semiconductor apparatus 1600 may include a first semiconductor chip 1200-1, a second semiconductor chip 1200-2, a third semiconductor chip 1200-3, and a fourth semiconductor chip 1200-4. The semiconductor circuit 1200 illustrated in FIG. 12 may be applied as each of the first to fourth semiconductor chips 1200-1, 1200-2, 1200-3, and 1200-4. The first semiconductor chip 1200-1 may function as a master chip, and the second to fourth semiconductor chips 1200-2, 1200-3, and 1200-4 may function as slave chips. The first and second semiconductor chips 1200-1 and 1200-2 may configure a first channel and receive in common a first command signal, and the third and fourth semiconductor chips 1200-3 and 1200-4 may configure a second channel and receive in common a second command signal. The third semiconductor chip 1200-3 may function as a master chip of the second channel.

A first pad (ZQ1) P1-1 of the first semiconductor chip 1200-1 may be coupled to a third pad (ZQ3) P3-3 of the third semiconductor chip 1200-3, a second pad (ZQ2) P2-1 of the first semiconductor chip 1200-1 may be coupled to a first pad (ZQ1) P1-3 of the third semiconductor chip 1200-3, and a third pad (ZQ3) P3-1 of the first semiconductor chip 1200-1 may be coupled to a second pad (ZQ2) P2-2 of the second semiconductor chip 1200-2. A third pad (ZQ3) P3-2 of the second semiconductor chip 1200-2 may be coupled to a second pad (ZQ2) P2-4 of the fourth semiconductor chip 1200-4. A second pad (ZQ2) P2-3 of the third semiconductor chip 1200-3 may be coupled to a third pad (ZQ3) P3-4 of the fourth semiconductor chip 1200-4. First pads (ZQ1) P1-2 and P1-4 of the second and fourth semiconductor chips 1200-2 and 1200-4 might not have any coupling.

A fourth pad (OPT) P5-1 of the first semiconductor chip 1200-1 may receive first chip master information OPT1, a fifth pad (SWP) P6-1 may receive swapping information SWAP, and a sixth pad (ZM) P7-1 may receive a mode signal ZQM. A fourth pad (OPT) P5-2 of the second semiconductor chip 1200-2 may receive second chip master information OPT2, a fifth pad (SWP) P6-2 may receive the swapping information SWAP, and a sixth pad (ZM) P7-2 may receive the mode signal ZQM. A fourth pad (OPT) P5-3 of the third semiconductor chip 1200-3 may receive third chip master information OPT3, a fifth pad (SWP) P6-3 may receive the swapping information SWAP, and a sixth pad (ZM) P7-3 may receive the mode signal ZQM. A fourth pad (OPT) P5-4 of the fourth semiconductor chip 1200-4 may receive fourth chip master information OPT4, a fifth pad (SWP) P6-4 may receive the swapping information SWAP, and a sixth pad (ZM) P7-4 may receive the mode signal ZQM.

The first chip master information OPT1 may be a low logic level, the swapping information SWAP may be a high logic level, and the mode signal ZQM may be a high logic level. Accordingly, a swapping control circuit 1230-1 may enable the swapping control signal SW to a high logic level, disable the selection control signal SEL to a low logic level, disable the first mode swapping control signal MSW1 to a low logic level, and enable the second mode swapping control signal MSW2 to a high logic level. The first reception control signal ZQ1_R may have a logic level corresponding to the logic level of the mask signal MASK, but the first transmission control signal ZQ1_T may be enabled to a high logic level. The pre-reception control signal ZQ2_RP may be enabled to a high logic level according to the first chip master information OPT1, the second transmission control signal ZQ2_T may be disabled to a low logic level, and the second reception control signal ZQ2_R may be enabled to a high logic level. The third transmission control signal ZQ3_T may be disabled to a low logic level, and the third reception control signal ZQ3_R may be enabled to a high logic level.

In the first semiconductor chip 1200-1, a first driver D11-1 of a pad selection circuit that is coupled to the first pad P1-1 may be activated, and a second driver D12-1 may be selectively activated according to the logic level of the mask signal MASK. A third driver D13-1 of the pad selection circuit that is coupled to the second pad P2-1 may be deactivated, and a fourth driver D14-1 may be activated. A fifth driver D15-1 of the pad selection circuit that is coupled to the third pad P3-1 may be deactivated, and a sixth driver D16-1 may be activated. A first driver D21-1 of a transmission selection circuit may be deactivated, a second driver D22-1 may be activated, a third driver D23-1 may be deactivated, and a fourth driver D24-1 may be activated. A first driver D31-1 of a reception selection circuit may be deactivated, a second driver D32-1 may be activated, a third driver D33-1 may be deactivated, a fourth driver D34-1 may be activated, a fifth driver D35-1 may be deactivated, and a sixth driver D36-1 may be activated. Accordingly, the first semiconductor chip 1200-1 may transmit the end output signal ZQE_O through the first pad P1-1 and may receive a signal, received through the second pad P2-1, as the start input signal ZQS_I. Also, the first semiconductor chip 1200-1 may receive a signal, received through the third pad P3-1, as the end input signal ZQE_I.

The second chip master information OPT2 may be a high logic level, the swapping information SWAP may be a high logic level, and the mode signal ZQM may be a high logic level. Accordingly, a swapping control circuit 1230-2 may disable the swapping control signal SW to a low logic level, disable the selection control signal SEL to a low logic level, enable the first mode swapping control signal MSW1 to a high logic level, and disable the second mode swapping control signal MSW2 to a low logic level. The first reception control signal ZQ1_R may be disabled to a low logic level according to the second chip master information OPT2, and the first transmission control signal ZQ1_T may be enabled to a high logic level. The pre-reception control signal ZQ2_RP may have a logic level corresponding to the logic level of the mask signal MASK, but the second transmission control signal ZQ2_T may be enabled to a high logic level and the second reception control signal ZQ2_R may be disabled to a low logic level.

In the second semiconductor chip 1200-2, a first driver D11-2 of a pad selection circuit that is coupled to the first pad P1-2 may be activated, and a second driver D12-2 may be deactivated. A third driver D13-2 of the pad selection circuit that is coupled to the second pad P2-2 may be activated, and a fourth driver D14-2 may be deactivated. A fifth driver D15-2 of the pad selection circuit that is coupled to the third pad P3-2 may be deactivated, and a sixth driver D16-2 may be activated. A first driver D21-2 of a transmission selection circuit may be activated, a second driver D22-2 may be deactivated, a third driver D23-2 may be activated, and a fourth driver D24-2 may be deactivated. A first driver D31-2 of a reception selection circuit may be activated, a second driver D32-2 may be deactivated, a third driver D33-2 may be deactivated, a fourth driver D34-2 may be activated, a fifth driver D35-2 may be deactivated, and a sixth driver D36-2 may be activated. Accordingly, the second semiconductor chip 1200-2 may transmit the end output signal ZQE_O through the second pad P2-2 and may receive a signal, received through the third pad P3-2, as the end input signal ZQE_I.

The third chip master information OPT3 may be a high logic level, the swapping information SWAP may be a high logic level, and the mode signal ZQM may be a high logic level. Accordingly, a swapping control circuit 1230-3 may disable the swapping control signal SW to a low logic level, disable the selection control signal SEL to a low logic level, enable the first mode swapping control signal MSW1 to a high logic level, and disable the second mode swapping control signal MSW2 to a low logic level. The first reception control signal ZQ1_R may be disabled to a low logic level according to the third chip master information OPT3, and the first transmission control signal ZQ1_T may be enabled to a high logic level. The pre-reception control signal ZQ2_RP may have a logic level corresponding to the logic level of the mask signal MASK, but the second transmission control signal ZQ2_T may be enabled to a high logic level and the second reception control signal ZQ2_R may be disabled to a low logic level.

In the third semiconductor chip 1200-3, a first driver D11-3 of a pad selection circuit that is coupled to the first pad P1-3 may be activated, and a second driver D12-3 may be deactivated. A third driver D13-3 of the pad selection circuit that is coupled to the second pad P2-3 may be activated, and a fourth driver D14-3 may be deactivated. A fifth driver D15-3 of the pad selection circuit that is coupled to the third pad P3-3 may be deactivated, and a sixth driver D16-3 may be activated. A first driver D21-3 of a transmission selection circuit may be activated, a second driver D22-3 may be deactivated, a third driver D23-3 may be activated, and a fourth driver D24-3 may be deactivated. A first driver D31-3 of a reception selection circuit may be activated, a second driver D32-3 may be deactivated, a third driver D33-3 may be deactivated, a fourth driver D34-3 may be activated, a fifth driver D35-3 may be deactivated, and a sixth driver D36-3 may be activated. Accordingly, the third semiconductor chip 1200-3 may transmit the end output signal ZQE_O through the second pad P2-3 and may receive a signal, received through the third pad P3-3, as the end input signal ZQE_I. Also, the third semiconductor chip 1200-3 may transmit the start output signal ZQS_O through the first pad P1-3.

The fourth chip master information OPT4 may be a high logic level, the swapping information SWAP may be a high logic level, and the mode signal ZQM may be a high logic level. Accordingly, a swapping control circuit 1230-4 may disable the swapping control signal SW to a low logic level, disable the selection control signal SEL to a low logic level, enable the first mode swapping control signal MSW1 to a high logic level, and disable the second mode swapping control signal MSW2 to a low logic level. The first reception control signal ZQ1_R may be disabled to a low logic level according to the fourth chip master information OPT4, and the first transmission control signal ZQ1_T may be enabled to a high logic level. The pre-reception control signal ZQ2_RP may have a logic level corresponding to the logic level of the mask signal MASK, but the second transmission control signal ZQ2_T may be enabled to a high logic level and the second reception control signal ZQ2_R may be disabled to a low logic level.

In the fourth semiconductor chip 1200-4, a first driver D11-4 of a pad selection circuit that is coupled to the first pad P1-4 may be activated, and a second driver D12-4 may be deactivated. A third driver D13-4 of the pad selection circuit that is coupled to the second pad P2-4 may be activated, and a fourth driver D14-4 may be deactivated. A fifth driver D15-4 of the pad selection circuit that is coupled to the third pad P3-4 may be deactivated, and a sixth driver D16-4 may be activated. A first driver D21-4 of a transmission selection circuit may be activated, a second driver D22-4 may be deactivated, a third driver D23-4 may be activated, and a fourth driver D24-4 may be deactivated. A first driver D31-4 of a reception selection circuit may be activated, a second driver D32-4 may be deactivated, a third driver D33-4 may be deactivated, a fourth driver D34-4 may be activated, a fifth driver D35-4 may be deactivated, and a sixth driver D36-4 may be activated. Accordingly, the fourth semiconductor chip 1200-4 may transmit the end output signal ZQE_O through the second pad P2-4 and may receive a signal, received through the third pad P3-4, as the end input signal ZQE_I.

When the first semiconductor chip 1200-1 receives the calibration command signal ZQS_CMD based on the first command signal CMD1, a calibration circuit 1220-1 of the first semiconductor chip 1200-1 may start a calibration operation by being coupled to an external reference resistor RZQ through a resistance pad ZQ based on the calibration command signal ZQS_CMD. If the third semiconductor chip 1200-3 receives the calibration command signal ZQS_CMD based on the second command signal CMD2, a calibration circuit 1220-3 of the third semiconductor chip 1200-3 may generate the start output signal ZQS_O, and the start output signal ZQS_O may be transmitted to the second pad P2-1 of the first semiconductor chip 1200-1 through the first pad P1-3. The first semiconductor chip 1200-1 may receive a signal, received through the second pad P2-1, as the start input signal ZQS_I, and the calibration circuit 1220-1 may start the calibration operation based on the start input signal ZQS_I.

When the calibration circuit 1220-1 of the first semiconductor chip 1200-1 completes the calibration operation, the calibration circuit 1220-1 may generate the end output signal ZQE_O, and the end output signal ZQE_O may be transmitted to the third pad P3-3 of the third semiconductor chip 1200-3 through the first pad P1-1. The third semiconductor chip 1200-3 may receive a signal, received through the third pad P3-3, as the end input signal ZQE_I, and the calibration circuit 1220-3 of the third semiconductor chip 1200-3 may perform a calibration operation by being coupled to the external reference resistor RZQ through a resistance pad ZQ based on the end input signal ZQE_I. When the calibration circuit 1220-3 completes the calibration operation, the calibration circuit 1220-3 may generate the end output signal ZQE_O, and the end output signal ZQE_O may be transmitted to the third pad P3-4 of the fourth semiconductor chip 1200-4 through the second pad P2-3. The fourth semiconductor chip 1200-4 may receive a signal, received through the third pad P3-4, as the end input signal ZQE_I, and a calibration circuit 1220-4 of the fourth semiconductor chip 1200-4 may perform a calibration operation by being coupled to the external reference resistor RZQ through a resistance pad ZQ based on the end input signal ZQE_I. When the calibration circuit 1220-4 completes the calibration operation, the calibration circuit 1220-4 may generate the end output signal ZQE_O, and the end output signal ZQE_O may be transmitted to the third pad P3-2 of the second semiconductor chip 1200-2 through the second pad P2-4. The second semiconductor chip 1200-2 may receive a signal, received through the third pad P3-2, as the end input signal ZQE_I, and a calibration circuit 1220-2 of the third semiconductor chip 1200-2 may perform a calibration operation by being coupled to the external reference resistor RZQ through a resistance pad ZQ based on the end input signal ZQE_I. When the calibration circuit 1220-2 completes the calibration operation, the calibration circuit 1220-2 may generate the end output signal ZQE_O, and the end output signal ZQE_O may be transmitted to the third pad P3-1 of the first semiconductor chip 1200-1 through the second pad P2-2. The first semiconductor chip 1200-1 may receive a signal, received through the third pad P3-1, as the end input signal ZQE_I. The calibration circuit 1220-1 of the first semiconductor chip 1200-1 may end a calibration operation of the semiconductor apparatus 1600 based on the end input signal ZQE_I.

Figure 17:
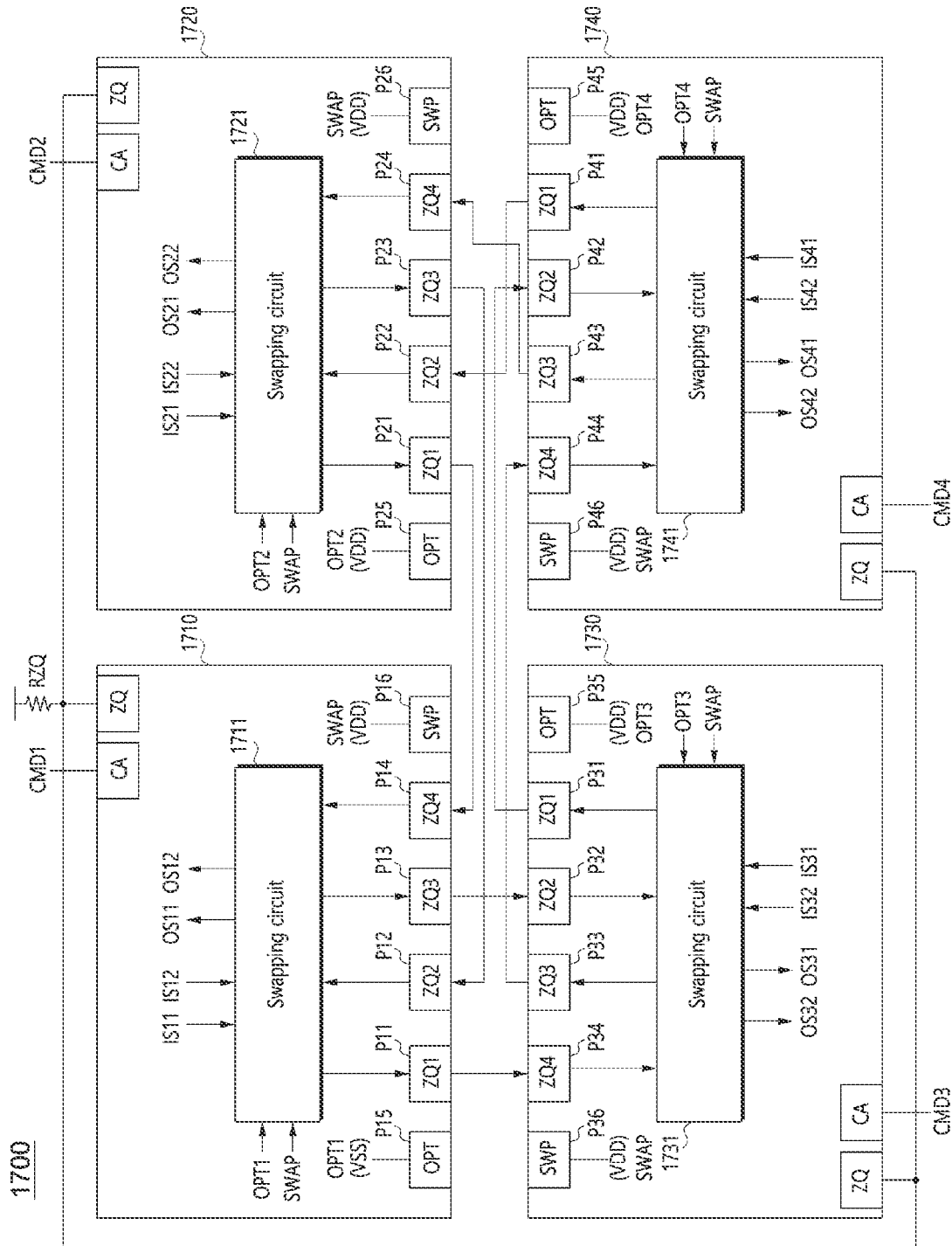
FIG. 17 is a diagram illustrating the configuration of a semiconductor apparatus in accordance with an embodiment of the present disclosure.

FIG. 17 is a diagram illustrating the configuration of a semiconductor apparatus 1700 in accordance with an embodiment of the present disclosure. Referring to FIG. 17, the semiconductor apparatus 1700 may include a first semiconductor chip 1710, a second semiconductor chip 1720, a third semiconductor chip 1730, and a fourth semiconductor chip 1740. The first to fourth semiconductor chips 1710, 1720, 1730, and 1740 may have the same structure to be capable of performing the same function. The first to fourth semiconductor chips 1710, 1720, 1730, and 1740 may configure a single semiconductor apparatus and may be packaged as one package. The first to fourth semiconductor chips 1710, 1720, 1730, and 1740 may be mounted on a substrate (not illustrated) and may be disposed at predetermined locations depending on the structure of the substrate. The second semiconductor chip 1720 may be disposed side by side with the first semiconductor chip 1710. The third semiconductor chip 1730 may be disposed to face the first semiconductor chip 1710 by being rotated 180 degrees with respect to the first second semiconductor chip 1710. The fourth semiconductor chip 1740 may be disposed to face the second semiconductor chip 1720 by being rotated 180 degrees with respect to the second semiconductor chip 1720. The first to fourth semiconductor chips 1710, 1720, 1730, and 1740 may include first pads (ZQ1) P11, P21, P31, and P41, second pads (ZQ2) P12, P22, P32, and P42, third pads (ZQ3) P13, P23, P33, and P43 and fourth pads (ZQ4) P14, P24, P34, and P44, respectively. Because the third semiconductor chip 1730 is rotated 180 degrees with respect to the first semiconductor chip 1710 and is disposed to face the first semiconductor chip 1710, the first pad P11, the second pad P12, the third pad P13 and the fourth pad P14 of the first semiconductor chip 1710 may sequentially face the fourth pad P34, the third pad P33, the second pad P32 and the first pad P31 of the third semiconductor chip 1730. Because the fourth semiconductor chip 1740 is rotated 180 degrees with respect to the second semiconductor chip 1720 and is disposed to face the second semiconductor chip 1720, the first pad P21, the second pad P22, the third pad P23 and the fourth pad P24 of the second semiconductor chip 1720 may sequentially face the fourth pad P44, the third pad P43, the second pad P42 and the first pad P41 of the fourth semiconductor chip 1740.

The first pad P11 of the first semiconductor chip 1710 may be coupled to the fourth pad P34 of the third semiconductor chip 1730. The second pad P12 of the first semiconductor chip 1710 may be coupled to the third pad P23 of the second semiconductor chip 1720. The third pad P13 of the first semiconductor chip 1710 may be coupled to the second pad P32 of the third semiconductor chip 1730. The fourth pad P14 of the first semiconductor chip 1710 may be coupled to the first pad P21 of the second semiconductor chip 1720. The second pad P22 of the second semiconductor chip 1720 may be coupled to the first pad P41 of the fourth semiconductor chip 1740. The fourth pad P24 of the second semiconductor chip 1720 may be coupled to the third pad P43 of the fourth semiconductor chip 1740. The first pad P31 of the third semiconductor chip 1730 may be coupled to the second pad P42 of the fourth semiconductor chip 1740. The third pad P33 of the third semiconductor chip 1730 may be coupled to the fourth pad P44 of the fourth semiconductor chip 1740.

The semiconductor apparatus 1700 may operate as four independent channels. The first semiconductor chip 1710 may configure a first channel and may receive a first command signal CMD1. The second semiconductor chip 1720 may configure a second channel and may receive a second command signal CMD2. The third semiconductor chip 1730 may configure a third channel and may receive a third command signal CMD3. The fourth semiconductor chip 1740 may configure a fourth channel and may receive a fourth command signal CMD4. For example, in relationship with an external apparatus that is coupled to the semiconductor apparatus 1700, the first to fourth semiconductor chips 1710, 1720, 1730, and 1740 may function as four independent chips operating as ×16. The first semiconductor chip 1710 may function as a master chip of the semiconductor apparatus 1700, and the second to fourth semiconductor chips 1720, 1730, and 1740 may serve as slave chips of the semiconductor apparatus 1700. Between the semiconductor apparatus 1700 and the external apparatus that is coupled to the semiconductor apparatus 1700 and communicates with the semiconductor apparatus 1700, it may be prescribed that the first semiconductor chip 1700 is a master chip.

The first semiconductor chip 1710 may include a first chip swapping circuit 1711, the second semiconductor chip 1720 may include a second chip swapping circuit 1721, the third semiconductor chip 1730 may include a third chip swapping circuit 1731, and the fourth semiconductor chip 1740 may include a fourth chip swapping circuit 1741. The first chip swapping circuit 1711 may couple the first to fourth pads P11, P12, P13, and P14 to signal paths of the first semiconductor chip 1710 based on master information OPT1 of the first semiconductor chip 1710 and swapping information SWAP. The master information OPT1 of the first semiconductor chip 1710 may be referred to as first chip master information. The second chip swapping circuit 1721 may couple the first to fourth pads P21, P22, P23, and P24 to signal paths of the second semiconductor chip 1720 based on master information OPT2 of the second semiconductor chip 1720 and the swapping information SWAP. The master information OPT2 of the second semiconductor chip 1720 may be referred to as second chip master information. The third chip swapping circuit 1731 may couple the first to fourth pads P31, P32, P33, and P34 to signal paths of the third semiconductor chip 1730 based on master information OPT3 of the third semiconductor chip 1730 and the swapping information SWAP. The master information OPT3 of the third semiconductor chip 1730 may be referred to as third chip master information. The fourth chip swapping circuit 1741 may couple the first to fourth pads P41, P42, P43, and P44 to signal paths of the fourth semiconductor chip 1740 based on master information OPT4 of the fourth semiconductor chip 1740 and the swapping information SWAP. The master information OPT4 of the fourth semiconductor chip 1740 may be referred to as fourth chip master information.

The first to fourth semiconductor chips 1710, 1720, 1730, and 1740 may transmit and receive signals to and from one another. The first semiconductor chip 1710 may transmit a first internal signal IS11 to the third semiconductor chip 1730 through the first pad P11. The first semiconductor chip 1710 may receive a first external signal OS11 from the second semiconductor chip 1720 through the second pad P12. The first semiconductor chip 1710 may transmit a second internal signal IS12 to the third semiconductor chip 1730 through the third pad P13. The first semiconductor chip 1710 may receive a second external signal OS12 from the second semiconductor chip 1720 through the fourth pad P14. The second semiconductor chip 1720 may transmit a second internal signal IS22 to the first semiconductor chip 1710 through the first pad P21. The second semiconductor chip 1720 may receive a second external signal OS22 from the fourth semiconductor chip 1740 through the second pad P22. The second semiconductor chip 1720 may transmit a first internal signal IS21 to the first semiconductor chip 1710 through the third pad P23. The second semiconductor chip 1720 may receive a first external signal OS21 from the fourth semiconductor chip 1740 through the fourth pad P24. The third semiconductor chip 1730 may transmit a second internal signal IS32 to the fourth semiconductor chip 1740 through the first pad P31. The third semiconductor chip 1730 may receive a second external signal OS32 from the first semiconductor chip 1710 through the second pad P32. The third semiconductor chip 1730 may transmit a first internal signal IS31 to the fourth semiconductor chip 1740 through the third pad P33. The third semiconductor chip 1730 may receive a first external signal OS31 from the first semiconductor chip 1710 through the fourth pad P34. The fourth semiconductor chip 1740 may transmit a second internal signal IS42 to the second semiconductor chip 1720 through the first pad P41. The fourth semiconductor chip 1740 may receive a second external signal OS42 from the third semiconductor chip 1730 through the second pad P42. The fourth semiconductor chip 1740 may transmit a first internal signal IS41 to the second semiconductor chip 1720 through the third pad P43. The fourth semiconductor chip 1740 may receive a first external signal OS41 from the third semiconductor chip 1730 through the fourth pad P44.

Based on the first chip master information OPT1 and the swapping information SWAP, the first chip swapping circuit 1711 may provide a path through which the first internal signal IS11 is output, to the first pad P11, and may provide a path through which the first external signal OS11 is received, to the second pad P12. The first chip swapping circuit 1711 may provide a path through which the second internal signal IS12 is output, to the third pad P13, and may provide a path through which the second external signal OS12 is received, to the fourth pad P14. Based on the second chip master information OPT2 and the swapping information SWAP, the second chip swapping circuit 1721 may provide a path through which the second internal signal IS22 is output, to the first pad P21, and may provide a path through which the second external signal OS22 is received, to the second pad P22. The second chip swapping circuit 1721 may provide a path through which the first internal signal IS21 is output, to the third pad P23, and may provide a path through which the first external signal OS21 is received, to the fourth pad P24. Based on the third chip master information OPT3 and the swapping information SWAP, the third chip swapping circuit 1731 may provide a path through which the second internal signal IS32 is output, to the first pad P31, and may provide a path through which the second external signal OS32 is received, to the second pad P32. The third chip swapping circuit 1731 may provide a path through which the first internal signal IS31 is output, to the third pad P33, and may provide a path through which the first external signal OS31 is received, to the fourth pad P34. Based on the fourth chip master information OPT4 and the swapping information SWAP, the fourth chip swapping circuit 1741 may provide a path through which the second internal signal IS42 is output, to the first pad P41, and may provide a path through which the second external signal OS42 is received, to the second pad P42. The fourth chip swapping circuit 1741 may provide a path through which the first internal signal IS41 is output, to the third pad P43, and may provide a path through which the first external signal OS41 is received, to the fourth pad P44.

The first to fourth semiconductor chips 1710, 1720, 1730, and 1740 may include fifth pads (OPT) P15, P25, P35, and P45 and sixth pads (SWP) P16, P26, P36, and P46, respectively. The fifth pad P15 of the first semiconductor chip 1710 may receive the first chip master information OPT1. The fifth pad P15 may receive a first power supply voltage with a voltage level that is determined as a first logic level. The fifth pad P15 may be wire-bonded to a terminal of a ground voltage VSS. The sixth pad P16 of the first semiconductor chip 1710 may receive the swapping information SWAP. In order for the semiconductor apparatus 1700 to operate in a swapping mode, the sixth pad P16 may receive a second power supply voltage with a voltage level that is determined as a second logic level. The sixth pad P16 may be wire-bonded to a terminal to which an operating power supply voltage VDD is supplied. The fifth pad P25 of the second semiconductor chip 1720 may receive the second chip master information OPT2. The fifth pad P25 may receive the second power supply voltage. The fifth pad P25 may be wire-bonded to a terminal to which the operating power supply voltage VDD is supplied. The sixth pad P26 of the second semiconductor chip 1720 may receive the swapping information SWAP. The sixth pad P26 may receive the second power supply voltage and may be wire-bonded to a terminal to which the operating power supply voltage VDD is supplied. The fifth pad P35 of the third semiconductor chip 1730 may receive the third chip master information OPT3. The fifth pad P35 may receive the second power supply voltage. The fifth pad P35 may be wire-bonded to a terminal to which the operating power supply voltage VDD is supplied. The sixth pad P36 of the third semiconductor chip 1730 may receive the swapping information SWAP. The sixth pad P36 may receive the second power supply voltage and may be wire-bonded to a terminal to which the operating power supply voltage VDD is supplied. The fifth pad P45 of the fourth semiconductor chip 1740 may receive the fourth chip master information OPT4. The fifth pad P45 may receive the second power supply voltage. The fifth pad P45 may be wire-bonded to a terminal to which the operating power supply voltage VDD is supplied. The sixth pad P46 of the fourth semiconductor chip 1740 may receive the swapping information SWAP. The sixth pad P46 may receive the second power supply voltage and may be wire-bonded to a terminal to which the operating power supply voltage VDD is supplied.

Each of the first to fourth semiconductor chips 1710, 1720, 1730, and 1740 may include a resistance pad ZQ. The first semiconductor chip 1710 may be coupled to an external reference resistor RZQ through the resistance pad ZQ. The second semiconductor chip 1720 may be coupled to the external reference resistor RZQ through the resistance pad ZQ. The third semiconductor chip 1730 may be coupled to the external reference resistor RZQ through the resistance pad ZQ. The fourth semiconductor chip 1740 may be coupled to the external reference resistor RZQ through the resistance pad ZQ. The semiconductor apparatus 1700 may include only one external reference resistor RZQ, and the first to fourth second semiconductor chips 1710, 1720, 1730, and 1740 may be coupled in common to the one external reference resistor RZQ through the resistance pads ZQ. The first internal signals IS11, IS21, IS31, and IS41 and the first external signals OS11, OS21, OS31, and OS41 of the first to fourth semiconductor chips 1710, 1720, 1730, and 1740 may be end signals, respectively. The second internal signals IS12, IS22, IS32, and IS42 and the second external signals OS12, OS22, OS32, and OS42 of the first to fourth semiconductor chips 1710, 1720, 1730, and 1740 may be end signals, respectively. The end signals and the start signals may be signals that control the first to fourth semiconductor chips 1710, 1720, 1730, and 1740 sharing the one external reference resistor RZQ such that the first to fourth second semiconductor chips 1710, 1720, 1730, and 1740 sequentially perform calibration operations.

Figure 18:
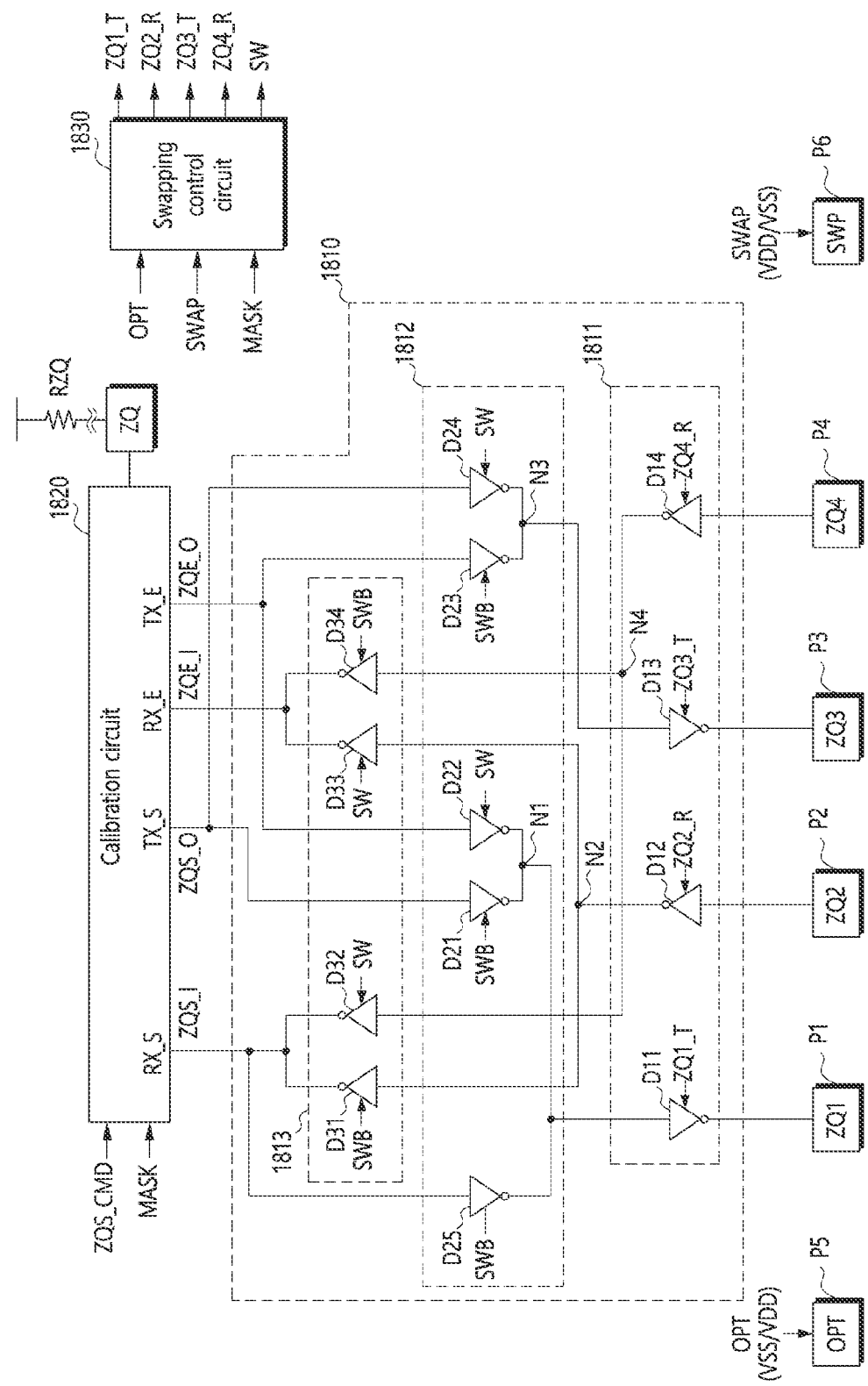
FIG. 18 is a diagram illustrating the configuration of a semiconductor circuit in accordance with an embodiment of the present disclosure.

FIG. 18 is a diagram illustrating the configuration of a semiconductor circuit 1800 in accordance with an embodiment of the present disclosure. The semiconductor circuit 1800 may be applied as each of the semiconductor chips illustrated in FIG. 17. Referring to FIG. 18, the semiconductor circuit 1800 may include a first pad P1, a second pad P2, a third pad P3, a fourth pad P4, a swapping circuit 1810, and an internal circuit 1820. The first pad P1, the second pad P2, the third pad P3, and the fourth pad P4 may be coupled to different semiconductor circuits and/or pads of circuits, respectively. The swapping circuit 1810 may provide one of a path through which a first internal signal is output and a path through which a second internal signal is output, to the first pad P1 based on master information OPT and swapping information SWAP. The swapping circuit 1810 may provide one of a path through which a first external signal is received and a path through which a second external signal is received, to the second pad P2 based on the master information OPT and the swapping information SWAP. The swapping circuit 1810 may provide one of a path through which the first internal signal is output and a path through which the second internal signal is output, to the third pad P3 based on the master information OPT and the swapping information SWAP. The swapping circuit 1810 may provide one of a path through which the first external signal is received and a path through which the second external signal is received, to the fourth pad P4 based on the master information OPT and the swapping information SWAP. The swapping circuit 1810 may output the received second external signal through the first pad P1 based on the master information OPT and the swapping information SWAP.

The internal circuit 1820 may be a calibration circuit for performing a calibration operation of the semiconductor circuit 1800. The calibration circuit 1820 may receive the first external signal and the second external signal and may generate the first internal signal and the second internal signal. The calibration circuit 1820 may generate an end output signal ZQE_O and a start output signal ZQS_O and may receive an end input signal ZQE_I and a start input signal ZQS_I. The end output signal ZQE_O may be the first internal signal, and the start output signal ZQS_O may be the second internal signal. The end input signal ZQE_I may be the first external signal, and the start input signal ZQS_I may be the second external signal. The calibration circuit 1820 may output the end output signal ZQE_O through a first output terminal TX_E and may output the start output signal ZQS_O through a second output terminal TX_S. The calibration circuit 1820 may receive the end input signal ZQE_I through a first input terminal RX_E and may receive the start input signal ZQS_I through a second input terminal RX_S.

Based on the master information OPT and the swapping information SWAP, the swapping circuit 1810 may provide a path through which the end output signal ZQE_O is output, to one of the first pad P1 and the third pad P3, may provide a path through which the end input signal ZQE_I is received, to one of the second pad P2 and the fourth pad P4, may provide a path through which the start output signal ZQS_O is output, to one of the first pad P1 and the third pad P3, and may provide a path through which the start input signal ZQS_I is received, to one of the second pad P2 and the fourth pad P4. Also, the swapping circuit 1810 may selectively output the received start input signal ZQS_I through the first pad P1.

When the semiconductor circuit 1800 functions as a master chip, the calibration circuit 1820 may perform a calibration operation based on the start input signal ZQS_I. When the calibration operation is completed, the calibration circuit 1820 may generate the end output signal ZQE_O. When the semiconductor circuit 1800 functions as a master chip, if the end input signal ZQE_I is received, the calibration circuit 1820 may determine that all calibration operations of the semiconductor circuit 1800 and another semiconductor circuit have been completed. When the semiconductor circuit 1800 functions as a slave chip, the calibration circuit 1820 may perform the calibration operation if the end input signal ZQE_I is received. The calibration circuit 1820 may further receive a calibration command signal ZQS_CMD and a mask signal MASK. The calibration circuit 1820 may generate a calibration enable signal based on the calibration command signal ZQS_CMD, the mask signal MASK and the start input signal ZQS_I. The calibration command signal ZQS_CMD may be a signal that is generated from a command signal, received by the semiconductor circuit 1800, and may be a signal that is enabled to a second logic level when the command signal is a command signal that instructs the calibration operation of the semiconductor circuit 1800. When the mask signal MASK is a first logic level, the calibration circuit 1820 may generate the calibration enable signal based on at least one of the calibration command signal ZQS_CMD and the start input signal ZQS_I and may perform the calibration operation based on the calibration enable signal. When the mask signal MASK is a second logic level, the calibration circuit 1820 may generate the start output signal ZQS_O based on the calibration command signal ZQS_CMD and may generate the calibration enable signal based on the end input signal ZQE_I. The mask signal MASK may be the same as the mask signal MASK, illustrated in FIG. 3, and may be generated by the mask signal generation circuit 450 illustrated in FIG. 5.

The semiconductor circuit 1800 may further include a fifth pad (OPT) P5 and a sixth pad (SWP) P6. The fifth pad P5 may receive the master information OPT. When the semiconductor circuit 1800 functions as a master chip, the fifth pad P5 may receive a first power supply voltage (that is, a ground voltage VSS) with a voltage level that may be determined as a first logic level. When the semiconductor circuit 1800 functions as a slave chip, the fifth pad P5 may receive a second power supply voltage (that is, an operating power supply voltage VDD) with a voltage level that may be determined as a second logic level. The sixth pad P6 may receive the swapping information SWAP. The sixth pad P6 may receive a signal with a different voltage level depending on whether the semiconductor circuit 1800 operates in a swapping mode. When the semiconductor circuit 1800 operates in the swapping mode, the sixth pad P6 may receive the second power supply voltage. When the semiconductor circuit 1800 does not operate in the swapping mode, the sixth pad P6 may receive the first power supply voltage.

The swapping circuit 1810 may include a pad selection circuit 1811, a transmission selection circuit 1812 and a reception selection circuit 1813. The pad selection circuit 1811 may couple a first node N1 to the first pad P1 based on a first transmission control signal ZQ1_T and may output a signal, transmitted through the first node N1, to the first pad P1. The pad selection circuit 1811 may couple a second node N2 to the second pad P2 based on a second reception control signal ZQ2_R and may output a signal, received through the second pad P2, to the second node N2. The pad selection circuit 1811 may couple a third node N3 to the third pad P3 based on a third transmission control signal ZQ3_T and may output a signal, transmitted through the third node N3, to the third pad P3. The pad selection circuit 1811 may couple a fourth node N4 to the fourth pad P4 based on a fourth reception control signal ZQ4_R and may output a signal, received through the fourth pad P4, to the fourth node N4.

The pad selection circuit 1811 may include a first driver D11, a second driver D12, a third driver D13, and a fourth driver D14. The first driver D11 may be coupled between the first node N1 and the first pad P1, may receive the first transmission control signal ZQ1_T, and when the first transmission control signal ZQ1_T is enabled, may output a signal, transmitted through the first node N1, to the first pad P1. The second driver D12 may be coupled between the second pad P2 and the second node N2, may receive the second reception control signal ZQ2_R, and when the second reception control signal ZQ2_R is enabled, may output a signal, received through the second pad P2, to the second node N2. The third driver D13 may be coupled between the third pad P3 and the third node N3, may receive the third transmission control signal ZQ3_T, and when the third transmission control signal ZQ3_T is enabled, may output a signal, transmitted through the third node N3, to the third pad P3. The fourth driver D14 may be coupled between the fourth pad P4 and the fourth node N4, may receive the fourth reception control signal ZQ4_R, and when the fourth reception control signal ZQ4_R is enabled, may output a signal, received through the fourth pad P4, to the fourth node N4.

The transmission selection circuit 1812 may output one of the end output signal ZQE_O and the start output signal ZQS_O to the first node N1 and output the other of the end output signal ZQE_O and the start output signal ZQS_O to the third node N3, based on a swapping control signal SW. The transmission selection circuit 1812 may output the start input signal ZQS_I to the first node N1 based on the swapping control signal SW. When the swapping control signal SW is enabled, the transmission selection circuit 1812 may output the end output signal ZQE_O to the first node N1 and output the start output signal ZQS_O to the third node N3. When the swapping control signal SW is disabled, the transmission selection circuit 1812 may output the end output signal ZQE_O to the third node N3, output the start output signal ZQS_O to the first node N1 and output the start input signal ZQS_I to the first node N1. The transmission selection circuit 1812 may include a first driver D21, a second driver D22, a third driver D23, a fourth driver D24, and a fifth driver D25. The first driver D21 may receive a complementary signal SWB of the swapping control signal SW, and when the complementary signal SWB of the swapping control signal SW is enabled, may output the start output signal ZQS_O to the first node N1. The second driver D22 may receive the swapping control signal SW, and when the swapping control signal SW is enabled, may output the end output signal ZQE_O to the first node N1. The third driver D23 may receive the complementary signal SWB of the swapping control signal SW, and when the complementary signal SWB of the swapping control signal SW is enabled, may output the end output signal ZQE_O to the third node N3. The fourth driver D24 may receive the swapping control signal SW, and when the swapping control signal SW is enabled, may output the start output signal ZQS_O to the third node N3. The fifth driver D25 may receive the complementary signal SWB of the swapping control signal SW, and when the complementary signal SWB of the swapping control signal SW is enabled, may output the start input signal ZQS_I to the first node N1.

The reception selection circuit 1813 may output the end input signal ZQE_I from one of the second and fourth nodes N2 and N4 and output the start input signal ZQS_I from the other of the second and fourth nodes N2 and N4, based on the swapping control signal SW. When the swapping control signal SW is enabled, the reception selection circuit 1813 may output a signal, transmitted from the second node N2, as the end input signal ZQE_I, and may output a signal, transmitted from the fourth node N4, as the start input signal ZQS_I. When the swapping control signal SW is disabled, the reception selection circuit 1813 may output a signal, transmitted from the second node N2, as the start input signal ZQS_I, and may output a signal, transmitted from the fourth node N4, as the end input signal ZQE_I. The reception selection circuit 1813 may include a first driver D31, a second driver D32, a third driver D33, and a fourth driver D34. The first driver D31 may receive the complementary signal SWB of the swapping control signal SW, and when the complementary signal SWB of the swapping control signal SW is enabled, may output a signal, transmitted from the second node N2, as the start input signal ZQS_I. The second driver D32 may receive the swapping control signal SW, and when the swapping control signal SW is enabled, may output a signal, transmitted from the fourth node N4, as the start input signal ZQS_I. The third driver D33 may receive the swapping control signal SW, and when the swapping control signal SW is enabled, may output a signal, transmitted from the second node N2, as the end input signal ZQE_I. The fourth driver D34 may receive the complementary signal SWB of the swapping control signal SW, and when the complementary signal SWB of the swapping control signal SW is enabled, may output a signal, transmitted from the fourth node N4, as the end input signal ZQE_I.

The semiconductor circuit 1800 may further include a swapping control circuit 1830. The swapping control circuit 1830 may generate the first transmission control signal ZQ1_T, the second reception control signal ZQ2_R, the third transmission control signal ZQ3_T, the fourth reception control signal ZQ4_R and the swapping control signal SW, based on the master information OPT and the swapping information SWAP. The swapping control circuit 1830 may further receive the mask signal MASK. The mask signal MASK may be used as a signal that sets logic levels of the first transmission control signal ZQ1_T, the second reception control signal ZQ2_R, the third transmission control signal ZQ3_T and the fourth reception control signal ZQ4_R based on the swapping control signal SW.

Figure 19:
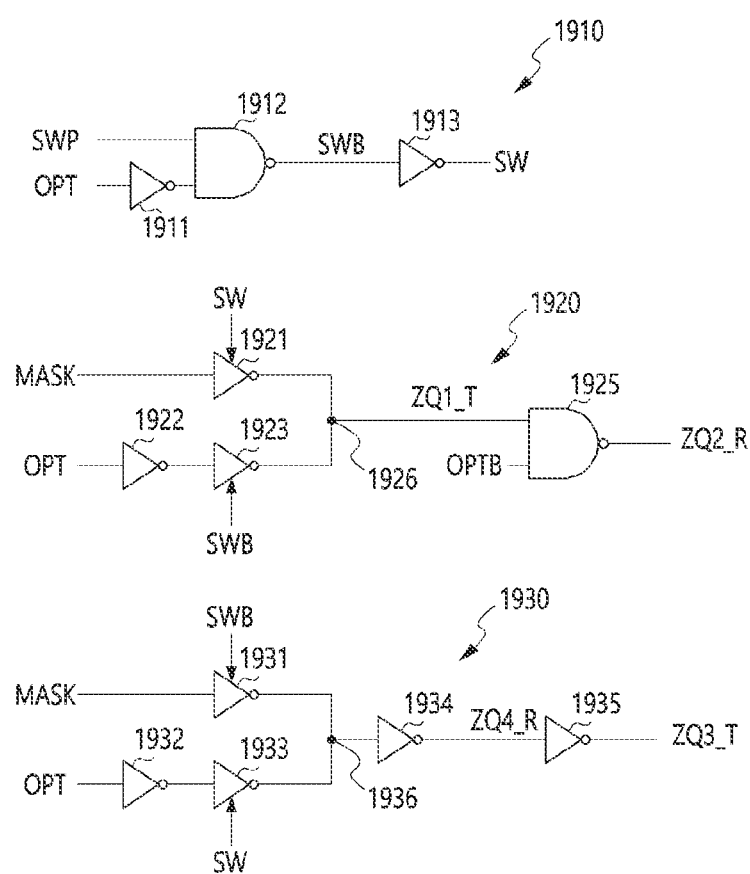
FIG. 19 is a diagram illustrating the configuration of a swapping control circuit illustrated in FIG. 18.

FIG. 19 is a diagram illustrating the configuration of the swapping control circuit 1830 illustrated in FIG. 18. Referring to FIG. 19, the swapping control circuit 1830 may include a swapping control signal generation circuit 1910, a first transmission and reception control signal generation circuit 1920 and a second transmission and reception control signal generation circuit 1930. The swapping control signal generation circuit 1910 may receive the swapping information SWAP and the master information OPT and may generate the swapping control signal SW based on the swapping information SWAP and the master information OPT. When the master information OPT is a first logic level and the swapping information SWAP is a second logic level, the swapping control signal generation circuit 1910 may enable the swapping control signal SW and disable the complementary signal SWB of the swapping control signal SW. When the master information OPT is a second logic level, the swapping control signal generation circuit 1910 may disable the swapping control signal SW and enable the complementary signal SWB of the swapping control signal SW. The swapping control signal generation circuit 1910 may include a first inverter 1911, a NAND gate 1912 and a second inverter 1913. The first inverter 1911 may receive the master information OPT and may invert the master information OPT. The NAND gate 1912 may receive the swapping information SWAP and the output of the first inverter 1911 and may generate the complementary signal SWB of the swapping control signal SW by performing a NAND logic operation on the swapping information SWAP and the output of the first inverter 1911. The second inverter 1913 may receive the complementary signal SWB of the swapping control signal SW and may generate the swapping control signal SW by inverting the complementary signal SWB of the swapping control signal SW.

The first transmission and reception control signal generation circuit 1920 may generate the first transmission control signal ZQ1_T and the second reception control signal ZQ2_R by receiving the mask signal MASK, the master information OPT and the swapping control signal SW. When the swapping control signal SW is enabled, the first transmission and reception control signal generation circuit 1920 may invert the mask signal MASK and thereby output an inverted signal as the first transmission control signal ZQ1_T and may generate the second reception control signal ZQ2_R by gating the first transmission control signal ZQ1_T and the master information OPT. When the swapping control signal SW is disabled (when the complementary signal SWB of the swapping control signal SW is enabled), the first transmission and reception control signal generation circuit 1920 may output the master information OPT as the first transmission control signal ZQ1_T and may generate the second reception control signal ZQ2_R by gating the first transmission control signal ZQ1_T and the master information OPT. The first transmission and reception control signal generation circuit 1920 may include a first inverter 1921, a second inverter 1922, a third inverter 1923, and a NAND gate 1925. When the swapping control signal SW is enabled, the first inverter 1921 may invert the mask signal MASK and may output an inverted signal to a first node 1926. The second inverter 1922 may invert the master information OPT. When the complementary signal SWB of the swapping control signal SW is enabled, the third inverter 1923 may invert the output of the second inverter 1922 and may output an inverted signal to the first node 1926. The first transmission control signal ZQ1_T may be generated through the first node 1926. The NAND gate 1925 may receive the first transmission control signal ZQ1_T and inverted master information OPTB and may generate the second reception control signal ZQ2_R by performing a NAND logic operation on the first transmission control signal ZQ1_T and the inverted master information OPTB.

The second transmission and reception control signal generation circuit 1930 may generate the third transmission control signal ZQ3_T and the fourth reception control signal ZQ4_R by receiving the mask signal MASK, the master information OPT and the swapping control signal SW. When the swapping control signal SW is disabled (when the complementary signal SWB of the swapping control signal SW is enabled), the second transmission and reception control signal generation circuit 1930 may output the mask signal MASK as the fourth reception control signal ZQ4_R and may generate the third transmission control signal ZQ3_T that has an opposite logic level compared to that of the fourth reception control signal ZQ4_R. When the swapping control signal SW is enabled, the second transmission and reception control signal generation circuit 1930 may output the master information OPT as the third transmission control signal ZQ3_T and may generate the fourth reception control signal ZQ4_R that has an opposite logic level compared to that of the third transmission control signal ZQ3_T. The second transmission and reception control signal generation circuit 1930 may include a first inverter 1931, a second inverter 1932, a third inverter 1933, a fourth inverter 1934, and a fifth inverter 1935. When the complementary signal SWB of the swapping control signal SW is enabled, the first inverter 1931 may invert the mask signal MASK and may output an inverted signal to a second node 1936. The second inverter 1932 may invert the master information OPT. When the swapping control signal SW is enabled, the third inverter 1933 may invert the output of the second inverter 1932 and may output an inverted signal to the second node 1936. The fourth inverter 1934 may receive a signal transmitted through the second node 1936 and may generate the fourth reception control signal ZQ4_R by inverting the signal transmitted through the second node 1936. The fifth inverter 1935 may receive the fourth reception control signal ZQ4_R and may generate the third transmission control signal ZQ3_T by inverting the fourth reception control signal ZQ4_R.

Figure 20:
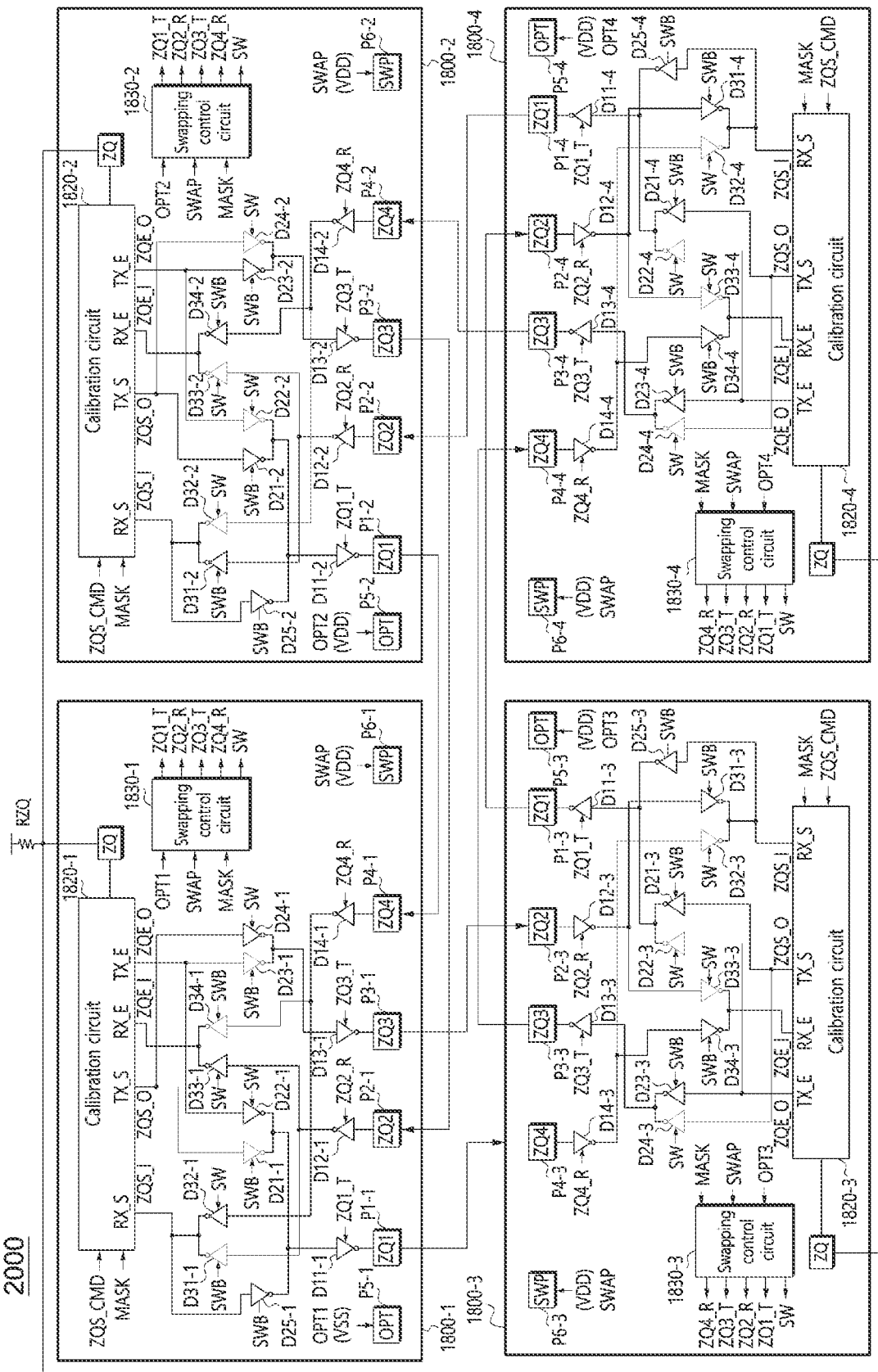
FIG. 20 is a diagram illustrating the configuration and coupling relationship of a semiconductor apparatus including four semiconductor chips which operate in a swapping mode.

FIG. 20 is a diagram illustrating the configuration and coupling relationship of a semiconductor apparatus 2000 including four semiconductor chips that operate in a swapping mode. Referring to FIG. 20, the semiconductor apparatus 2000 may include a first semiconductor chip 1800-1, a second semiconductor chip 1800-2, a third semiconductor chip 1800-3 and a fourth semiconductor chip 1800-4. The semiconductor circuit 1800 illustrated in FIG. 18 may be applied as each of the first to fourth semiconductor chips 1800-1, 1800-2, 1800-3, and 1800-4. The first semiconductor chip 1800-1 may function as a master chip, and the second to fourth semiconductor chips 1800-2, 1800-3 and 1800-4 may function as slave chips. The first semiconductor chip 1800-1 may configure a first channel and receive a first command signal, and the second semiconductor chip 1800-2 may configure a second channel and receive a second command signal. The third semiconductor chip 1800-3 may configure a third channel and receive a third command signal, and the fourth semiconductor chip 1800-4 may configure a fourth channel and receive a fourth command signal.

A first pad P1-1 of the first semiconductor chip 1800-1 may be coupled to a fourth pad P4-3 of the third semiconductor chip 1800-3, a second pad P2-1 of the first semiconductor chip 1800-1 may be coupled to a third pad P3-2 of the second semiconductor chip 1800-2, a third pad P3-1 of the first semiconductor chip 1800-1 may be coupled to a second pad P2-3 of the third semiconductor chip 1800-3, and a fourth pad P4-1 of the first semiconductor chip 1800-1 may be coupled to a first pad P1-2 of the second semiconductor chip 1800-2. A second pad P2-2 of the second semiconductor chip 1800-2 may be coupled to a first pad P1-4 of the fourth semiconductor chip 1800-4, and a fourth pad P4-2 of the second semiconductor chip 1800-2 may be coupled to a third pad P3-4 of the fourth semiconductor chip 1800-4. A first pad P1-3 of the third semiconductor chip 1800-3 may be coupled to a second pad P2-4 of the fourth semiconductor chip 1800-4, and a third pad P3-3 of the third semiconductor chip 1800-3 may be coupled to a fourth pad P4-4 of the fourth semiconductor chip 1800-4.

A fifth pad P5-1 of the first semiconductor chip 1800-1 may receive first chip master information OPT1, and a sixth pad P6-1 may receive swapping information SWAP. A fifth pad P5-2 of the second semiconductor chip 1800-2 may receive second chip master information OPT2, and a sixth pad P6-2 may receive the swapping information SWAP. A fifth pad P5-3 of the third semiconductor chip 1800-3 may receive third chip master information OPT3, and a sixth pad P6-3 may receive the swapping information SWAP. A fifth pad P5-4 of the fourth semiconductor chip 1800-4 may receive fourth chip master information OPT4, and a sixth pad P6-4 may receive the swapping information SWAP.

The first chip master information OPT1 may be a low logic level, and the swapping information SWAP may be a high logic level. Accordingly, a swapping control circuit 1830-1 may enable the swapping control signal SW to a high logic level. The second reception control signal ZQ2_R may have a logic level corresponding to the logic level of the mask signal MASK, and the first transmission control signal ZQ1_T may have a logic level corresponding to the logic level of the complementary signal MASKB of the mask signal MASK. The fourth reception control signal ZQ4_R may be enabled to a high logic level, and the third transmission control signal ZQ3_T may be disabled to a low logic level.

In the first semiconductor chip 1800-1, a first driver D11-1 of a pad selection circuit that is coupled to the first pad P1-1 may be selectively activated according to the logic level of the mask signal MASK. A second driver D12-1 of the pad selection circuit that is coupled to the second pad P2-2 may be selectively activated according to the logic level of the complementary signal MASKB of the mask signal MASK. A third driver D13-1 of the pad selection circuit that is coupled to the third pad P3-1 may be deactivated, and a fourth driver D14-1 that is coupled to the fourth pad P4-1 may be activated. A first driver D21-1 of a transmission selection circuit may be deactivated, a second driver D22-1 may be activated, a third driver D23-1 may be activated, a fourth driver D24-1 may be activated, and a fifth driver D25-1 may be deactivated. A first driver D31-1 of a reception selection circuit may be deactivated, a second driver D32-1 may be activated, a third driver D33-1 may be activated, and a fourth driver D34-1 may be deactivated. Accordingly, the first semiconductor chip 1800-1 may transmit the end output signal ZQE_O through the first pad P1-1 and may receive a signal, received through the second pad P2-1, as the end input signal ZQE_I. Also, the first semiconductor chip 1800-1 may receive a signal, received through the fourth pad P4-1, as the start input signal ZQS_I.

The second chip master information OPT2 may be a high logic level, and the swapping information SWAP may be a high logic level. Accordingly, a swapping control circuit 1830-2 may disable the swapping control signal SW to a low logic level. According to the logic level of the master information OPT2, the first transmission control signal ZQ1_T may be enabled to a high logic level, and the second reception control signal ZQ2_R may also be enabled to a high logic level. The fourth reception control signal ZQ4_R may have a logic level corresponding to the logic level of the mask signal MASK, and the third transmission control signal ZQ3_T may have a logic level corresponding to the logic level of the complementary signal MASKB of the mask signal MASK.

In the second semiconductor chip 1800-2, a first driver D11-2 of a pad selection circuit that is coupled to the first pad P1-2 may be activated, and a second driver D12-2 of the pad selection circuit that is coupled to the second pad P2-2 may also be activated. A third driver D13-2 of the pad selection circuit that is coupled to the third pad P3-2 may be selectively activated according to the logic level of the mask signal MASK. A fourth driver D14-2 of the pad selection circuit that is coupled to the fourth pad P4-2 may be selectively activated according to the logic level of the complementary signal MASKB of the mask signal MASK. A first driver D21-2 of a transmission selection circuit may be activated, a second driver D22-2 may be deactivated, a third driver D23-2 may be activated, a fourth driver D24-2 may be deactivated, and a fifth driver D25-2 may be activated. A first driver D31-2 of a reception selection circuit may be activated, a second driver D32-2 may be deactivated, a third driver D33-2 may be deactivated, and a fourth driver D34-2 may be activated. Accordingly, the second semiconductor chip 1800-2 may transmit the end output signal ZQE_O through the third pad P3-2 and may receive a signal, received through the fourth pad P4-2, as the end input signal ZQE_I. The second semiconductor chip 1800-2 may receive a signal, received through the second pad P2-2, as the start input signal ZQS_I, and may output the start input signal ZQS_I as the start output signal ZQS_O through the first pad P1-2.

The third chip master information OPT3 may be a high logic level, and the swapping information SWAP may be a high logic level. Accordingly, a swapping control circuit 1830-3 may disable the swapping control signal SW to a low logic level. The first transmission control signal ZQ1_T may be enabled to a high logic level according to the master information OPT3, and the second reception control signal ZQ2_R may also be enabled to a high logic level. The fourth reception control signal ZQ4_R may have a logic level corresponding to the logic level of the mask signal MASK, and the third transmission control signal ZQ3_T may have a logic level corresponding to the logic level of the complementary signal MASKB of the mask signal MASK.

In the third semiconductor chip 1800-3, a first driver D11-3 of a pad selection circuit that is coupled to the first pad P1-3 may be activated, and a second driver D12-3 of the pad selection circuit that is coupled to the second pad P2-3 may also be activated. A third driver D13-3 of the pad selection circuit that is coupled to the third pad P3-3 may be selectively activated according to the logic level of the mask signal MASK. A fourth driver D14-3 of the pad selection circuit that is coupled to the fourth pad P4-3 may be selectively activated according to the logic level of the complementary signal MASKB of the mask signal MASK. A first driver D21-3 of a transmission selection circuit may be activated, a second driver D22-3 may be deactivated, a third driver D23-3 may be activated, a fourth driver D24-3 may be deactivated, and a fifth driver D25-3 may be activated. A first driver D31-3 of a reception selection circuit may be activated, a second driver D32-3 may be deactivated, a third driver D33-3 may be deactivated, and a fourth driver D34-3 may be activated. Accordingly, the third semiconductor chip 1800-3 may transmit the end output signal ZQE_O through the third pad P3-3 and may receive a signal, received through the fourth pad P4-3, as the end input signal ZQE_I. The third semiconductor chip 1800-3 may receive a signal, received through the second pad P2-3, as the start input signal ZQS_I, and may output the start input signal ZQS_I as the start output signal ZQS_O through the first pad P1-3.

The fourth chip master information OPT4 may be a high logic level, and the swapping information SWAP may be a high logic level. Accordingly, a swapping control circuit 1830-4 may disable the swapping control signal SW to a low logic level. The first transmission control signal ZQ1_T may be enabled to a high logic level according to the master information OPT3, and the second reception control signal ZQ2_R may also be enabled to a high logic level. The fourth reception control signal ZQ4_R may have a logic level corresponding to the logic level of the mask signal MASK, and the third transmission control signal ZQ3_T may have a logic level corresponding to the logic level of the complementary signal MASKB of the mask signal MASK.

In the fourth semiconductor chip 1800-4, a first driver D11-4 of a pad selection circuit that is coupled to the first pad P1-4 may be activated, and a second driver D12-4 of the pad selection circuit that is coupled to the second pad P2-4 may also be activated. A third driver D13-4 of the pad selection circuit that is coupled to the third pad P3-4 may be selectively activated according to the logic level of the mask signal MASK. A fourth driver D14-4 of the pad selection circuit that is coupled to the fourth pad P4-4 may be selectively activated according to the logic level of the complementary signal MASKB of the mask signal MASK. A first driver D21-4 of a transmission selection circuit may be activated, a second driver D22-4 may be deactivated, a third driver D23-4 may be activated, a fourth driver D24-4 may be deactivated, and a fifth driver D25-4 may be activated. A first driver D31-4 of a reception selection circuit may be activated, a second driver D32-4 may be deactivated, a third driver D33-4 may be deactivated, and a fourth driver D34-4 may be activated. Accordingly, the fourth semiconductor chip 1800-4 may transmit the end output signal ZQE_O through the third pad P3-4 and may receive a signal, received through the fourth pad P4-4, as the end input signal ZQE_I. The fourth semiconductor chip 1800-4 may receive a signal, received through the second pad P2-4, as the start input signal ZQS_I, and may output the start input signal ZQS_I as the start output signal ZQS_O through the first pad P1-4.

In the first semiconductor chip 1800-1, the initial logic level of the mask signal MASK may be a low logic level. In the second to fourth semiconductor chips 1800-2, 1800-3 and 1800-4, the initial logic level of the mask signal MASK may be a high logic level. When the first semiconductor chip 1800-1 receives a calibration command signal ZQS_CMD, a calibration circuit 1820-1 of the first semiconductor chip 1800-1 may start a calibration operation by being coupled to an external reference resistor RZQ through a resistance pad ZQ based on the calibration command signal ZQS_CMD. If any one of the second to fourth semiconductor chips 1800-2, 1800-3 and 1800-4 receives the calibration command signal ZQS_CMD, the calibration circuit of a semiconductor chip that has received the calibration command signal ZQS_CMD may generate the start output signal ZQS_O, and the start output signal ZQS_O may be sequentially transmitted to the first semiconductor chip 1800-1 as the start input signal ZQS_I. For example, when the third semiconductor chip 1800-3 receives the calibration command signal ZQS_CMD, the start output signal ZQS_O of the third semiconductor chip 1800-3 may be transmitted to the second pad P2-4 of the fourth semiconductor chip 1800-4 through the first pad P1-3. The fourth semiconductor chip 1800-4 may receive a signal, received through the second pad P4-2, as the start input signal ZQS_I, and the start input signal ZQS_I may be transmitted to the second pad P2-2 of the second semiconductor chip 1800-2 through the first pad P1-4. The second semiconductor chip 1800-2 may receive a signal, received through the second pad P2-2, as the start input signal ZQS_I, and the start input signal ZQS_I may be transmitted to the fourth pad P4-1 of the first semiconductor chip 1800-1 through the first pad P1-2. The first semiconductor chip 1800-1 may receive a signal, received through the fourth pad P4-1, as the start input signal ZQS_I, and the calibration circuit 1820-1 may start the calibration operation based on the start input signal ZQS_I.

When the calibration circuit 1820-1 of the first semiconductor chip 1800-1 completes the calibration operation, the calibration circuit 1820-1 may generate the end output signal ZQE_O, and the end output signal ZQE_O may be transmitted to the fourth pad P4-3 of the third semiconductor chip 1800-3 through the first pad P1-1. The third semiconductor chip 1800-3 may receive a signal, received through the fourth pad P4-3, as the end input signal ZQE_I, and the calibration circuit 1820-3 of the third semiconductor chip 1800-3 may perform a calibration operation by being coupled to the external reference resistor RZQ through a resistance pad ZQ based on the end input signal ZQE_I.

When the calibration circuit 1820-3 completes the calibration operation, the calibration circuit 1820-3 may generate the end output signal ZQE_O, and the end output signal ZQE_O may be transmitted to the fourth pad P4-4 of the fourth semiconductor chip 1800-4 through the third pad P3-3. The fourth semiconductor chip 1800-4 may receive a signal, received through the fourth pad P4-4, as the end input signal ZQE_I, and the calibration circuit 1820-4 of the fourth semiconductor chip 1800-4 may perform a calibration operation by being coupled to the external reference resistor RZQ through a resistance pad ZQ based on the end input signal ZQE_I. When the calibration circuit 1820-4 completes the calibration operation, the calibration circuit 1820-4 may generate the end output signal ZQE_O, and the end output signal ZQE_O may be transmitted to the fourth pad P4-2 of the second semiconductor chip 1800-2 through the third pad P3-4. The second semiconductor chip 1800-2 may receive a signal, received through the fourth pad P4-2, as the end input signal ZQE_I, and the calibration circuit 1820-2 of the second semiconductor chip 1800-2 may perform a calibration operation by being coupled to the external reference resistor RZQ through a resistance pad ZQ based on the end input signal ZQE_I. When the calibration circuit 1820-2 completes the calibration operation, the calibration circuit 1820-2 may generate the end output signal ZQE_O, and the end output signal ZQE_O may be transmitted to the second pad P2-1 of the first semiconductor chip 1800-1 through the third pad P3-2. The first semiconductor chip 1800-1 may receive a signal, received through the second pad P2-1, as the end input signal ZQE_I. The calibration circuit 1820-1 of the first semiconductor chip 1800-1 may end a calibration operation of the semiconductor apparatus 2000 based on the end input signal ZQE_I.

While various embodiments have been described above, it will be understood to those skilled in the art that the embodiments described are examples only. Accordingly, the semiconductor circuit capable of swapping signal paths and the semiconductor apparatus using the same described herein should not be limited based on the described embodiments.

What is claimed is:

1. A semiconductor apparatus comprising:
    a first semiconductor chip configured to, based on first chip master information and swapping information, output a first chip end output signal through a first pad, provide a first chip end input signal that is received through the first pad, and provide a first chip start input signal that is received through a second pad; and
    a second semiconductor chip configured to, based on second chip master information and the swapping information, output a second chip start output signal through a first pad, output a second chip end output signal through a second pad, and provide a second chip end input signal that is received through the second pad,
    wherein the second semiconductor chip is disposed by being rotated 180 degrees with respect to the first semiconductor chip,
    wherein the first pad of the first semiconductor chip is coupled to the second pad of the second semiconductor chip, and
    wherein the second pad of the first semiconductor chip is coupled to the first pad of the second semiconductor chip.

2. The semiconductor apparatus according to claim 1, wherein the first pad of the first semiconductor chip is wire-bonded to the second pad of the second semiconductor chip, and
    wherein the second pad of the first semiconductor chip is wire-bonded to the first pad of the second semiconductor chip.

3. The semiconductor apparatus according to claim 1, wherein the first semiconductor chip further comprises:
    a third pad;
    a fourth pad configured to receive the first chip master information; and
    a fifth pad configured to receive the swapping information, and
    wherein the second semiconductor chip further comprises:
    a third pad;
    a fourth pad configured to receive the second chip master information; and
    a fifth pad configured to receive the swapping information.

4. The semiconductor apparatus according to claim 3, wherein the first semiconductor chip further comprises a sixth pad that receives a mode signal and outputs a power supply voltage through the third pad when the mode signal is disabled.

5. The semiconductor apparatus according to claim 4, wherein the second semiconductor chip further comprises a sixth pad that receives the mode signal, and, when the mode signal is disabled, receives a signal that is output from the third pad of the first semiconductor chip as the second chip master information through the fourth pad.

6. The semiconductor apparatus according to claim 4, wherein the fourth pad of the second semiconductor chip is wire-bonded to the third pad of the first semiconductor chip, and
    wherein the fourth pad of the second semiconductor chip receives a signal that is output from the third pad of the first semiconductor chip as the second chip master information.

7. The semiconductor apparatus according to claim 1, wherein the first and second semiconductor chips further comprise resistance pads, respectively, and
    wherein the first and second semiconductor chips are coupled in common to an external reference resistor through the resistance pads.

8. The semiconductor apparatus according to claim 7, wherein the first semiconductor chip comprises:
    a calibration circuit, coupled to the resistance pad of the first semiconductor chip, configured to perform a calibration operation based on at least one of a calibration command signal and the first chip calibration operation is completed, and end a calibration operation of the semiconductor apparatus based on the first chip end input signal; and
    a first chip swapping circuit configured to, based on the first chip master information and the swapping information, output the first chip end output signal through the first pad of the first semiconductor chip, provide a signal, received through the first pad of the first semiconductor chip, as the first chip end input signal, and provide the first chip start input signal that is received through the second pad of the first semiconductor chip.

9. The semiconductor apparatus according to claim 7, wherein the second semiconductor chip comprises:
    a calibration circuit, coupled to the resistance pad of the second semiconductor chip, configured to generate the second chip start output signal based on the calibration command signal, perform a calibration operation based on the second chip end input signal, and generate the second chip end output signal when the calibration operation is completed; and a second chip swapping circuit configured to, based on the second chip master information and the swapping information, output the second chip start output signal through the first pad of the second semiconductor chip, output the second chip end output signal through the second pad of the second semiconductor chip, and provide the second chip end input signal that is received through the second pad of the second semiconductor chip.

10. A semiconductor apparatus comprising:

a first semiconductor chip configured to receive a first command signal, and, based on first chip master information and swapping information, output a first chip end output signal through a first pad, provide a first chip start input signal that is received through a second pad and provide a first chip end input signal that is received through a third pad;

a second semiconductor chip configured to receive the first command signal, and based on second chip master information and the swapping information, output a second chip end output signal through a second pad and provide a second chip end input signal that is received through a third pad;

a third semiconductor chip configured to receive a second command signal, and based on third chip master information and the swapping information, output a third chip start output signal through a first pad, output a third chip end output signal through a second pad and provide a third chip end input signal that is received through a third pad; and a fourth semiconductor chip configured to receive the second command signal, and based on fourth chip master information and the swapping information, output a fourth chip end output signal through a second pad and provide a fourth chip end input signal that is received through a third pad, wherein the first pad, the second pad, and the third pad of the first semiconductor chip sequentially face the third pad, the second pad, and the first pad of the third semiconductor chip, and wherein a first pad, the second pad, and the third pad of the second semiconductor chip sequentially face the third pad, the second pad and a first pad of the fourth semiconductor chip, wherein the first pad of the first semiconductor chip is coupled to the third pad of the third semiconductor chip, the second pad of the first semiconductor chip is coupled to the first pad of the third semiconductor chip, and the third pad of the first semiconductor chip is coupled to the second pad of the second semiconductor chip, wherein the third pad of the second semiconductor chip is coupled to the second pad of the fourth semiconductor chip, and wherein the second pad of the third semiconductor chip is coupled to the third pad of the fourth semiconductor chip.

11. The semiconductor apparatus according to claim 10, wherein the first semiconductor chip further comprises a fourth pad that receives the first chip master information and a fifth pad that receives the swapping information, wherein the second semiconductor chip further comprises a fourth pad that receives the second chip master information and a fifth pad that receives the swapping information, wherein the third semiconductor chip further comprises a fourth pad that receives the third chip master information and a fifth pad that receives the swapping information, and wherein the fourth semiconductor chip further comprises a fourth pad that receives the fourth chip master information and a fifth pad that receives the swapping information.

12. The semiconductor apparatus according to claim 10, wherein the first to fourth semiconductor chips further comprise resistance pads, respectively, and wherein the first to fourth semiconductor chips are coupled in common to an external reference resistor through the resistance pads.

13. The semiconductor apparatus according to claim 12, wherein the first semiconductor chip comprises:

a calibration circuit, coupled to the resistance pad of the first semiconductor chip, configured to perform a calibration operation based on at least one of the first command signal and the first chip calibration operation is completed, and end a calibration operation of the semiconductor apparatus based on the first chip end input signal; and a first chip swapping circuit configured to, based on the first chip master information and the swapping information, output the first chip end output signal through the first pad of the first semiconductor chip, provide a signal, received through the second pad of the first semiconductor chip, as the first chip start input signal, and provide the first chip end input signal that is received through the third pad of the first semiconductor chip.

14. The semiconductor apparatus according to claim 13, wherein the third semiconductor chip comprises:

a calibration circuit, coupled to the resistance pad of the third semiconductor chip, configured to generate the third chip start output signal based on the second command signal, perform a calibration operation based on the third chip end input signal, and generate the third chip end output signal when the calibration operation is completed; and a third chip swapping circuit configured to, based on the third chip master information and the swapping information, output the third chip start output signal through the first pad of the third semiconductor chip, output the third chip end output signal through the second pad of the third semiconductor chip, and provide the third chip end input signal that is received through the third pad of the third semiconductor chip.

15. The semiconductor apparatus according to claim 14, wherein the fourth semiconductor chip comprises:

a calibration circuit, coupled to the resistance pad of the fourth semiconductor chip, configured to perform a calibration operation based on the fourth chip end input signal and generate the fourth chip end output signal when the calibration operation is completed; and a fourth chip swapping circuit configured to, based on the fourth chip master information and the swapping information, output the fourth chip end output signal through the second pad of the fourth semiconductor chip, and provide fourth chip end input signal that is received through the third pad of the fourth semiconductor chip.

16. The semiconductor apparatus according to claim 15, wherein the second semiconductor chip comprises:
- a calibration circuit, coupled to the resistance pad of the second semiconductor chip, configured to perform a calibration operation based on the second chip end input signal and generate the second chip end output signal when the calibration operation is completed; and
- a second chip swapping circuit configured to, based on the second chip master information and the swapping information, output the second chip end output signal through the second pad of the second semiconductor chip, and provide the second chip end input signal that is received through the third pad of the second semiconductor chip.

* * * * *